United States Patent
Hisamune

[19]

[11] Patent Number: 6,121,670
[45] Date of Patent: Sep. 19, 2000

[54] SINGLE-CHIP CONTACT-LESS READ-ONLY MEMORY (ROM) DEVICE AND THE METHOD FOR FABRICATING THE DEVICE

[75] Inventor: Yosiaki Hisamune, Tokyo, Japan

[73] Assignee: NEC Corporation, Tokyo, Japan

[21] Appl. No.: 08/898,100

[22] Filed: Jul. 22, 1997

[30]     Foreign Application Priority Data

Jul. 30, 1996  [JP]  Japan .................................. 8-200728
Apr. 28, 1997  [JP]  Japan .................................. 9-110820

[51] Int. Cl.$^7$ ................................................. H01L 29/06
[52] U.S. Cl. ......................... 257/623; 257/208; 257/314; 257/401
[58] Field of Search .................................. 257/207, 208, 257/210, 390, 296, 623, 314, 401; 438/697, 700

[56]              References Cited

U.S. PATENT DOCUMENTS

| | | | |
|---|---|---|---|
| 4,561,170 | 12/1985 | Doering et al. | 438/210 |
| 4,642,880 | 2/1987 | Mizutani | 438/297 |
| 4,882,289 | 11/1989 | Moriuchi et al. | 438/241 |
| 4,882,294 | 11/1989 | Christenson | 438/340 |
| 5,404,042 | 4/1995 | Okumura et al. | 257/371 |
| 5,420,462 | 5/1995 | Sudo | 257/775 |
| 5,493,139 | 2/1996 | Akiyama et al. | 257/316 |
| 5,496,758 | 3/1996 | Ema | 438/253 |
| 5,595,924 | 1/1997 | Yuan et al. | 438/587 |
| 5,780,310 | 7/1998 | Koyama | 438/396 |
| 5,780,340 | 7/1998 | Gardner et al. | 438/259 |
| 5,828,120 | 10/1998 | Ishikawa | 257/499 |
| 5,886,376 | 3/1999 | Acovic et al. | 257/316 |

FOREIGN PATENT DOCUMENTS

| | | |
|---|---|---|
| 0 555 039 A2 | 8/1993 | European Pat. Off. . |
| 0 610 643 A1 | 8/1994 | European Pat. Off. . |
| 4-164372 | 6/1992 | Japan . |
| 4-164368 | 10/1992 | Japan . |
| 6-283721 | 7/1994 | Japan . |
| 7-193145 | 7/1995 | Japan . |

OTHER PUBLICATIONS

European Search Report dated Nov. 12, 1997; Application EP97113129.

*Primary Examiner*—David Hardy
*Assistant Examiner*—George C. Eckert, II
*Attorney, Agent, or Firm*—McGinn & Gibb, P.C.

[57]              ABSTRACT

To obtain a small contact-less memory device, a memory device includes a semiconductor chip having a first surface and a second surface located at a level lower than that of the first surface, a memory cell array formed on the second surface, a peripheral circuit, for operating the memory cell array, formed on the first surface, and a connecting portion, for electrically connecting the memory cell array to the peripheral circuit, formed on the first surface.

19 Claims, 37 Drawing Sheets

SINGLE-CHIP CONTACT-LESS READ-ONLY MEMORY (ROM) DEVICE AND THE METHOD FOR FABRICATING THE DEVICE

BACKGROUND OF THE INVENTION

The present invention generally relates to a single-chip contact-less read-only memory (ROM) device and a method for fabricating the device, and more particularly to a single-chip contact-less ROM device having a structure such as a flash memory, and the method for fabricating the device.

DESCRIPTION OF THE RELATED ART

A single-chip semiconductor memory device, regardless of the type of memory (e.g., a random access memory (RAM), a read only memory (ROM), etc.), normally includes a plurality of memory cell arrays, peripheral circuits for operating the memory cell arrays, and connecting portions for electrically connecting the memory cell arrays, and connecting between one of the memory cell arrays and one of the peripheral circuits.

However, every memory cell of a ROM does not need contact holes for connecting a corresponding memory cell and a bit line (e.g., metal wiring), although every memory cell of a RAM must have the contact holes. Therefore, "a contact-less memory device" has been developed mainly as a ROM.

As the contact-less memory device, Japanese Patent Application Laid-Open No. Hei 6-283721 discloses a memory cell array having a plurality of electrically erasable and programmable ROM (EEPROM) cells, and having a construction as "a flash memory". The memory device having such a flash memory construction is also disclosed in U.S. Pat. No. 5,595,924.

However, gates of the EPROM cells have a larger thickness than gates of metal oxide semiconductor (MOS) transistors which are used for the peripheral circuit or for the connecting portion. Therefore, a surface of an insulating film formed on a semiconductor substrate becomes irregular (e.g., not flat, uneven, rough surface), because the EPROM cells for the memory cell array and MOS transistors for the connecting portion or for the peripheral portion are formed on the same level of the semiconductor substrate in the conventional devices.

When such an irregularity occurs, it is difficult to form wirings (e.g., bit lines) on the insulating film by photo-lithography.

In contrast to the above-mentioned memory cell array, Japanese Patent Application Laid-Open No. Hei 4-164368 discloses a memory cell array having a plurality of "stacked capacitors". The memory cell arrays are formed on a first level which is lower than the level of the original surface of the semiconductor substrate. Therefore, an irregularity of an insulating film formed on a substrate including the stacked capacitors becomes small.

However, the depths are different between a contact hole connecting a peripheral circuit and a bit contact hole, because the contact hole is formed on the original surface and the bit contact hole is formed on the first level. Therefore, an aspect ratio of the bit contact hole must be different from an aspect ratio of the contact hole connecting a peripheral circuit. This is a problem.

SUMMARY OF THE INVENTION

In view of the foregoing and other problems of the conventional structure, it is therefore an object of the present invention to provide an improved single-chip memory device.

It is another object of the present invention to provide an improved single-chip contact-less flash memory device.

It is yet another object of the present invention to provide an improved method for fabricating a single-chip contact-less memory device.

In a first aspect, a single-chip memory device, according to the present invention, includes a semiconductor chip having a first surface and a second surface located at a lower level than that of the first surface, a memory cell array formed on the second surface, a peripheral circuit, for operating the memory cell array, formed on the first surface, and a connecting portion, for electrically connecting the memory cell array to the peripheral circuit, formed on the first surface.

With the unique and unobvious structure of the present invention, the memory cell array is formed on the second surface, and the peripheral circuit and the connecting portion are formed on the first surface. Therefore, the surface of the device can be made flat (e.g., regular). As a result, a small memory device can be obtained.

BRIEF DESCRIPTION OF THE DRAWINGS

The foregoing and other objects, aspects and advantages will be better understood from the following detailed description of preferred embodiments of the invention with reference to the drawings, in which:

FIGS. 12($b$)–($c$) respectively show sectional views of the NAND-type flash memory shown in FIG. 11 taken along lines A—A and B—B;

DETAILED DESCRIPTION OF PREFERRED EMBODIMENTS OF THE INVENTION

Figure 1:
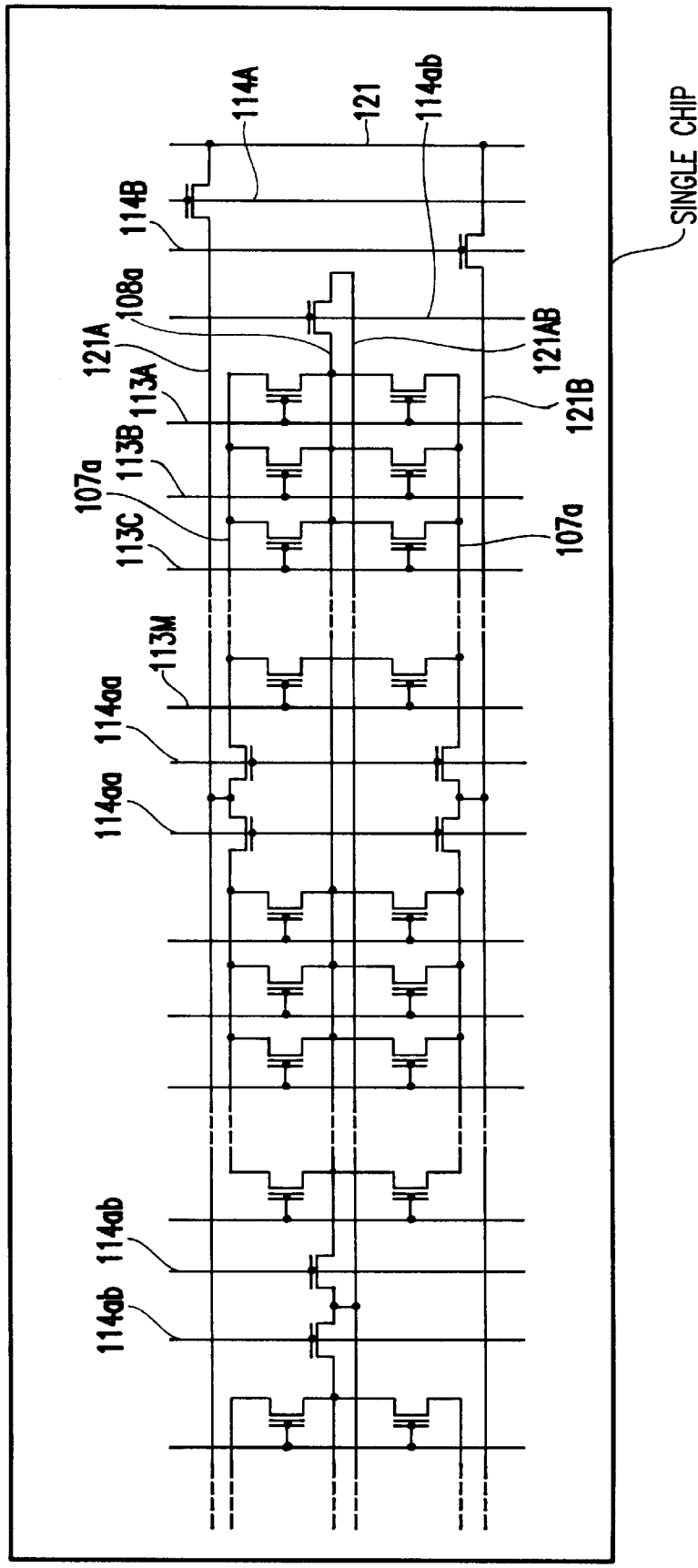
FIG. 1 illustrates a circuit diagram of a NOR-type single-chip contact-less flash memory device according to a first embodiment of the present invention.
Figure 2:
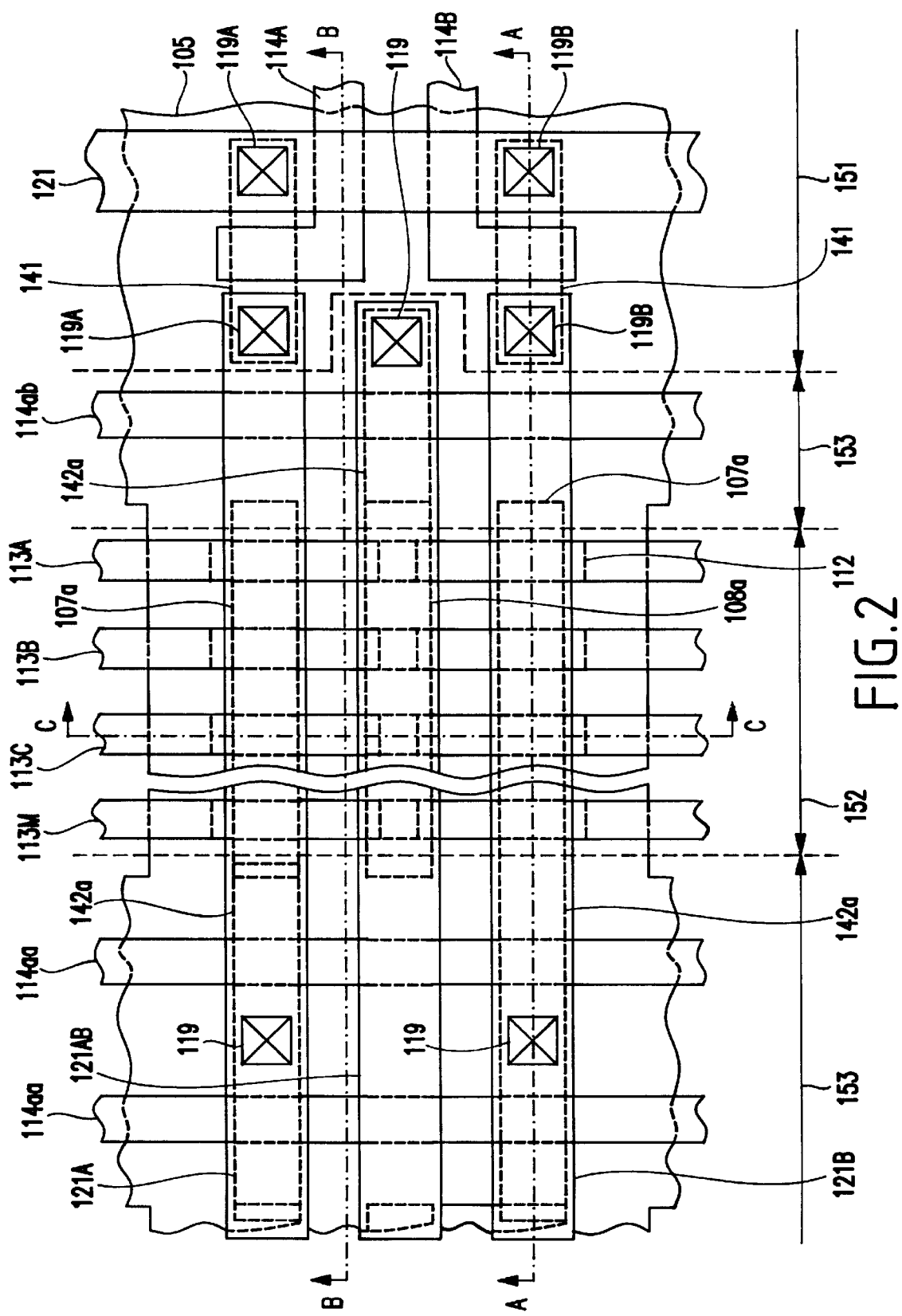
FIG. 2 illustrates a plan view of the NOR-type flash memory shown in FIG. 1.
Figure 3A:
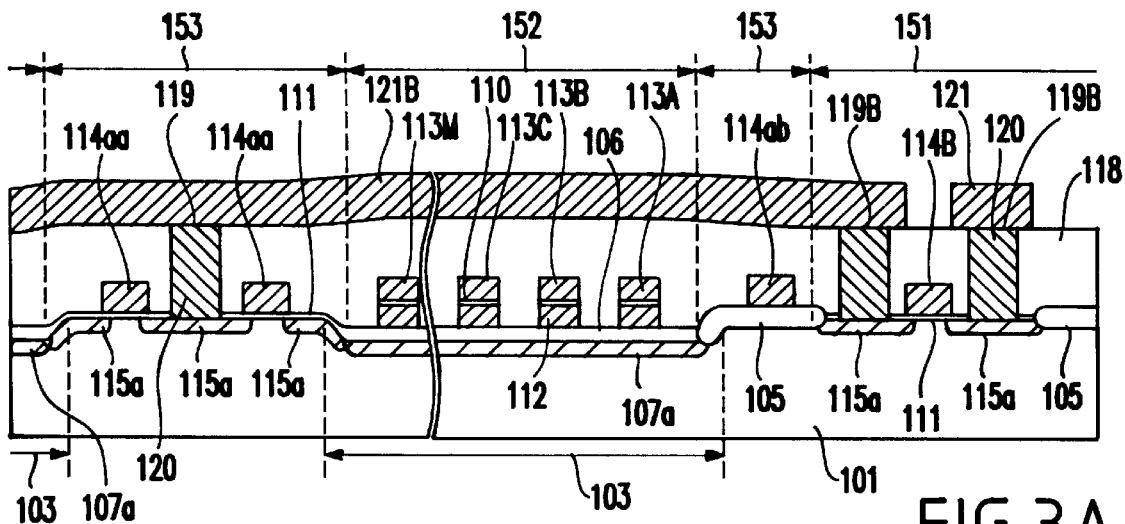
FIGS. 3($a$)–($c$) respectively show sectional views of the NOR-type flash memory shown in FIG. 2 taken along lines A—A, B—B and C—C.
Figure 3B:
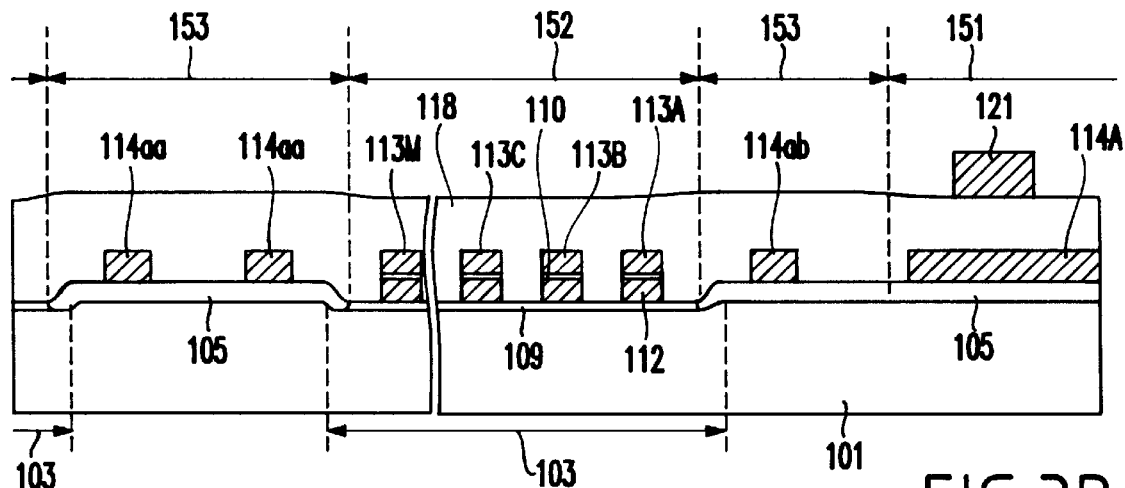

Referring now to the drawings, and more particularly to FIGS. 1–3, a single-chip contact-less flash memory device is shown as a first embodiment according to the present invention.

FIG. 1 shows a circuit diagram of a NOR-type flash memory, FIG. 2 shows a plan view of the NOR-type flash memory shown in FIG. 1, and FIGS. 3(a)–(c) respectively show sectional views of the NOR-type flash memory shown in FIG. 2 taken along lines A—A, B—B and C—C.

In areas 152 for forming memory cell arrays, a cavity 103 having an inverted trapezoidal configuration and a flat base, is formed on a surface of a P-type silicon substrate 101. The flat base of the cavity 103 is located approximately 150 nm lower than the surface of the P-type silicon substrate 101. At the base of the cavity 103, a memory cell array region 152, which includes a plurality of lamination gate electrode type nonvolatile memory cells having connections to each other as a contact-less-type, a common ground line-type, and a NOR-type, is formed.

A peripheral circuit region 151 is provided on the surface of the P-type silicon substrate 101. Further, a connecting portion region 153, for connecting between the peripheral circuit and the cell array or among cell arrays, is provided in a belt-shaped region between the surface of the P-type silicon substrate 101 and the end portion of the base of the cavity 103.

An N-type MOS transistor as an element of the peripheral circuit is formed at an element region 141 in the peripheral circuit region 151. Further, an N-type MOS transistor as a select gate transistor is formed at an element region 142a in the connecting portion region 153. One end of the element region 142a is connected directly to the memory cell array region 152.

Figure 3C:
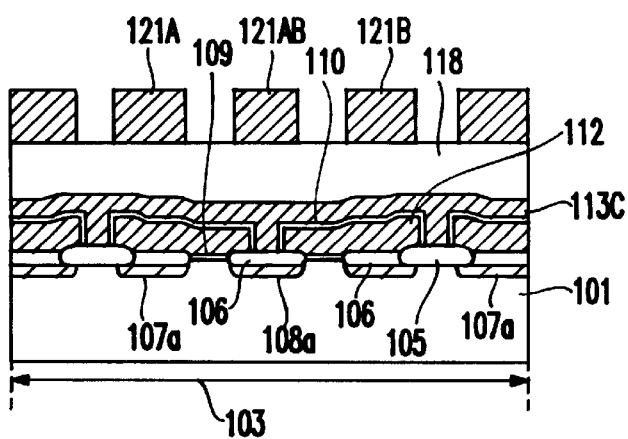

In the base of the cavity 103, as shown in FIG. 3(c), two N$^+$-type buried diffusion layers 107a, as two sub-bit lines, are formed corresponding to one N$^+$-type buried diffusion layer 108a as a sub-ground line. The depths of the sub-bit line 107a and the sub-ground line 108a are approximately 200 nm from the surface of the P-type silicon substrate 101, and their line widths are approximately 0.6 μm.

A LOCOS-type field oxide film 105, having a thickness of approximately 200 nm, is formed for isolating electrical elements among semiconductor elements of the peripheral circuits, among the peripheral circuit region 151, the connecting portion region 153 and the memory cell array region 152, and among memory cells belonging to a different sub-ground line 108a. Surfaces of the sub-ground lines 108a and the sub-bit lines 107a are covered by a LOCOS-type field oxide film 106 having a thickness of approximately 60 nm.

As shown in FIG. 3(c), a gate oxide film 109, having a film thickness of approximately 10 nm and a width of approximately 0.6 μm (e.g., wherein this length is called a "gate length" of a memory cell), is formed by thermal oxidation on the surface of a channel region.

The memory cell includes the sub-bit line 107a, the sub-ground line 108a, a gate oxide film 109, a floating gate electrode 112 formed on the gate oxide film 109, a gate insulating film 110, and a control gate electrode 113A (e.g., 113B, 113C, 113M). For example, the control gate electrode works as a word line. The control gate electrodes 113A, 113B, 113C, 113M are approximately perpendicular to the sub-bit line 107a and the sub-ground line 108a, and includes an N$^+$-type polycrystalline silicon film having a width (e.g., wherein the width is called a "gate width") of approximately 0.4 μm and a thickness of approximately 300 nm.

The floating gate electrode 112, which includes an N-type polycrystalline silicon film having a thickness of approximately 150 nm, exists under the control gate electrodes. The floating gate electrode 112 is located between the surface of the field oxide film 106 covering the sub-ground line 108a and the surface of a field oxide film 105 by crossing from the sub-bit line 107a to the field oxide film 106, as shown in FIG. 3(c). For example, the minimum spacing of the floating gate electrodes 112 under the same control gate electrode 113A (e.g., 113B, 113C, 113M) is approximately 0.4 μm.

The gate insulating film 110 has a layered structure of a silicon oxide film, a silicon nitride film and a silicon oxide film (e.g., an ONO film). The gate insulating film 110 has a thickness of approximately 18 nm, and is provided only between the control gate electrode 113A (e.g., 113B, 113C, 113 M) and the floating gate electrode 112.

In element regions 141 and 142a as shown in FIG. 2, a gate oxide film having a thickness of approximately 20 nm formed by thermal oxidation is formed. Further, gate electrodes 114A, 114B including an N⁺-type poly-crystalline silicon film having a thickness of approximately 300 nm are formed similarly to the control gate electrode 113A.

Furthermore, an N⁺-type diffusion layer 115a is formed in a self-matching manner with the gate electrodes 114A, 114B in element regions 141 and 142a. The depth of the N⁺-type diffusion layer 115a is approximately 150 nm.

A semiconductor element of a peripheral circuit connecting to a bit line is formed in the peripheral circuit region 151, and includes an N-type MOS transistor. The N-type MOS transistor includes a pair of N⁺-type diffusion layers 115a which are source and drain regions, the gate oxide film 111, and the gate electrode 114A and 114B.

A semiconductor element of a peripheral circuit connecting to a ground line is formed in the other peripheral circuit region (not shown), and includes an N-type MOS transistor. The N-type MOS transistor includes a pair of N⁺-type diffusion layers 115a, the gate oxide film 111 and the gate electrode (not shown).

A select gate transistor formed in a connecting portion region 153 includes a pair of N⁺-type diffusion layers 115a (e.g., wherein the layers are a source and a drain regions), a gate oxide film 111 and one of a gate electrode 114aa and a gate electrode 144ab. In this case, one of the pair of N⁺-type diffusion layers 115a is connected to either the sub-bit line 107a or the sub-ground line 108a. Further, all of the select gate transistors in the same connecting portion region 153 are connected to either the sub-bit line 107a or the sub-ground line 108a.

An insulating film 118, having a thickness of approximately 600 nm, is formed on the P-type silicon substrate 101. In the insulating film 118, there are a plurality of contact holes 119, 119A, 119B which are filled with contact plugs 120 (e.g., aluminum, tungsten, etc.), respectively. On the insulating film 118, a wiring 121, main bit lines 121A, 121B and a main ground line 121AB (e.g., aluminum, tungsten, etc.) are formed.

The wiring 121 is connected to an N-channel MOS transistor having the gate electrodes 114A or 114B through the contact holes 119A, 119B. The N-channel MOS transistor is connected to the main bit lines 121A or 121B through the different contact holes, respectively. Furthermore, the main bit lines 121A and 121B are connected to the sub-bit lines 107a through the contact hole 119 and the select gate transistor having the gate electrode 114aa, respectively. The main ground line 121AB is connected to the sub-ground line 108a through the contact hole 119 and the select gate transistor having the gate electrode 114ab.

In the first embodiment according to the present invention, the difference between the height of the top of the control gate electrodes 113A, 113B, 113C and 113M and the height of the tops of the gate electrodes 114aa, 114ab, 114A, 114B become smaller (e.g., minimized) by providing the cavity 103 and positioning the structure including the control gate electrode, insulating film 110 and floating gate electrode 112 in the cavity 103. Further, the depths of the contact hole 119 and the contact holes 119A and 119B formed in the interlayer insulating film 118 become almost the same. Therefore, irregularity of the surface of the insulating film 118 becomes small (or completely prevented). As a result, wirings are formed easily by photo-lithography.

The circuit operation of a NOR-type flash memory of the first embodiment is described below. It is noted that two definitions are given to erase the NOR-type flash memory.

As a first definition, an erasing operation is for removing charges (or electrons) stored in the floating gate from the floating gate by using F-N tunneling. In this regard, injecting channel hot electrons into the floating electrode is defined as a writing operation.

As a second definition, an erasing operation is for injecting charges (or electrons) into the floating gate electrode by using F-N tunneling. In this regard, drawing out charges (or electrons) stored in the floating gate electrode of the floating gate by using F-N tunneling is defined as a writing operation. The operation of the first embodiment of the present invention will be described below in accordance with the second definition. However, the first definition also may be used for the first embodiment.

The writing operation to a nonvolatile memory cell (in row C and column A) belonging to, for example, the control gate electrode 113A in row C and a principal bit line 121A in column A. A wiring 121 is applied with high potential (e.g., 7 V) and only the gate electrode 114A is applied with high potential (e.g., 5 V) and the remaining gate electrodes 114B are applied with 0 V. As a result, only the principal bit line 121A is applied with high potential (e.g., 7 V), we the remaining principal bit lines 121B are applied with 0 V.

Only the gate electrode 114aa of the select gate transistor related to the cell array to which the nonvolatile memory cell in row C belongs is applied with high potential (e.g., 5 V), while other gate electrodes 114aa of select gate transistors related to cell arrays not belonging to it are applied with 0 V.

Only the sub-bit line 107a of the nonvolatile memory cell belonging to column A including row C is therefore applied with high potential (e.g., 5 V) selectively. This is an open state in which no voltage is applied to the sub-ground line 108a and principal ground line 121AB.

The P-type silicon substrate 101 is applied with 0 V. Furthermore, low potential (e.g., –12 V) is applied only to the control gate electrode 113C, while the other control gate electrodes 113A, 113B, 113M are applied with 0 V. As a result, data is written selectively to the nonvolatile memory cell in row C and column A by drawing out charges (e.g., electrons) stored in the floating gate electrode 112 to the sub-bit line 107a by F-N tunneling. The threshold voltage $V_{TM}$ of the nonvolatile memory cell in row C and column A to which data is written, is, for instance, 1 V.

An erasing operation is conducted as follows. All of the control gate electrodes 113A, 113B, 113C, and 113M belonging to a certain cell array region 152 are applied with high potential (e.g., 16V). All of the sub-bit lines 107a and the sub-ground lines 108a are opened, and the P-type silicon substrate 101 is applied with 0 V. As a result, all of the memory cells in the cell array 152 are subjected to an erase operation by injecting charges (e.g., electrons) from the P-type silicon substrate 101 into the floating gate electrode 112 by F-N tunneling. The threshold voltage $V_{TM}$ of the nonvolatile memory cells where data is erased is, for instance, 7 V.

Referring now to the drawings, and more particularly to FIGS. 4–5, a method for fabricating the single-chip contactless flash memory device is described below. FIGS. 4(a)–(e) show steps at a structural portion shown in FIG. 3(a). FIGS. 5(a)–(e) show steps at a structural portion shown in FIG. 3(c).

First, a first field oxide film (not shown) having a thickness of approximately 300 nm is formed by selective oxidation at a memory cell array region on the original surface of the P-type silicon substrate 101. The cavity 103 having a substantially inverted trapezoidal configuration is formed by removing the first field oxide film (FIG. 4(a), FIG. 5(a)). In this case, a silicon substrate may be used having P-wells at least provided in the memory cell array region and the connecting portion region and a part of the peripheral circuit region, instead of the P-type silicon substrate 101.

Next, a pad oxide film 131 having a film thickness of approximately 40 nm is formed on the substrate 101, and a first silicon nitride film (not shown) is formed on the pad oxide film 131. Then, the pad oxide film 131 and the first silicon nitride film on a predetermined region for forming a second field oxide film 105, are etched.

Thereafter, the second field oxide film 105 having a thickness of approximately 200 nm is formed by selective oxidation. The first silicon nitride is removed after the second field oxide film 105 is formed. Then, a second silicon nitride 132a having a thickness of approximately 300 nm is formed by selective oxidation. The second silicon nitride 132a, on the memory cell array region except for a portion for forming gate electrodes, is removed (e.g., etched) by using a photo-resist film 161a as a mask.

Figure 4A:
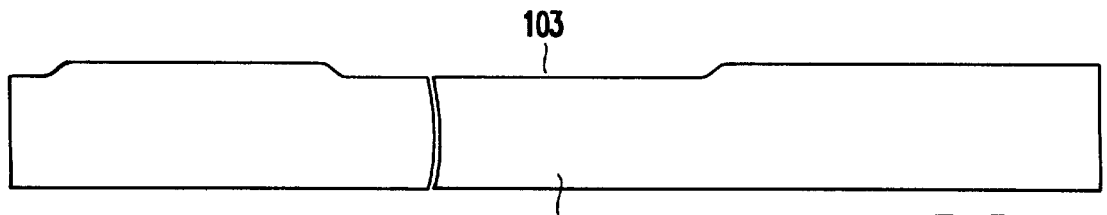
FIGS. 4($a$)–($e$) show steps at a portion shown in FIG. 3($a$)
Figure 4B:
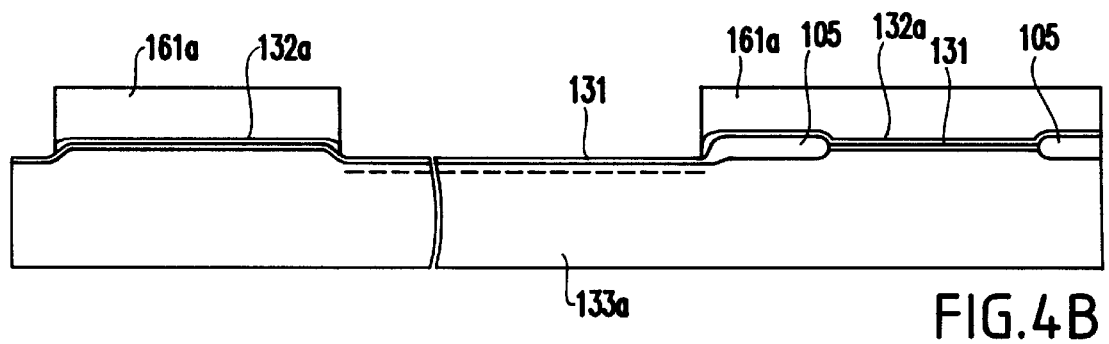
Figure 4C:
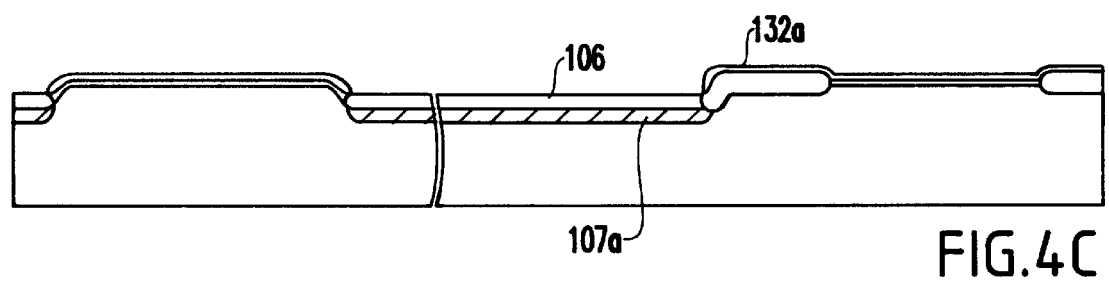
Figure 5A:
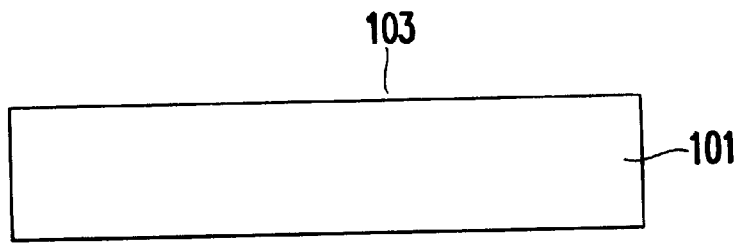
FIGS. 5($a$)–($e$) show steps at a portion shown in FIG. 3($c$)
Figure 5B:
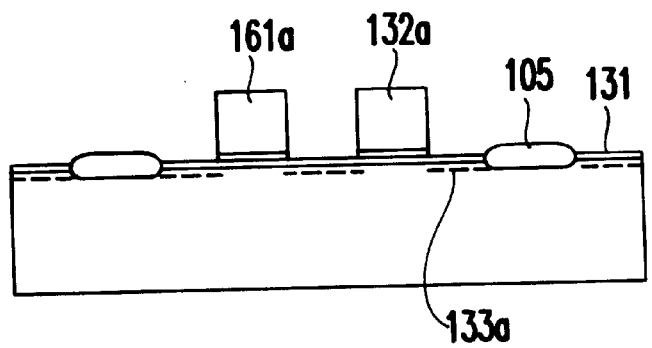
Figure 5C:
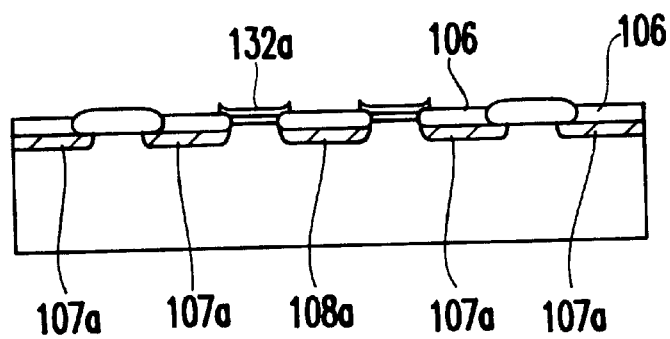

Then, ion implantation of arsenic (As) is performed at 40 keV and at approximately $5 \times 10^{15}$ cm$^{-2}$ for forming an N-type ion implanted layer 133a (FIG. 4(b), FIG. 5(b)).

After that, heat treatment is performed at 850° C. and for approximately 30 minutes in a nitrogen atmosphere. Further, selective oxidation is performed with the silicon nitride film 132a as a mask. As a result, the sub-bit line 107a and the sub-ground line 108a composed of N$^+$ type buried diffusion layers, and a third field oxide film 106 having a thickness of approximately 40 nm and covering surfaces of these sub-bit line 107a and sub-ground line 108a are formed (FIG. 4(c), FIG. 5(c)).

After the silicon nitride film 132a and the pad oxide film 131 are removed, a first gate oxide film 109 having a thickness of approximately 10 nm is formed in a channel regions by thermal oxidation. An N-type polycrystalline silicon film 134 is formed on the entire surface after the first gate oxide film 109 is formed. Patterning is applied to this polycrystalline silicon film 134, and the polycrystalline silicon film 134 is left on the gate oxide film 109 and on the sub-bit line 107a.

The polycrystalline silicon film 134 is left on only the base of the cavity 103. A silicon oxide film (not shown) is formed selectively on the surface of the polycrystalline silicon film 134 by thermal oxidation, and further, a silicon nitride film (not shown) is formed on the entire surface. Patterning is applied to this silicon nitride film, and the silicon nitride film is left mainly on the surface of the polycrystalline silicon film pattern 134. Then, thermal oxidation is performed again, and a gate insulating film composed of an ONO film is formed on the surface of the polycrystalline silicon film 134.

Figure 4D:
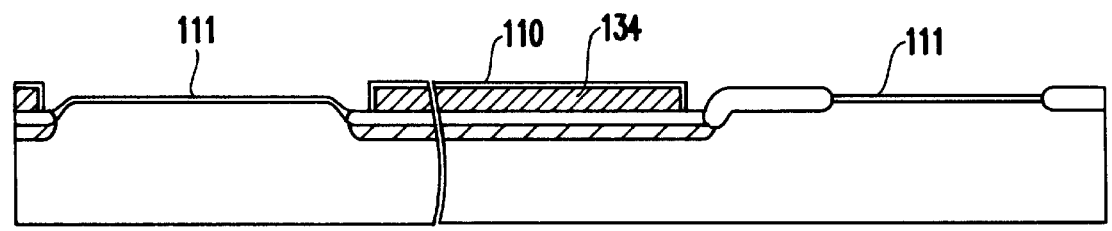
Figure 5D:
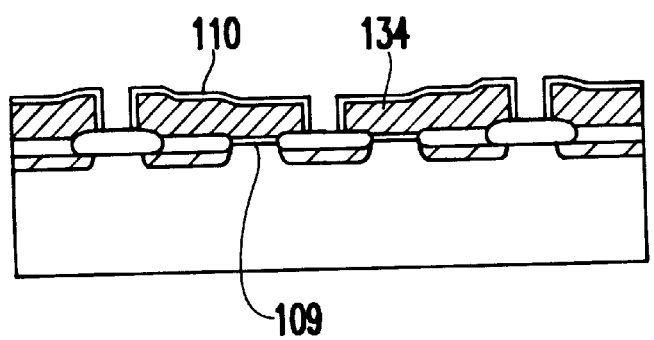

A second gate oxide film 111 having a film thickness of approximately 20 nm is formed in the peripheral portion of the cavity 103 having an inclined face surrounded by the field oxide film 105 and in an element region on the original surface of the P-type silicon substrate 101 (FIG. 4(d) and FIG. 5(d)).

Next, an N$^+$ type polycrystalline silicon film (not shown) having a thickness of approximately 300 nm is formed on the entire surface. The thickness of this polycrystalline silicon film is preferably sufficient to fill void portions among the polycrystalline silicon film 134 and the portion including the inclined surface around the cavity 103 and to reduce (minimize) irregularity on the surface of this polycrystalline silicon film in these portions.

In the first embodiment, the film is not limited to the N$^+$-type polycrystalline silicon film, but a polycide film may also be used.

The second polycrystalline silicon film covering the base of the cavity 103, the gate insulating film 110 and the polycrystalline silicon film 134 are applied with patterning sequentially with a photo-resist pattern (not shown) covering at least a predetermined region of the principal surface of the P-type silicon substrate 101 as a mask. As a result, the control gate electrodes 113A, 113B, 113C, and 113M and the floating gate electrode 112 are formed.

Although the control gate electrodes cross over the inclined surface around the cavity 103, patterning of the control gate electrodes is performed easily and without hindrance because the above-mentioned N$^+$-type polycrystalline silicon film has a shape as described above.

Then, patterning of the second polycrystalline silicon film is performed with another photo-resist film pattern (not shown) covering at least the top of the base of the cavity 103 as a mask. As a result, gate electrodes 114aa, 114ab and gate electrodes 114A, 114B are formed in the connecting region 153 including an element region 142a including the peripheral portion of the cavity 103 including the inclined surface and in the peripheral circuit region 151 including an element region 141 on the original surface of the P-type silicon substrate 101.

Then, the ion implantation of arsenic is performed at 70 keV and at $5 \times 10^{15}$ cm$^{-2}$ with another photo-resist film pattern (not shown) covering the base of the cavity 103, the gate electrodes 114aa, 114ab, the gate electrodes 114A, 114B and the field oxide film 105 as a mask. Thereafter, a heat treatment is performed.

Figure 4E:
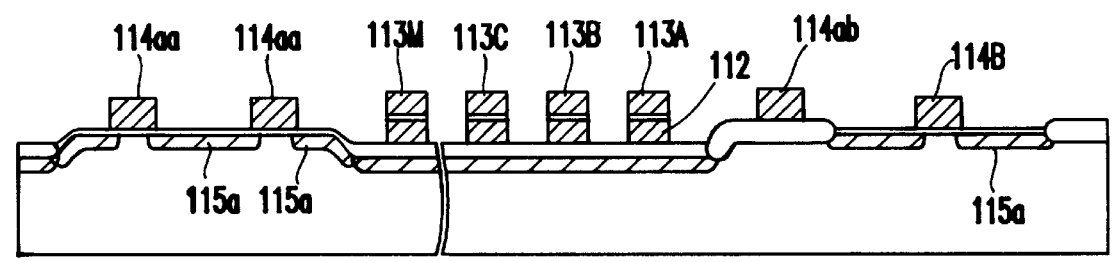
Figure 5E:
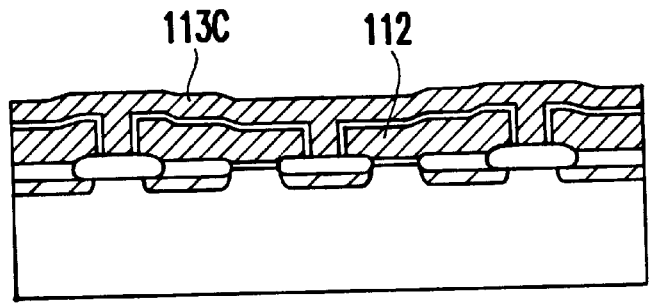

Through these processing steps, an N$^+$-type diffusion layer 115a is formed in an element region 142a in the peripheral portion of the cavity 103 including the inclined surface surrounded by the field oxide film 105 and in an element region 141 on the principal surface of the P-type silicon substrate 101 (FIG. 4(e) and FIG. 5(e)).

Next, a silicon oxide film (HTO film) (not shown) having a thickness of approximately 100 nm is deposited by a low pressure chemical vapor deposition (LPCVD) method. Then, a BPSG film (not shown) having a thickness of approximately 500 nm is deposited by an atmospheric pressure chemical vapor deposition (APCVD) method using ozone (O$_3$) and TEOS (Si(OC$_2$H$_5$)$_4$) as a principal material and TMP (PO(OCH$_3$)$_3$) and TMB (B(OCH$_3$)$_3$) as additives.

Furthermore, heat treatment is performed at 950° C. for approximately 30 minutes in a nitrogen atmosphere, and an interlayer insulating film 118 is formed on the entire surface. The irregularity of the surface of the interlayer insulating film 118 is reduced because of the heights of the gate electrodes 114A, 114B, the gate electrodes 114aa, 114ab and the control gate electrodes 113A being approximately the same. Furthermore, the thickness of the interlayer insulating film 118 need not be large. Moreover, even when the thickness of the interlayer insulating film 118 is not made sufficiently thick, chemical mechanical polishing (CMP) may be performed.

Then, the contact holes 119A, 119B reaching the N$^+$-type diffusion layer 115a of an N-channel transistor forming a peripheral circuit, and the contact holes 119 reaching another N$^+$-type diffusion layer 115a of a select gate transistor are formed. The depth of the contact hole 119 and the depth of the contact holes 119A and 119B are almost equal to each other.

A titanium film (not illustrated), a titanium nitride film (not illustrated) and a tungsten film (not illustrated) are formed sequentially on the entire surface. Then, these laminated conductor films are etched back. As a result, contact plugs 120 filling the contact holes 119, 119A, 119B, are formed.

An aluminum alloy film is formed on the entire surface and applied with patterning. As a result, the wiring 121, the principal bit lines 121A, 121B and the principal ground lines 121AB are formed.

Since irregularity of the surface of the interlayer insulating film 118 is reduced (or prevented) in the first embodiment, the patterning of the wiring 121, the principal bit lines 121A, 121B and the principal ground line 121AB is performed easily and without hindrance.

In the first embodiment, only an N-channel MOS transistor is illustrated as a semiconductor element forming a peripheral circuit. However, the peripheral circuit may be formed with a complementary MOS (CMOS) transistor. In addition, the film thicknesses, widths, and intervals described above are not limited to the numerical values mentioned above.

In the first embodiment, the sub-bit line 107a and the sub-ground line 108a remain only on the base of the cavity 103 forming the cell array region 152. However, this arrangement is not limited to the above.

Second Embodiment

Figure 6:
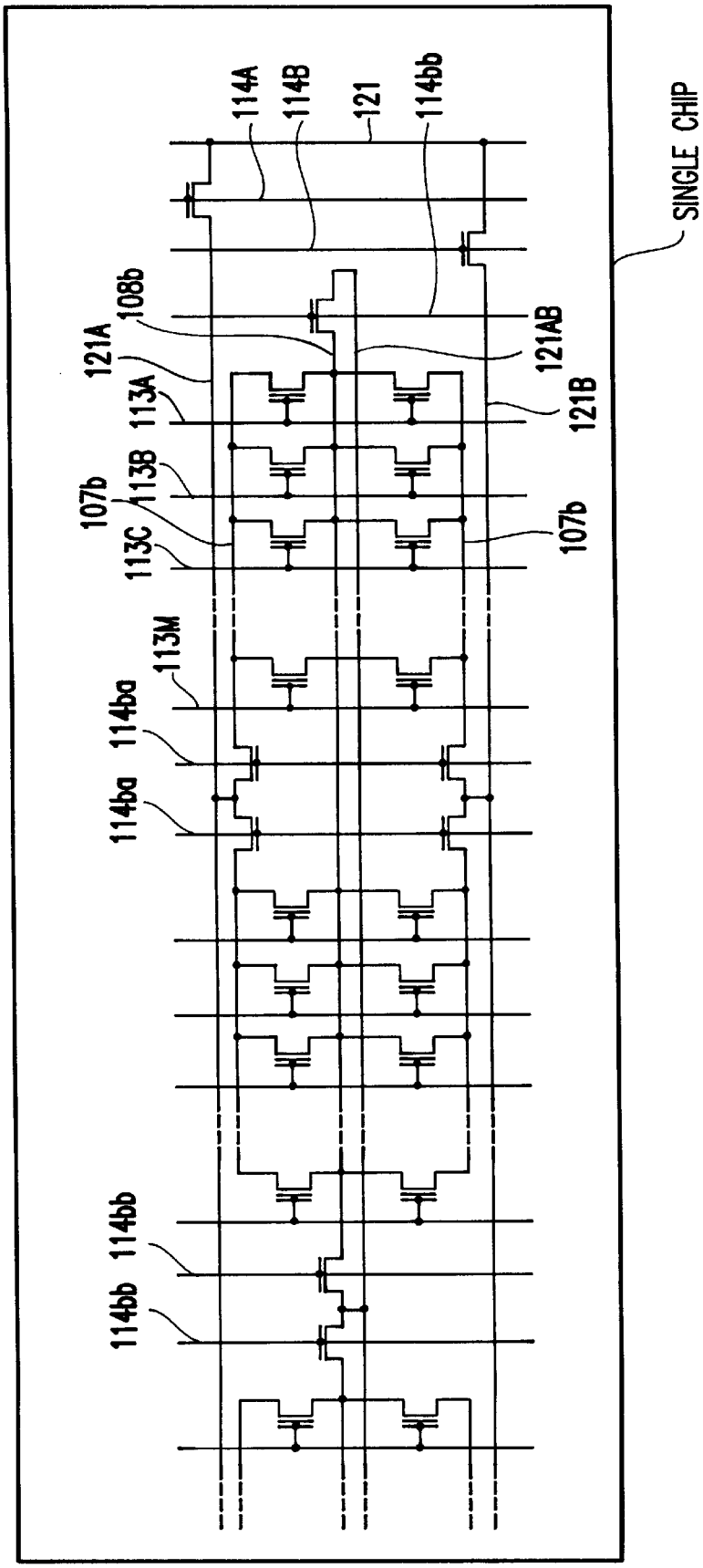
FIG. 6 illustrates a circuit diagram of a NOR-type single-chip contact-less flash memory.
Figure 7:
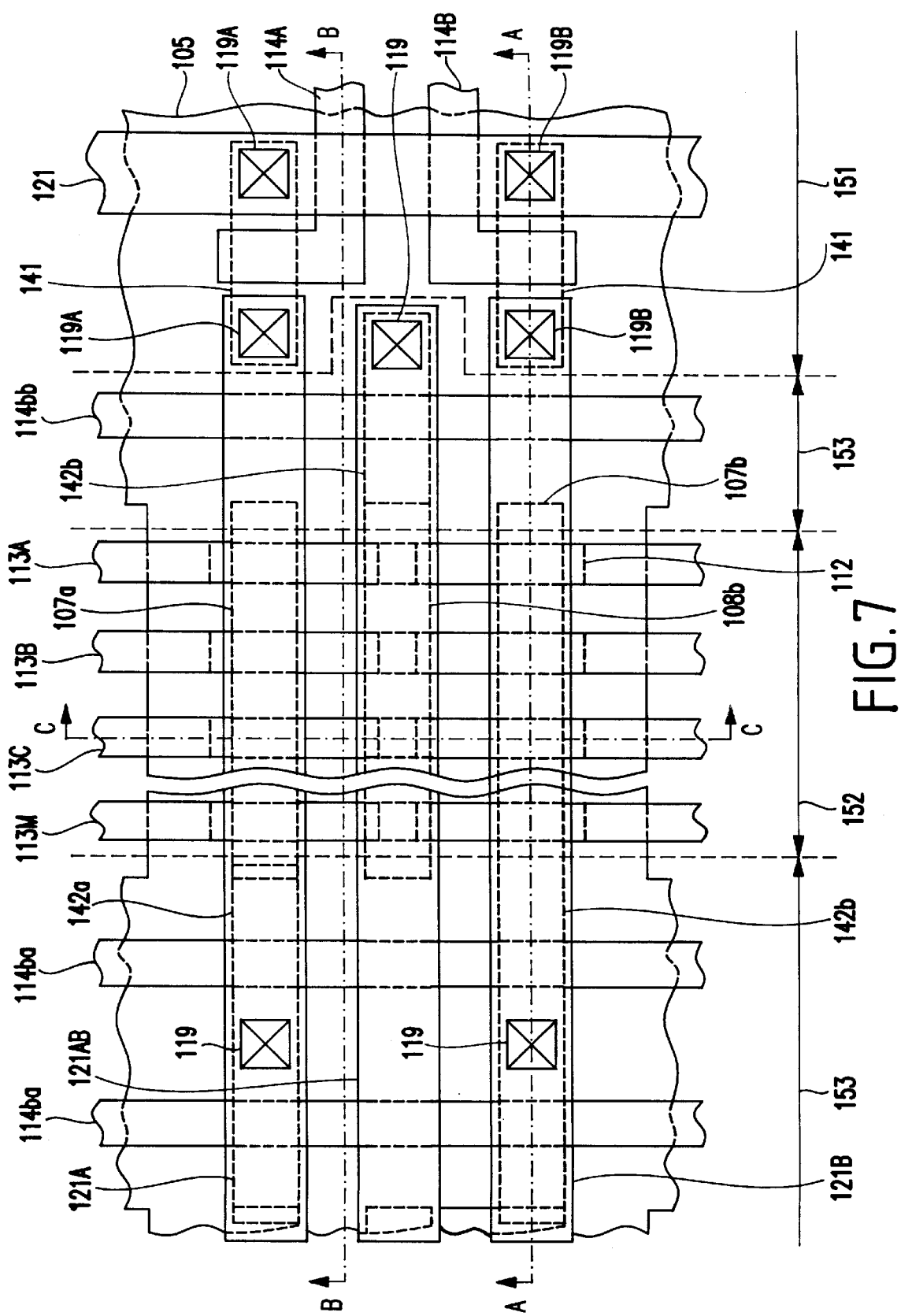
FIG. 7 illustrates a plan view of the NOR-type flash memory shown in FIG. 6.
Figure 8A:
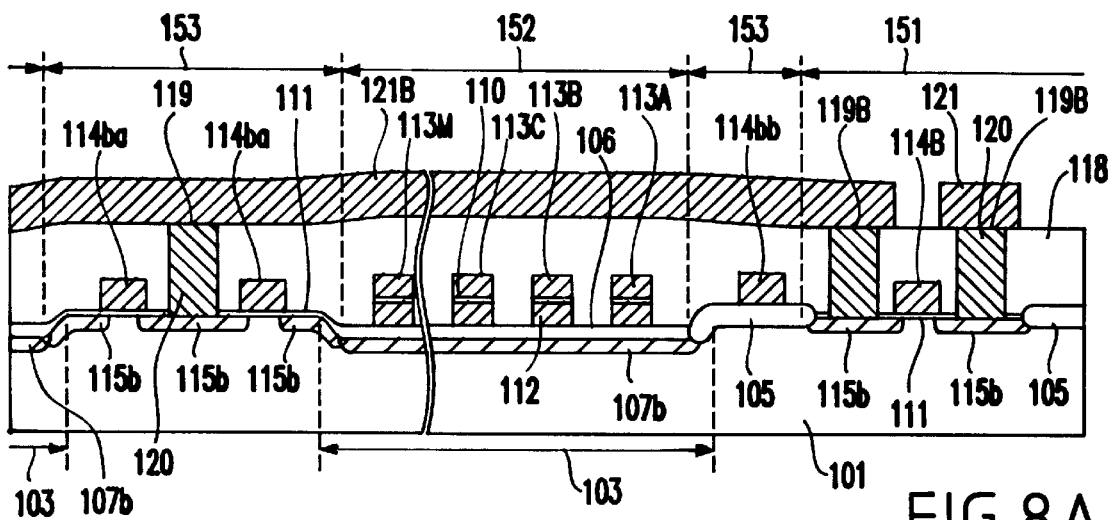
FIGS. 8($a$)–($c$) respectively show sectional views of the NOR-type flash memory shown in FIG. 7 taken along lines A—A, B—B and C—C.
Figure 8B:
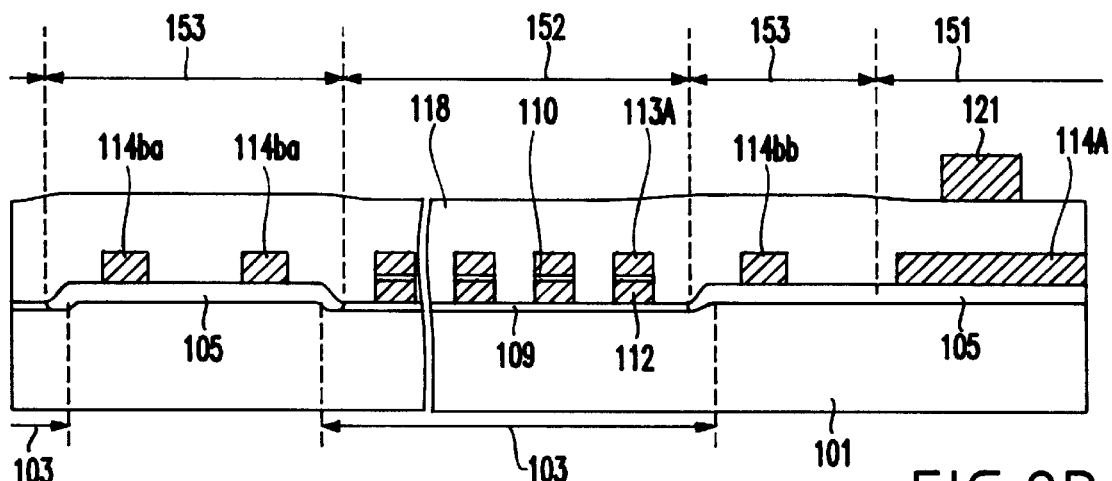
Figure 8C:
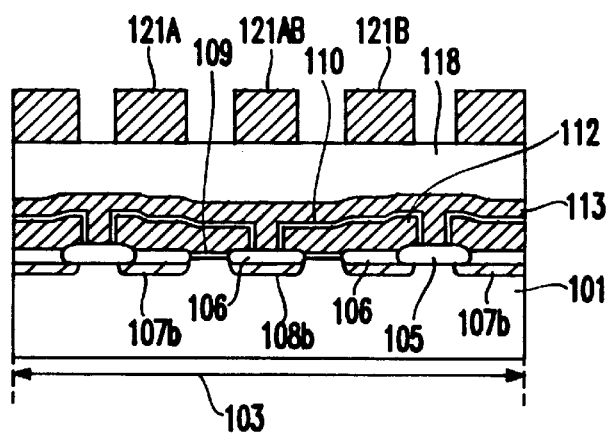

Referring now to the drawings, and more particularly to FIGS. 6–8, a single-chip contact-less flash memory device is shown according to a second embodiment of the present invention.

FIG. 6 shows a circuit diagram of a NOR-type flash memory, FIG. 7 shows a plan view of the NOR-type flash memory shown in FIG. 6, and FIGS. 8(a)–(c) respectively show sectional views of the NOR-type flash memory shown in FIG. 7 taken along lines A—A, B—B and C—C.

The same parts in the second embodiment as those in the first embodiment are numbered with the same reference numerals in the first embodiment, and, for brevity, a description of these parts is omitted hereinbelow.

In the second embodiment, the end portion of the element region 142b is not connected directly to the cell array region 152.

One end of the sub-bit line 107b and the sub-ground line 108b, including a $N^+$-type buried diffusion layer, provided on the surface of the base of the cavity 103, respectively reach the element region 142b belonging to the connecting region 153 and extend over the inclined face of the cavity 103 forming the peripheral portion of the cavity belonging to the connecting region 153.

Referring now to the drawings, and more particularly to FIGS. 9–10, a method for fabricating the single-chip contact-less flash memory device is described below. FIGS. 9(a)–(e) show steps at a structural portion shown in FIG. 8(a). FIGS. 10(a)–(e) shows steps at a structural portion shown in FIG. 8(c).

First, a first field oxide film (not shown) having a thickness of approximately 300 nm is formed by selective oxidation at a memory cell array region on the original surface of the P-type silicon substrate 101. The cavity 103 having an inverted trapezoidal configuration is formed by removing the first field oxide film (FIG. 9(a), FIG. 10(a)). In this case, a silicon substrate may be used, having P-wells at least provided in the memory cell array region and the connecting portion region and a part of the peripheral circuit region, instead of the P-type silicon substrate 101.

Next, a pad oxide film 131 having a film thickness of approximately 40 nm is formed on the substrate 101, and a first silicon nitride film (not shown) is formed on the pad oxide film 131. Then, the pad oxide film 131 and the first silicon nitride film on a predetermined region for forming a second field oxide film 105 are etched.

Thereafter, the second field oxide film 105 having a thickness of approximately 200 nm is formed by selective oxidation. The first silicon nitride film is removed after the second field oxide film 105 is formed. Then, a second silicon nitride film 132a having a thickness of approximately 50 nm is formed by selective oxidation.

Furthermore, unlike the first embodiment, a silicon oxide film having a film thickness of approximately 500 nm is formed on the entire surface, and the upper surface of the silicon oxide film is flattened by CMP.

Figure 9A:
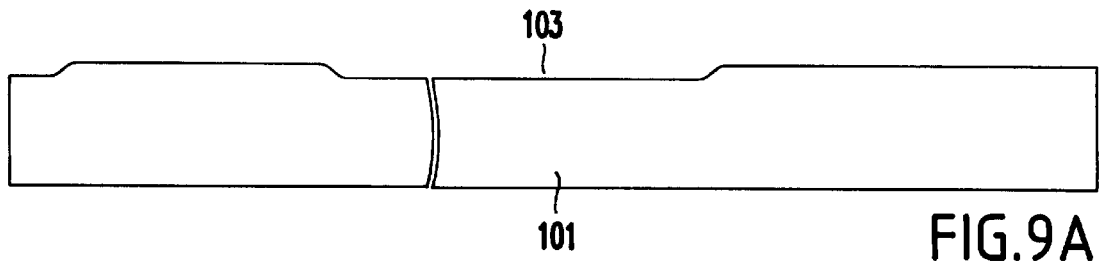
FIGS. 9($a$)–($e$) show steps at a portion shown in FIG. 8($a$)
Figure 9B:
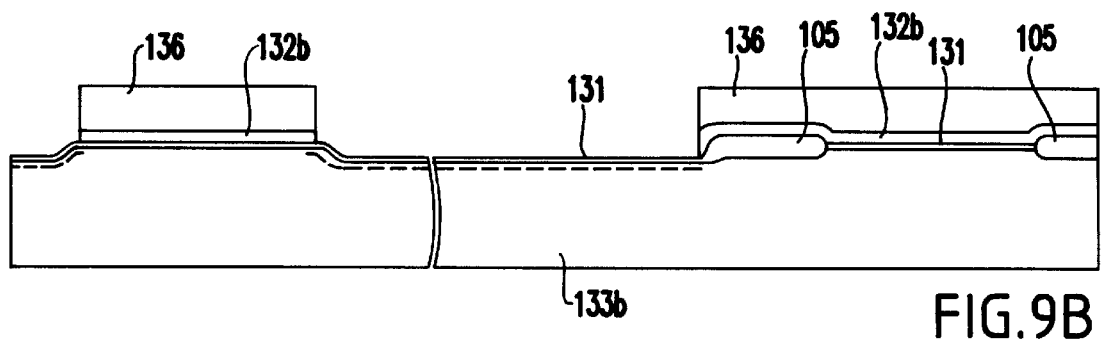
Figure 9C:
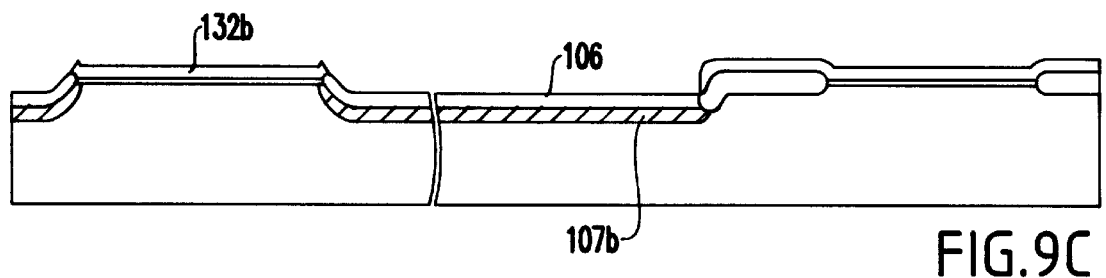
Figure 10A:
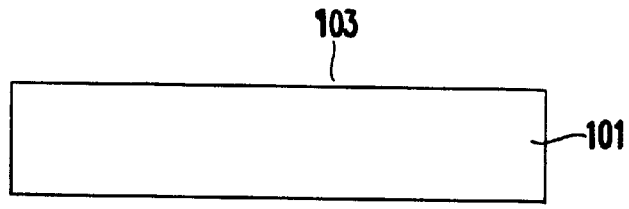
FIGS. 10($a$)–($e$) show steps at a portion shown in FIG. 8($c$)
Figure 10B:
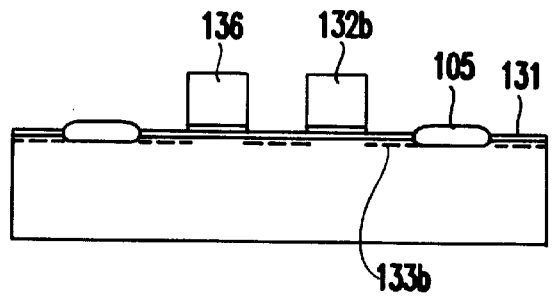
Figure 10C:
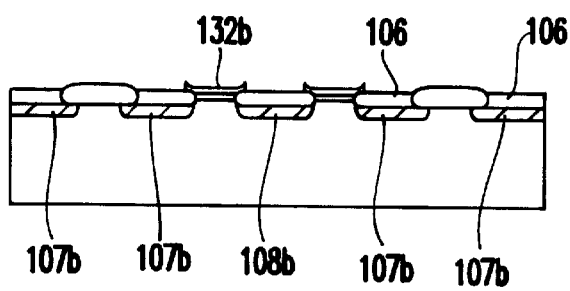

Then, this silicon oxide film 136 is etched by using a photo-resist film (not shown) (FIG. 9(b), FIG. 10(b)). The silicon oxide film 136 covers a part of the peripheral portion having a channel region on the base of the cavity 103 and the inclined face of the cavity 103. An opening is provided in a sub-bit line region and a sub-ground line region including the remaining part of the peripheral portion having the inclined face of the cavity 103.

The remaining part of the peripheral portion having the inclined face of the cavity 103 is a portion wherein first ends of the sub-bit line region and the sub-ground line region are extended to the portion and connected to an element region 142b in a connecting region 153. Second ends of the sub-bit line region and the sub-ground line region remain in the base of the cavity forming a cell array region 152.

Then, by using the silicon oxide film 136 as a mask, the silicon nitride film is patterned and a silicon nitride film 132b is left. Thereafter, ion implantation of arsenic (As) is performed at 40 keV and at approximately $5 \times 10^{15}$ cm$^{-2}$. As a result, an N-type ion implanted layer 133b in the sub-bit line region and the sub-ground line region on the base of the cavity 103 form a cell array region 152 (FIG. 9(b), FIG. 10(b)).

After the silicon oxide film 136 is removed, heat treatment is performed at 850° C. and for approximately 30 minutes in a nitrogen atmosphere. Further, selective oxidation is performed with the silicon nitride film 132b as a mask. As a result, the sub-bit line 107b and the sub-ground line 108b composed of $N^+$-type buried diffusion layers, (buried $N^+$-type diffusion layers), and a third field oxide film 106 having a thickness of approximately 40 nm and covering surfaces of these sub-bit line 107b and sub-ground line 108b, are formed (FIG. 9(c), FIG. 10(c)).

After the silicon nitride film 132b and the pad oxide film 131 are removed, a first gate oxide film 109 having a thickness of approximately 10 nm is formed in channel regions by thermal oxidation. An N-type polycrystalline silicon film 134 is formed on the entire surface after the first gate oxide film 109 is formed. Patterning is applied to this polycrystalline silicon film 134, and the polycrystalline silicon film 134 is left on the gate oxide film 109 and on the sub-bit line 107b.

The polycrystalline silicon film 134 is left on only the base of the cavity 103. A silicon oxide film (not shown) is formed selectively on the surface of the polycrystalline silicon film 134 by thermal oxidation, and further, a silicon nitride film (not shown) is formed on the entire surface.

Patterning is applied to this silicon nitride film, and the silicon nitride film is left mainly on the surface of the polycrystalline silicon film pattern 134. Then, thermal oxidation is performed again, and a gate insulating film 110 composed of an ONO film is formed on the surface of the polycrystalline silicon film 134.

Figure 9D:
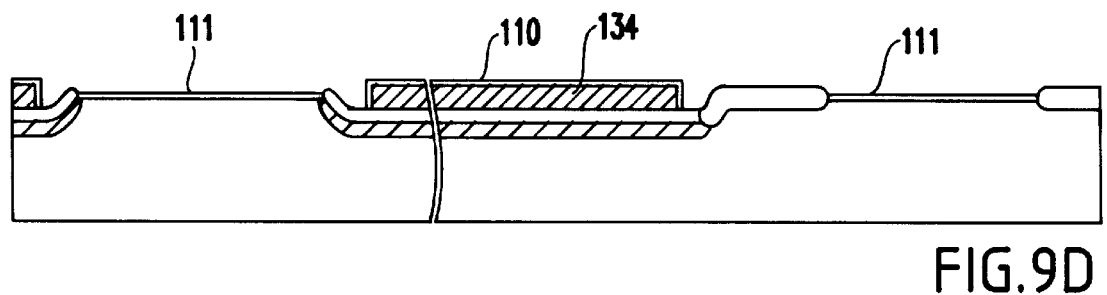
Figure 10D:
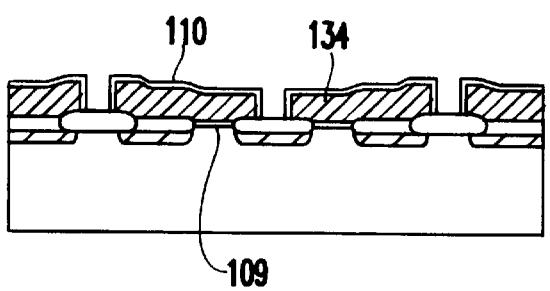

A second gate oxide film 111 having a film thickness of approximately 20 nm is formed in the peripheral portion of the cavity 103 having an inclined face surrounded by the field oxide film 105 and in an element region on the original surface of the P-type silicon substrate 101 (FIG. 9(d) and FIG. 10(d)).

Next, an N+-type polycrystalline silicon film (not shown) having a thickness of approximately 300 nm is formed on the entire surface. The thickness of this polycrystalline silicon film is preferably a thickness sufficient to fill void portions among the polycrystalline silicon film 134 and the portion including the inclined surface around the cavity 103 and to reduce (minimize) irregularity on the surface of the polycrystalline silicon film 134 in these portions.

The second polycrystalline silicon film covering the base of the cavity 103, the gate insulating film 110 and the polycrystalline silicon film 134 are applied with patterning sequentially with a photo-resist pattern (not shown) covering at least a predetermined region of the principal surface of the P-type silicon substrate 101 as a mask. As a result, the control gate electrodes 113A, 113B, 113C, and 113M and the floating gate electrode 112 are formed.

Although the control gate electrodes cross over the inclined surface around the cavity 103, patterning of the control gate electrodes is applied easily and without hindrance because the above-mentioned N+-type polycrystalline silicon film has a shape (thickness, etc.) described above.

Then, patterning of the second polycrystalline silicon film is performed with another photo-resist film pattern (not shown) covering at least the top of the base of the cavity 103 as a mask. As a result, gate electrodes 114bb, 114ba and gate electrodes 114A, 114B are formed in the connecting region 151 having an element region 142b including the peripheral portion of the cavity 103 having the inclined surface and in the peripheral circuit region 151 having an element region 141 on the original surface of the P-type silicon substrate 101.

Then, the ion implantation of arsenic is performed at 70 keV and at $5 \times 10^{15}$ cm$^{-2}$ with another photo-resist film pattern (not shown) covering the base of the cavity 103, the gate electrodes 114bb, 114ba, the gate electrodes 114A, 114B and the field oxide film 105 as a mask. Thereafter, a heat treatment is performed.

Figure 9E:
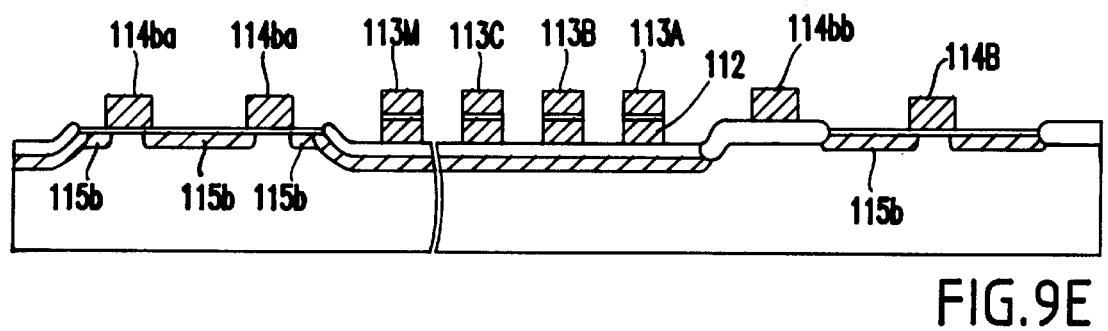
Figure 10E:
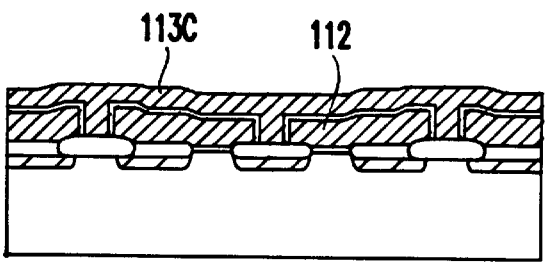

Through these processing steps, an N+-type diffusion layer 115b is formed in an element region 142b in the peripheral portion of the cavity 103 having the inclined surface surrounded by the field oxide film 105 and in an element region 141 on the principal surface of the P-type silicon substrate 101 (FIG. 9(e) and FIG. 10(e)).

Next, a silicon oxide film (HTO film) (not shown) having a thickness of approximately 100 nm is deposited by the LPCVD method. Then, a BPSG film (not shown) having a thickness of approximately 500 nm is deposited by the APCVD method using ozone ($O_3$) and TEOS ($Si(OC_2H_5)_4$) as a principal material and TMP ($PO(OCH_3)_3$) and TMB ($B(OCH_3)_3$) as additives.

Furthermore, heat treatment is performed at 950° C. for approximately 30 minutes in a nitrogen atmosphere, and an interlayer insulating film 118 is formed on the entire surface. The irregularity of the surface of the interlayer insulating film 118 is reduced because of heights with the gate electrodes 114A, 114B, the gate electrodes 114bb, 114ba and the control gate electrodes 113A being relatively the same. Furthermore, the thickness of the interlayer insulating film 118 need not be large. Besides, even when the thickness of the interlayer insulating film 118 is not sufficient, CMP still may be employed.

Then, the contact holes 119A, 119B reaching the N+-type diffusion layer 115a of an N-channel transistor forming a peripheral circuit, and the contact holes 119 reaching another N+-type diffusion layer 115b of a select gate transistor are formed. The depth of the contact hole 119 and the depth of the contact holes 119A and 119B are almost equal to each other.

A titanium film (not illustrated), a titanium nitride film (not illustrated) and a tungsten film (not illustrated) are formed sequentially on the entire surface. Then, these laminated conductor films are etched back. As a result, contact plugs 120 filling the contact holes 119, 119A, and 119B, are formed.

An aluminum alloy film is formed on the entire surface and is patterned. As a result, the wiring 121, the principal bit line 121A, 121B and the principal ground lines 121AB are formed.

Since irregularity of the surface of the interlayer insulating film 118 is reduced in the second embodiment (as well as the first embodiment), the patterning of the wiring 121, the principal bit lines 121A, 121B and the principal ground line 121AB is performed easily and without hindrance.

Further, the second embodiment is advantageous over the first embodiment in that although photo-resist film 161a in the first embodiment cannot be made flat because of the cavity 103. As a result, patterning may be problematic because of poor focus (e.g., in the photolithography step). However, the second embodiment solve the problem of the first embodiment because polysilicon film 136 is made almost flat by CMP. This concept can be used for any memory device other than the flash memory device.

In the second embodiment, an N-channel MOS transistor is illustrated as a semiconductor element forming a peripheral circuit. However, the peripheral circuit may be formed with the CMOS transistor. In addition, the film thicknesses, widths, and intervals described above are not limited to the numerical values mentioned above.

Third Embodiment

Figure 11:
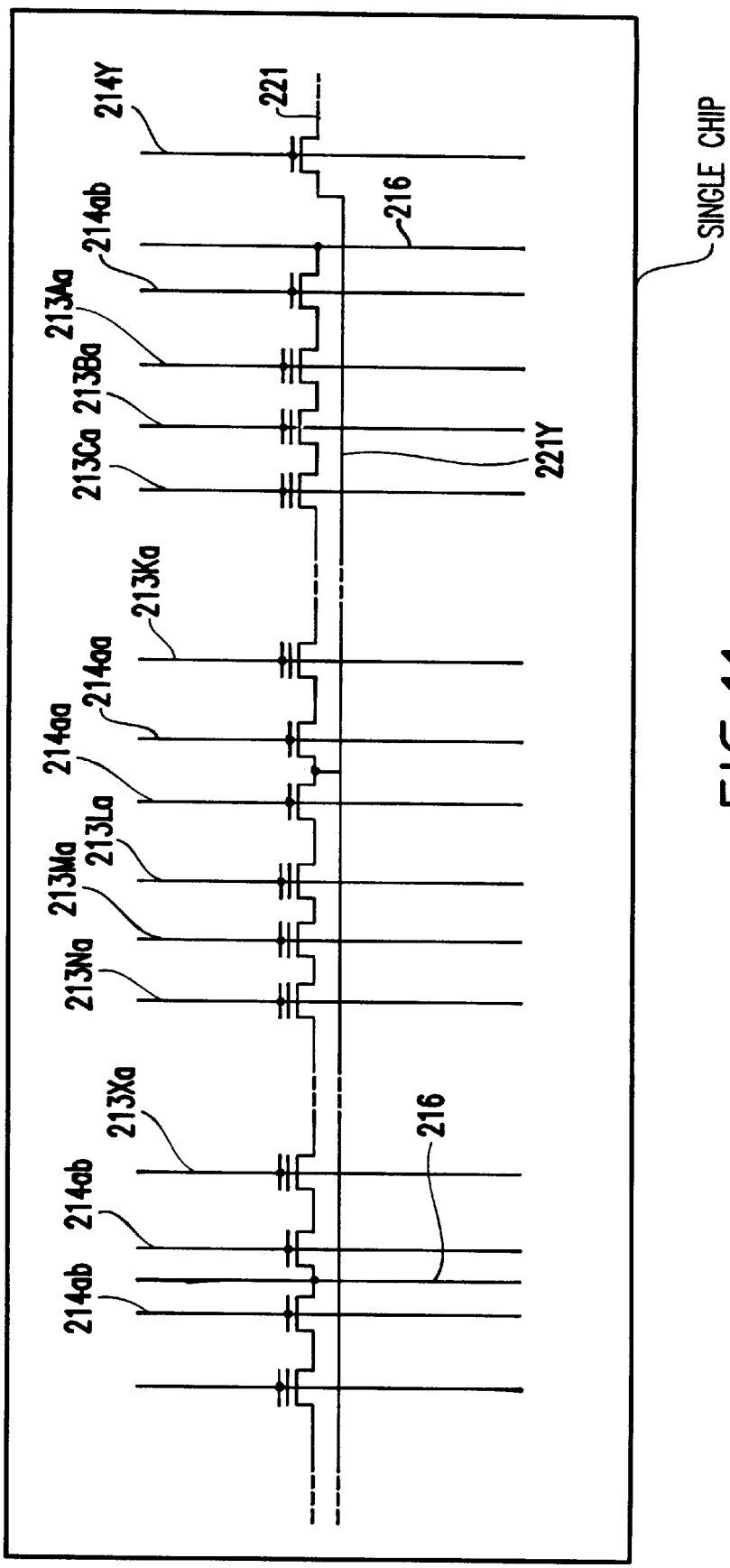
FIG. 11 illustrates a circuit diagram of a NAND-type single-chip contact-less flash memory.

Referring now to the drawings, and more particularly to FIGS. 11–12, a single-chip contact-less flash memory device is shown according to a third embodiment of the present invention.

Figure 12A:
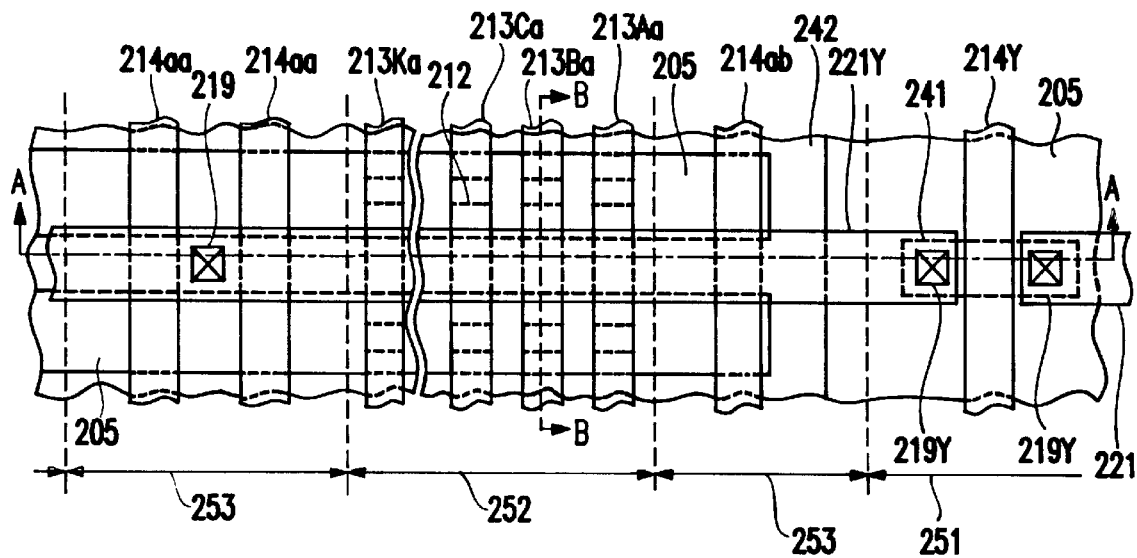
FIG. 12($a$) illustrates a plan view of the NAND-type flash memory shown in FIG. 11.
Figure 12B:
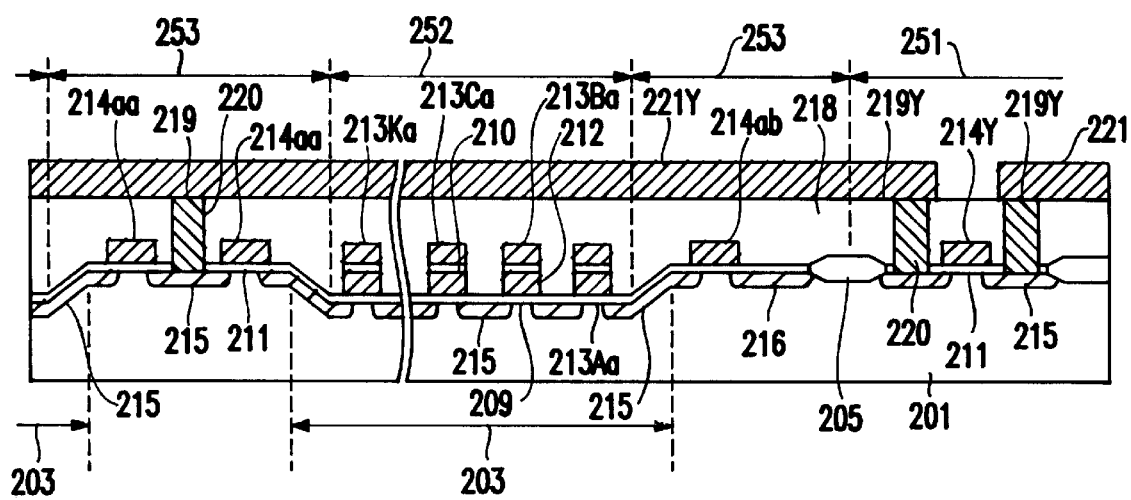
Figure 12C:
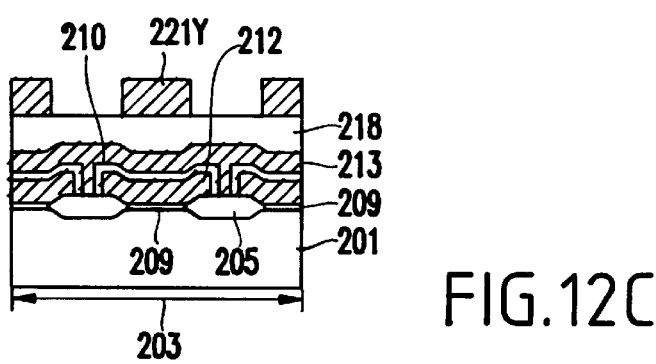

FIG. 11 shows a circuit diagram of a NAND-type flash memory, FIG. 12(a) shows a plan view of the NAND-type flash memory shown in FIG. 11, and FIGS. 12(b)–(c) respectively show sectional views of the NAND-type flash memory shown in FIG. 11 taken along lines A—A and B—B.

In an original surface of a P-type silicon substrate 201, a cavity 203, having an almost inverted trapezoidal shape and a flat base, is provided. The base of the cavity 203 is located at a position lower than the original surface of the P-type silicon substrate 201 by approximately 150 nm. On the base of the cavity 203, a NAND cell array 252, including laminated gate electrode-type and contact-less type nonvolatile memory cells, is formed.

A peripheral circuit region 251 is provided on the principal surface of the P-type silicon substrate 201. Moreover, a connecting portion region 253 for connecting between a peripheral circuit and a cell array or among cell arrays is provided in an S-shaped (e.g., a "lazy S-shaped") region including the principal surface of the P-type silicon substrate 201 adjacent to the cavity 203 and the end portion of the base of the cavity 203.

In an element region 241 in the peripheral circuit region 251, a MOS transistor forming the peripheral circuit is provided. As a feature of a NAND-type cell array, the element regions of the cell array region 252 and the connecting portion region 253 are connected to each other to form element regions 242. In the element regions 242 in the cell array region 252 and the connecting portion region 253, select gate transistors including memory cells and a MOS transistor, respectively, are provided.

The gate width of the element region 242 in the cell array region 252 is approximately 0.6 μm. In an element isolation region except for the regions 241 and 242, a field oxide film 205, which is a LOCOS-type and has a thickness of approximately 200 nm, is provided.

In the element region 242 in the cell array region 252, a gate oxide film 209, having a thickness of approximately 10 nm and formed by thermal oxidation, is provided. The nonvolatile memory cell is formed of a gate oxide film 209, a floating gate electrode 212 laminated on the gate oxide film 209, a gate insulating film 210, a control gate electrode 213A*a*, for example, also serving as a word line and an N⁺ type diffusion layer 215 in which the element region 242 is provided in self-alignment manner on the control gate electrode 213A*a* and the floating gate electrode 212.

The depth of junction of the N⁺ type diffusion layer 215 is approximately 150 nm. The control gate electrode 213A*a*, 213B*a*, 213C*a*, 213K*a*, 213L*a*, 213M*a*, 213N*a*, 213X*a* meets at right angles with the element region 242 in the cell array region 252, and is formed of an N⁺-type polycrystalline silicon film having a gate length of approximately 0.4 μm and a film thickness of approximately 300 nm.

The floating gate electrode 212 including an N⁻-type polycrystalline silicon film having a thickness of approximately 150 nm exists only immediately below the control gate electrodes 213A*a*. The end portion of the floating gate electrode 212 is located at a position extended to the surface of the field oxide film 205. The minimum spacing of the floating gate electrode 212 right below the same control gate electrode 213 is approximately 0.4 μm. The gate insulating film 210 includes an ONO film and is provided only between the control gate electrode 213 and the floating gate electrode 212.

In the element region 241 and in the element region 242 in the connecting portion region 253, a gate oxide film 211 having a thickness of approximately 20 nm by thermal oxidation is provided. Moreover, gate electrodes 214Y and gate electrodes 214*aa*, 214*ab*, each having an N⁺-type polycrystalline silicon film having a thickness of approximately 300 nm, are provided.

Furthermore, in the element region 241, an N⁺-type diffusion layer 215 is provided in a self-alignment manner in the gate electrode 214Y. In the element region 242 in the connecting region 253, an N⁺-type diffusion layer 215 is provided in a self-alignment manner on the gate electrode 214*aa*, and an N⁺-type diffusion layer 215 and a ground line 216 are provided in a self-alignment manner in the gate electrode 214*ab*.

A semiconductor element forming the peripheral circuit has an N-channel MOS transistor having a pair of N⁺-type diffusion layers 215, which become source and drain regions. A select gate transistor in the connecting portion region 253 has a pair of N⁺-type diffusion layers 215, which become source and drain regions, the gate oxide film 211 and the gate electrode 214*aa*. A select gate transistor connected to a ground line 216 is also formed by the ground line 216, a pair of N⁺-type diffusion layers 215, which become source and drain regions, the gate oxide film 211 and the gate electrode 214*ab*.

The P-type silicon substrate 201 is covered with an interlayer insulating film 218 having a thickness of approximately 600 nm. In the interlayer insulating film 218, there are a contact hole 219Y reaching the N⁺-type diffusion layer 215 in the peripheral circuit region 251, and a contact hole 219 reaching the N⁺-type diffusion layer 215 in the connecting region 253, which is not connected directly to the memory cell region 252. These contact holes 219 and 219Y are filled with contact plugs 220.

On the surface of the insulating film 218, a wiring 221 and a bit line 221Y, each formed of a metal film, are formed. The wiring 221 is connected to an N-channel MOS transistor forming the peripheral circuit through a contact hole 219Y. The bit line 221Y is connected to the select gate transistor having the gate electrode 214*aa* through the contact hole 219.

In the third embodiment, the difference between the height of the top of the control gate electrode 213A*a* and the height of the top of the gate electrode 214*aa*, 214*ab*, 217Y is also reduced by providing the cavity 203. As a result, irregularity of the surface of the insulating film 218 is minimized (or prevented).

The circuit operation of a NAND-type flash memory of the third embodiment is described below. The definition of write and erase in this flash memory is opposite to those of the NOR-type flash memory described above with regard to the first and second embodiments.

A writing operation is described hereinbelow to a nonvolatile memory cell (in row B and column Y) belonging to, for example, the control gate electrode 213B*a* in row B and a bit line 221Y in column Y.

A wiring 221 is applied with a predetermined potential, the gate electrode 214Y is applied with 0 V and the bit line 221Y is selectively applied with 0 V. The gate electrode 214*aa* of a select gate transistor (connected to the bit line) on the side belonging to the control gate electrode 213B*a* is applied with high potential. At this time, other bit lines are applied with an intermediate potential (such as 7 V).

Furthermore, the P-type silicon substrate 201 and the ground line 216 are applied with 0 V and further, the gate electrode 214*ab* of the select gate transistor (connected to the ground line 216) on the side belonging to the control gate electrode 213B*a* is applied with a high potential. Only the control gate electrode 213B*a* is selectively applied with a high potential (such as 18 V) and the other control gate electrodes 213A*a*, 213C*a*, 213K*a* are applied with an intermediate potential.

At this time, a pair of N⁺ type diffusion layers 215 are applied with 0 V. As a result, only in the nonvolatile memory cell (in row B and column Y), charges (or electrons) are selectively injected from the N⁺ type diffusion layer 215 into the floating gate electrode 212 by F-N tunneling. The threshold voltage $V_{TM}$ of the nonvolatile memory cell subjected to writing is approximately 2 V.

It is noted that the intermediate potential described herein refers to a potential within a range where the nonvolatile memory cell itself is turned on (but F-N tunneling does not occur).

An erasing operation is conducted as described hereinbelow. The P-type silicon substrate 201 is applied with a high potential (such as 20 V) and all bit lines including the bit line 221Y are in an open state. All control gate electrodes including the control gate electrode 213B*a* are applied with 0 V. As a result, charges (or electrons) stored in all of the floating gates 212 are drawn out to the P-type silicon substrate 201 by F-N tunneling. The threshold voltage$_{TM}$ of the nonvolatile memory cell subjected to erasing is approximately −2 V.

Referring now to the drawings, and more particularly to FIGS. 13–14, a method for fabricating the single-chip contact-less flash memory device is described below. FIGS. 13(*a*)–(*e*) show steps at a portion A—A shown in FIG. 12(*a*). FIGS. 14(*a*)–(*e*) show steps at a portion B—B shown in FIG. 12(*a*).

First, a first silicon nitride film (not shown) is formed on a cell array region of the principal surface of the P-type silicon substrate 201 through a pad oxide film 230. A first field oxide film 202 having a thickness of approximately 300 nm is formed by selective oxidation by using the first silicon nitride film (not shown) as a mask.

Figure 13A:
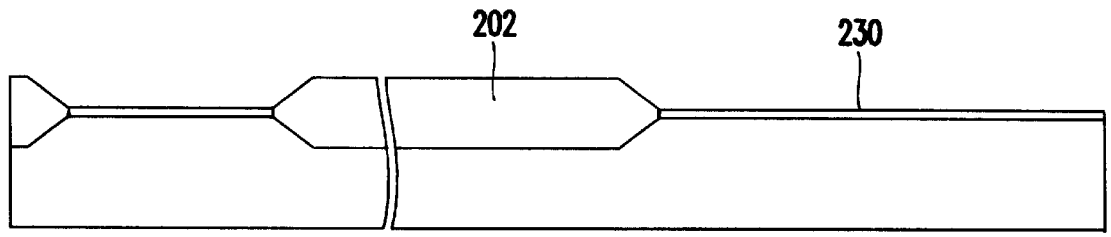
FIGS. 13($a$)–($e$) show steps at a portion A—A shown in FIG. 12($a$)
Figure 13B:
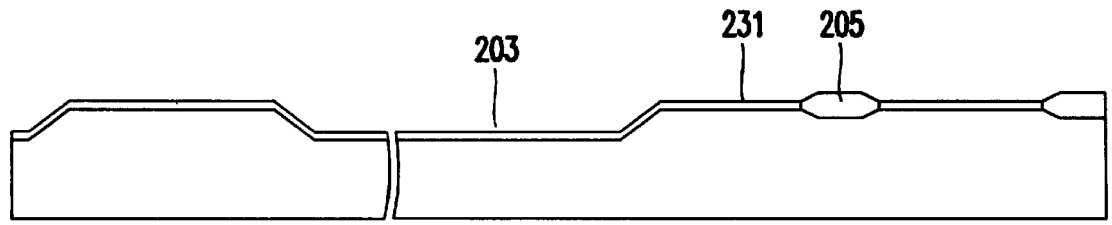
Figure 13C:
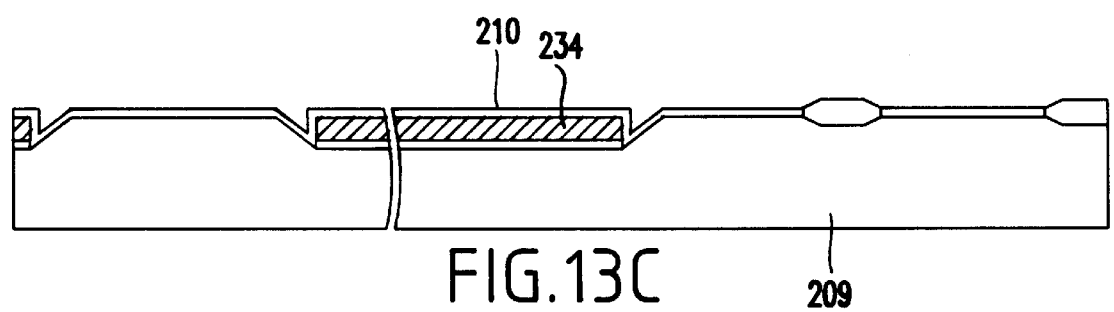
Figure 13D:
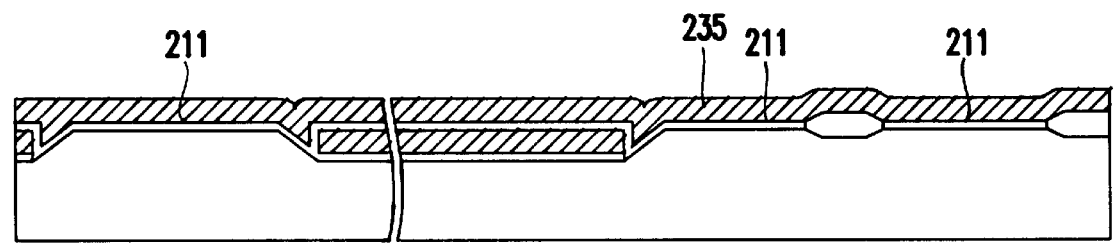
Figure 13E:
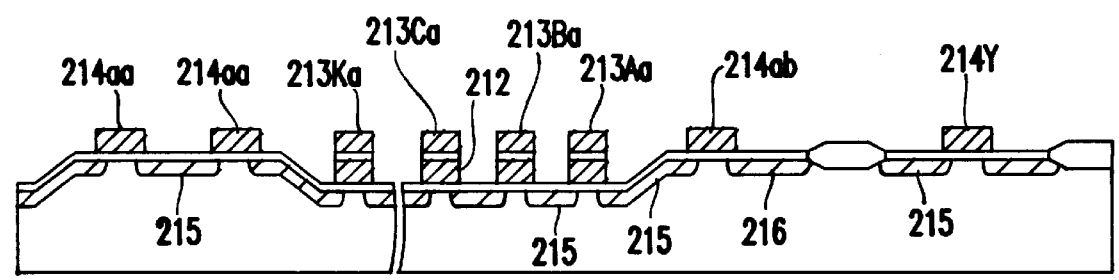
Figure 14A:
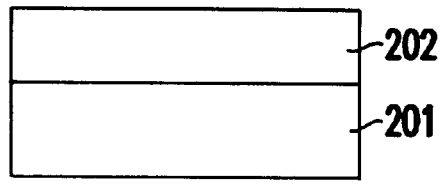
FIGS. 14($a$)–($e$) show steps at a portion B—B shown in FIG. 12($a$)
Figure 14B:
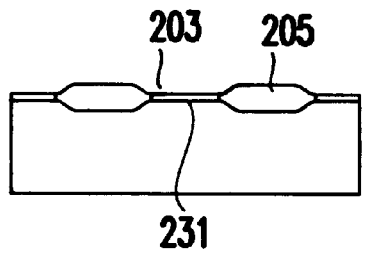
Figure 14C:
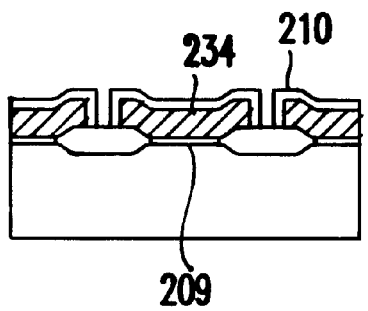
Figure 14D:
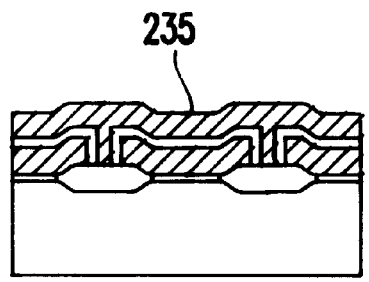
Figure 14E:
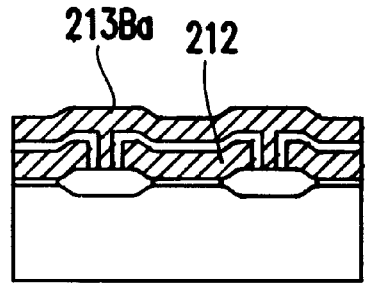

In the third embodiment, it is possible to use a silicon substrate in which a P-well is provided in at least a cell array region, a connecting portion region and a part of a peripheral circuit region, instead of using the P-type silicon substrate 201 (FIG. 13(a) and FIG. 14(a)).

Next, after the silicon nitride film is removed, the field oxide film 202 and the pad oxide film 230 are removed, and the cavity 203 is formed. After a pad oxide film 231 having a thickness of approximately 40 nm is formed on the entire surface, a second silicon nitride film (not shown) is formed on the element regions 241 and 242. A second field oxide film 205 having a thickness of approximately 200 nm is formed by selective oxidation by using the second silicon nitride film as a mask (FIG. 13(b) and FIG. 14(b)).

After the second silicon nitride film and the pad oxide film 231 are removed, a first gate oxide film 209 having a thickness of approximately 10 nm is formed at least in the element region 242 on the base of the cavity 203. An $N^-$-type first polycrystalline silicon film (not shown) is formed on the entire surface. This polycrystalline silicon film is patterned, and a "lazy S-shaped" polycrystalline silicon film pattern 234, covering the gate oxide film 209 and covering the field oxide film 205 with a predetermined width, is left.

The polycrystalline silicon film pattern 234 remains only on the base of the cavity 203, and the spacing of the polycrystalline silicon film pattern 234 is approximately 0.4 $\mu$m. A silicon oxide film (not shown) is formed selectively on the surface of the polycrystalline silicon film pattern 234 by thermal oxidation, and further a third silicon nitride film (not shown) is formed on the entire surface.

This silicon nitride film is patterned, and the silicon nitride film is left almost only on the surface of the polycrystalline silicon film pattern 234. Then, thermal oxidation is performed again, a gate insulating film 210 having an ONO film is formed on the surface of the polycrystalline silicon film pattern 234, and a second gate oxide film 211 having a thickness of approximately 20 nm is formed in the element region 241 surrounded by a field oxide film 207 and in the element region 242 belonging to the connecting region 253 (FIG. 13(d) and FIG. 14(d)).

Next, an $N^+$-type polycrystalline silicon film 235, which is a second polycrystalline silicon film, having a thickness of, for example, approximately 300 nm, is formed on the entire surface. The third embodiment is not limited to the polycrystalline silicon film 235, but a polycide film can also be used.

Patterning is applied to the polycrystalline silicon film 235 covering the base of the cavity 203, the gate insulating film 210 and the polycrystalline silicon film pattern 234 sequentially with a photo-resist film pattern (not shown) covering at least a predetermined region on the original surface of the P-type silicon substrate 201 as a mask. As a result, the control gate electrode 213Aa, 213Ba, 213Ca, 213Ka, 213La, 213Ma, 213Na, and 213Xa and the floating gate electrode 212 are formed.

Thereafter, the second polycrystalline silicon film is patterned with another photo-resist film pattern (not shown) covering at least the top of the base of the cavity 203 as a mask. As a result, a gate electrode 214aa, 214ab and a gate electrode 214Y are formed.

Then, ion implantation of arsenic is performed at 70 keV and at approximately $5 \times 10^{15}$ cm$^{-2}$ by using the control gate electrode 213Aa and the floating gate electrode 212, the gate electrode 214aa, the gate electrode 214Y, the gate electrode 214aa, 214ab and the oxide film 206 as a mask. Further, heat treatment is performed. Through these processing steps, an $N^+$-type diffusion layer 215 and a ground line 216 are formed (FIG. 13(e) and FIG. 14(e)).

Next, a silicon oxide film (HTO film) (not shown) having a thickness of approximately 100 nm and a BPSG film (not shown) having a thickness of approximately 500 nm are deposited consecutively (e.g., sequentially). Then, an interlayer insulating film 218 are formed on the entire surface by using a thermal process.

Then, a contact hole 219Y reaching an $N^+$-type diffusion layer 215 of an N-channel transistor forming the peripheral circuit and a contact hole 219 reaching another $N^+$-type diffusion layer 215 of a select gate transistor, which forms a pair with the $N^+$-type diffusion layer 215 of a select gate transistor connected directly to the cell array region 252, are formed.

The depth of the contact hole 219Y and the depth of the contact hole 219 are almost (substantially) the same. A titanium film (not shown), a titanium nitride film (not shown) and a tungsten film (not shown) are formed on the entire surface consecutively. These laminated conductor films are etched back, thereby to form contact plugs 220 filling the contact holes 219 and 219Y, respectively.

An aluminum alloy film is formed on the entire surface, which is applied with patterning, thereby to form a wiring 221 and a bit line 221Y. Since irregularity of the surface of the interlayer insulating film 218 is also reduced, the patterning of the wiring 221 and the bit line 221Y is performed easily and without hindrance.

According to the manufacturing method of the third embodiment, the difference in height from the principal surface of the semiconductor substrate among upper ends of operating structures to be provided on the principal surface of the semiconductor substrate is relatively reduced by forming a cavity having a flat base on the principal surface of the semiconductor substrate, forming the above-described operating structures on the surface of the base of the cavity, and by minimizing the height difference by a plurality of manufacturing steps, thereby easily forming a thin film or the like provided on the operating structures.

An N-channel MOS transistor is shown as a semiconductor element forming a peripheral circuit in the third embodiment. However, the peripheral circuit may be formed by a CMOS transistor or the like. Furthermore, the above-mentioned variety of film thicknesses, widths, and intervals are not limited to the above-mentioned numerical values.

In the third embodiment, connection between the control gate electrodes and the peripheral circuits is not described in detail. If it is required to provide a higher density flash memory, the disadvantage relating to a focal depth when forming the control gate electrodes becomes apparent (worse). Therefore, remedying such a circumstance is described below in the fourth embodiment of the present invention.

Fourth Embodiment

Figure 15:
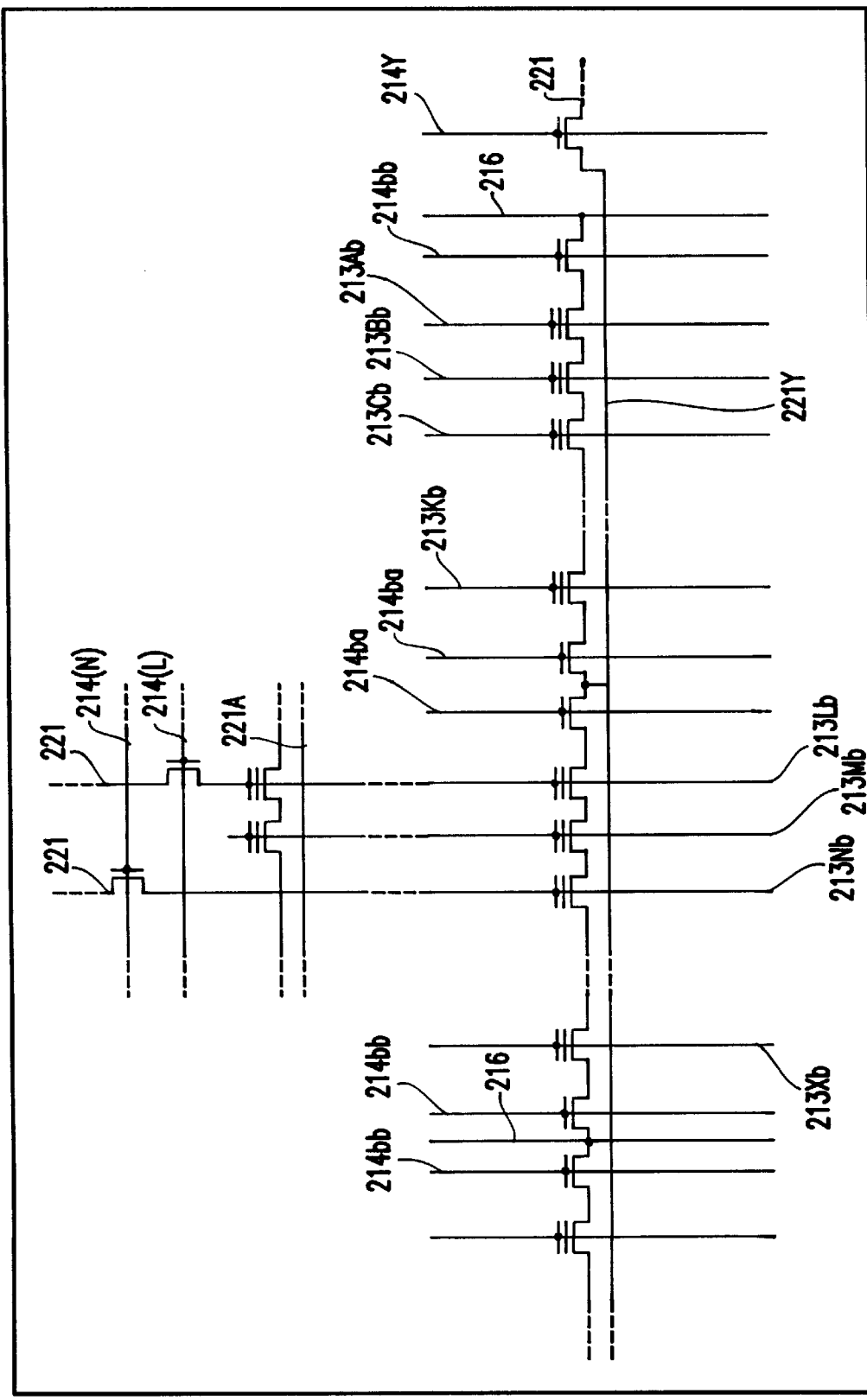
FIG. 15 illustrates a circuit diagram of a NAND-type single-chip contact-less flash memory.
Figure 16A:
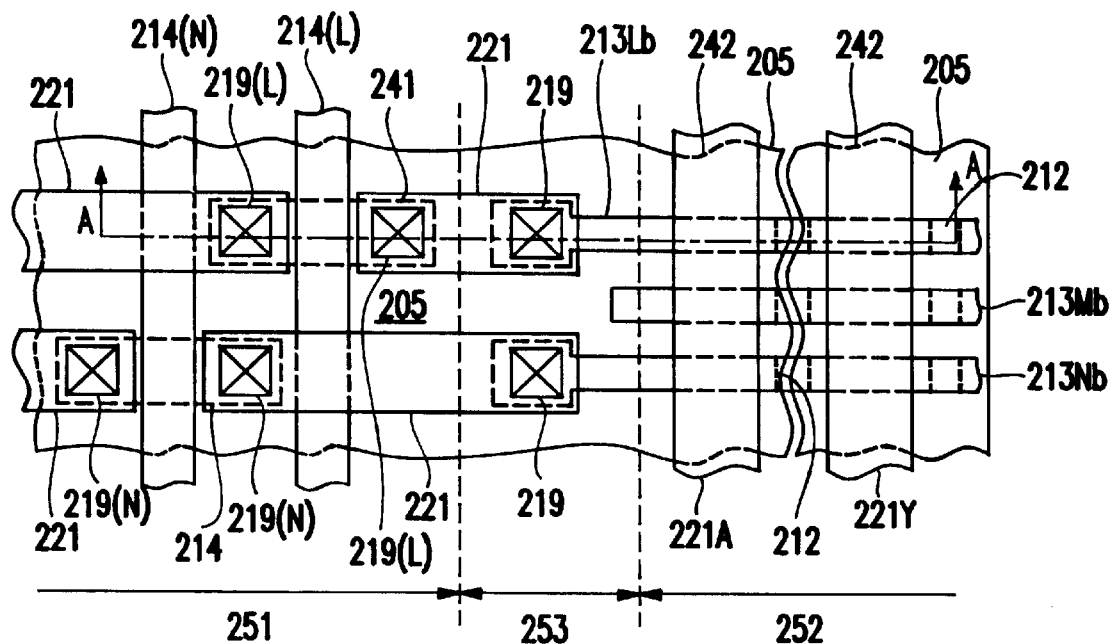
FIG. 16($a$) shows a plan view of the NAND-type flash memory shown in FIG. 15.
FIG. 16(b) shows a sectional view of the NAND-type flash memory shown in FIG. 16(a) taken along line A—A.
Figure 16B:
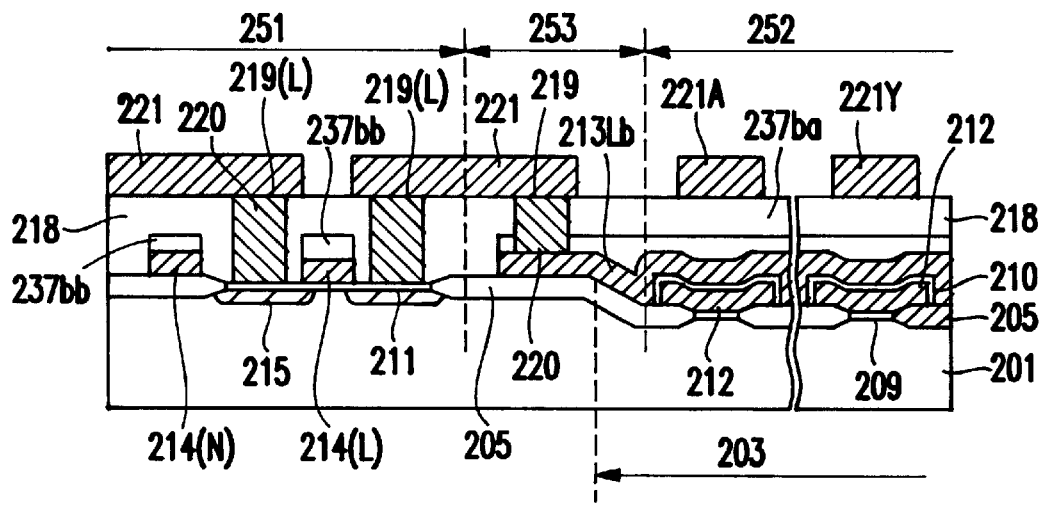
Figure 17A:
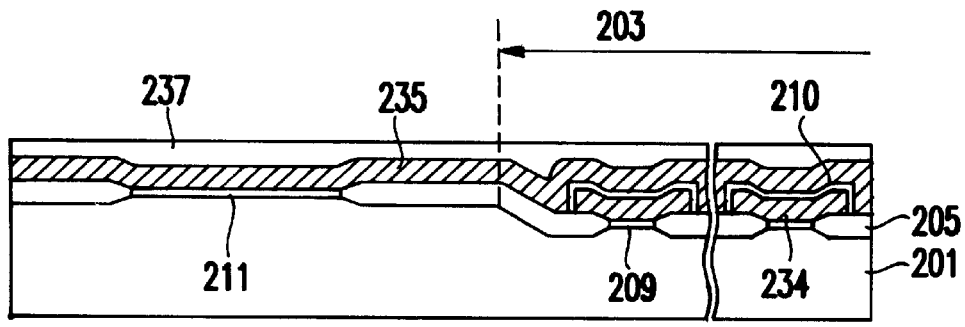
FIGS. 17(a)–(c) show steps at a portion A—A shown in FIG. 16(a)
Figure 17B:
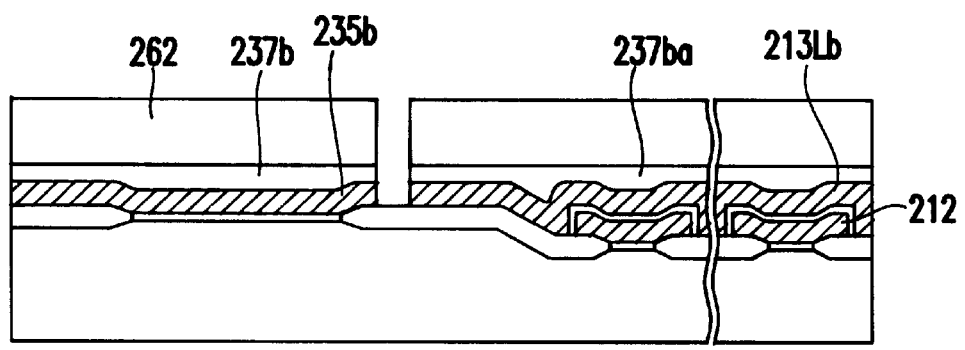
Figure 17C:
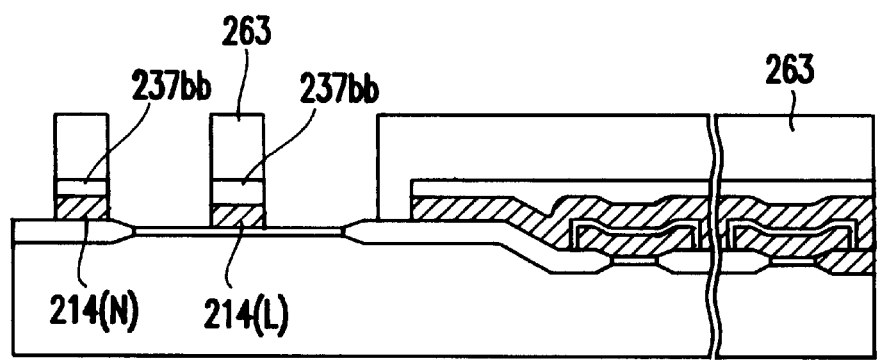

Referring now to the drawings, and more particularly to FIGS. 15–17, a single-chip contact-less flash memory device is shown according to a fourth embodiment of the present invention.

FIG. 15 shows a circuit diagram of an NAND-type flash memory, FIG. 16(a) shows a plan view of the NAND-type flash memory shown in FIG. 15, and FIG. 16(b) shows a sectional view of the NAND-type flash memory shown in FIG. 16(a) taken along lines A—A.

The flash memory in the fourth embodiment includes the upper surface of the control gate electrode being covered with a silicon oxide film cap.

In a P-type silicon substrate 201, a cavity 203 having an almost inverted trapezoidal shape and a flat base is provided. The base of the cavity 203 is located at a position lower than the principal surface of the P-type silicon substrate 201 by approximately 150 nm. On the base of the cavity 203, a NAND cell array region 252, including laminated gate electrode type and contact-less type nonvolatile memory cells, is formed.

A peripheral circuit region 251 is provided on the principal surface of the P-type silicon substrate 201, and a connecting portion region 253 for connecting between a peripheral circuit and a cell array or among cell arrays is provided in belt-shaped region including the principal surface of the P-type silicon substrate 201 adjacent to the cavity 203 and the end portion of the base of the cavity 203.

In an element region 241 in the peripheral circuit region 251, a MOS transistor forming the peripheral circuit is provided. As a feature of a NAND-type cell array, the element regions of the cell array region 252 and the connecting region 253 are connected to each other to form element regions 242.

In the element regions 242 in the cell array region 252 and the connecting region 253, select gate transistors including memory cells and a MOS transistor, respectively, are provided. The gate width of the element region 242 in the cell array region 252 is approximately 0.6 μm. In an element isolation region except for the regions 241 and 242, a field oxide film 205, which is a LOCOS type and has a film thickness of approximately 200 nm, is provided.

In the element region 242 in the cell array region 252, a gate oxide film 209, having a thickness of approximately 10 nm by thermal oxidation, is provided. The nonvolatile memory cell includes a gate oxide film 209, a floating gate electrode 212 laminated on the gate oxide film 209, a gate insulating film 210, a control gate electrode 213A$b$, which also serves as a word line, and an $N^+$-type diffusion layer 215 in which the element region 242 is provided in self-alignrnent manner on the control gate electrode 213A$b$ and the floating gate electrode 212. The depth of junction of the $N^+$-type diffusion layer 215 is approximately 150 nm.

The control gate electrodes 213A$b$, 213B$b$, 213C$b$, 213K$b$, 213L$b$, 213M$b$, 213N$b$, and 213X$b$ meet at right angles with the element region 242 in the cell array region 252, and are formed of an $N^+$-type polycrystalline silicon film having a gate length of approximately 0.4 μm and a film thickness of approximately 300 nm.

Further, the upper surface of these control gate electrodes 213A$b$, 213B$b$, 213C$b$, 213K$b$, 213L$b$, 213M$b$, 213N$b$, and 213X$b$ are covered with a silicon oxide film cap 237$a$ having a thickness of approximately 100 nm. The floating gate electrode 212, having an N-type polycrystalline silicon film having a thickness of approximately 150 nm, exists preferably only immediately below the control gate electrodes 213A$b$. The end portion of the floating gate electrode 212 is located at a position extended to the surface of the field oxide film 205.

The minimum spacing of the floating gate electrode 212 right below the same control gate electrode 213 is approximately 0.4 μm. The gate insulating film 210 has an ONO film having a thickness converted in a silicon oxide film of approximately 18 nm, and is provided preferably only between the control gate electrode 213 and the floating gate electrode 212.

In the element region 241 and in the element region 242 in the connecting region 253, a gate oxide film 211, having a thickness of approximately 20 nm by thermal oxidation, is provided. Further, the gate electrode 214Y and gate electrodes 214$aa$, 214$ab$ each having an $N^+$-type polycrystalline silicon film, having a thickness of approximately 300 nm, are provided.

Furthermore, in the element region 241, an $N^+$-type diffusion layer 215 is provided in a self-alignment manner in the gate electrode 214Y and the gate electrode 214(L), 214(N). In the element region 242 in the connecting region 253, an $N^+$-type diffusion layer 215 is provided in a self-alignment manner in the gate electrode 214$ba$, and an $N^+$-type diffusion layer 215 and a ground line 216 having an $N^+$-type diffusion layer are provided in a self-alignment manner on the gate electrode 214$bb$.

The upper surfaces of these gate electrodes 214$ba$, 214$bb$ and the gate electrode 214Y and the gate electrodes 214$aa$, 214$ab$ are covered with a silicon oxide film cap 237$bb$. The thickness of the silicon oxide film cap 237$bb$ covering the gate electrodes 214$ba$, 214$bb$, the gate electrode 214Y and the gate electrodes 214$aa$, 214$ab$ in the channel region is approximately 200 nm. The thickness of the silicon oxide film cap 237$bb$ covering the gate electrodes 214$ba$, 214$bb$, the gate electrode 214Y and the gate electrodes 214$aa$, 214$ab$ is approximately 100 nm.

A semiconductor element forming the peripheral circuit connected to a bit line includes an N-channel MOS transistor including a pair of $N^+$-type diffusion layers 215, which become source and drain regions, a gate oxide film 211 and the gate electrode 214Y. A select gate transistor, connected to a bit line provided in the connecting portion region 253, includes a pair of $N^+$-type diffusion layers 215, which become source and drain regions, the gate oxide film 211 and the gate electrode 214$aa$.

A select gate transistor, connected to a ground line provided in the connecting region 253, includes the ground line 216, which is an $N^+$-type diffusion layer forming one of source and drain regions, an $N^+$-diffusion layer 215, which is the other of the source and drain regions, the gate oxide film 211 and the gate electrode 214$ab$.

A peripheral circuit connected to the control gate electrodes 213L$b$, 213N$b$ is provided in a first side of the peripheral region 251, and a peripheral circuit connected to the control gate electrode 213M$b$ is provided in a second side of the peripheral region 251.

A semiconductor element, constituting the peripheral circuit connected to the control gate electrode 213L$b$, comprises an N-channel type MOS transistor having a pair of $N^+$-type diffusion layer 215, the gate oxide film 211 and the gate electrode 214(L).

The P-type silicon substrate 201 is covered with an interlayer insulating film 218 having a thickness of approximately 600 nm. In the interlayer insulating film 218, a contact hole 219(L), 219(N) reaching the $N^+$-type diffusion layer 215 provided in the peripheral circuit region 251, and a contact hole 219 reaching the $N^+$-type diffusion layer 215 provided in the connecting region 253, which is not connected directly to the memory cell region 252 between two gate electrodes 214$ba$ in the select gate transistor connected to a bit line, are formed. These contact holes 219 and 219(L), 219(N) are filled with contact plugs 220, respectively.

On the surface of the interlayer insulating film 218 are provided a wiring 221 and a bit line 221A, 221Y formed of a metal film. The wiring 221 is connected to an N-channel MOS transistor forming the peripheral circuit through one contact hole 219Y. These N-channel MOS transistors are connected to the bit line 221Y through the contact hole 219. The control gate electrode 213L, for example, is connected to an N-channel MOS transistor, having a gate electrode 214(L), forming a peripheral circuit through the contact hole 219, the wiring 221 and the contact hole 219(L).

In the fourth embodiment, the difference between the height of the top of the control gate electrode 213A*b* and that of the gate electrode 214*ba*, 214Y, 214(L) is reduced (or prevented) by providing the cavity 203, and the silicon oxide film cap 237*ba* and the silicon oxide film cap 237*bb* are mounted on the upper surface of these gate electrodes. As a result, irregularity of the surface of the interlayer insulating film 218 is reduced (or prevented).

Referring now to the drawings, and more particularly to FIGS. 17(*a*)–(*c*), a method for fabricating the single-chip contact-less flash memory device is described below. FIGS. 17(*a*)–(*c*) show steps at a portion A—A shown in FIG. 16(*a*).

First, a first silicon nitride film (not shown) is formed on a cell array region of the principal surface of the P-type silicon substrate 201 through a pad oxide film 230. A first field oxide film 202, having a thickness of approximately 300 nm, is formed by selective oxidation with the first silicon nitride film (not shown) as a mask.

Next, after the first silicon nitride film is removed, the field oxide film and the pad oxide film are removed, and the cavity 203 is formed. After a second pad oxide film 231, having a thickness of approximately 40 nm, is formed on the entire surface, a second silicon nitride film (not shown) is formed on the element regions 241 and 242.

A second field oxide film 205, having a thickness of approximately 200 nm, is formed by selective oxidation with the second silicon nitride film as a mask. After the second silicon nitride film and the second pad oxide film 231 are removed, a first gate oxide film 209, having a thickness of approximately 10 nm, is formed at least in the element region 242 on the base of the cavity 203.

An N$^-$-type first polycrystalline silicon film (not shown) is formed on the entire surface. This polycrystalline silicon film is patterned, and a first S-shaped polycrystalline silicon film pattern (not shown), covering the gate oxide film 209 and covering the field oxide film 205 with a predetermined width, is left. The first polycrystalline silicon film pattern remains only on the base of the cavity 203, and the spacing of the first polycrystalline silicon film pattern is approximately 0.4 $\mu$m.

A silicon oxide film (not shown) is formed selectively on the surface of the first polycrystalline silicon film pattern 234 by thermal oxidation, and further a third silicon nitride film (not shown) is formed on the entire surface. This silicon nitride film is patterned, and the silicon nitride film is left almost only on the surface of the first polycrystalline silicon film pattern.

Then, thermal oxidation is performed again, a gate insulating film 210 (e.g., an ONO film) is formed on the surface of the first polycrystalline silicon film pattern, and a (second) gate oxide film 211, having a thickness of approximately 20 nm, is formed in the element region 241 surrounded by a field oxide film 207 and in the element region 242 of the connecting region 253.

Next, an N$^+$-type polycrystalline silicon film 235, which is a second polycrystalline silicon film, having a thickness of, for example, approximately 300 nm, is formed on the entire surface. In the fourth embodiment, a polycide film can be used instead of the polycrystalline silicon film 235.

Further, a silicon oxide film, having a thickness of approximately 300 nm, is deposited on the entire surface, and the upper surface of this silicon oxide film is flattened by CMP. As a result, a silicon oxide film 237 is formed. The thickness of this silicon oxide film 237 is approximately 100 nm in a first portion and it is 200 nm in a second portion (FIG. 17(*a*)).

Patterning is sequentially applied to the silicon oxide 237 covering the base of the cavity 203, the polycrystalline silicon film, the gate insulating film 210 and the first polycrystalline silicon film pattern sequentially with a photo-resist film pattern 262 covering the connecting region 253 for connecting among the cell array regions 252, the connecting region 253 connecting a bit line to the peripheral circuit and the peripheral circuit region 252 and covering a control gate electrode formation prearranged region as a mask.

As a result, the silicon oxide film cap 237*ba*, the control gate electrodes 213A*b*, 213B*b*, 213C*b*, 213K*b*, 213L*b*, 213M*b*, 213N*b*, 213X*b*, the upper surface of which is covered with the cap 237*ba* and the floating gate electrode 212 are formed, and the silicon oxide film 237*b* and the second polycrystalline silicon film pattern 235*b* are left (FIG. 17(*b*)).

Thereafter, patterning is sequentially applied to the silicon oxide film 237*b* and the polycrystalline silicon film pattern 235 by using a photo-resist film pattern 263 covering at least the cell array region 252 and the connecting region 253 for connecting the control gate electrode 213L*b* to the peripheral circuit as a mask, a gate electrode 214*ba*, 213*bb*, a gate electrode 214Y and a gate electrode 214(L), 214(N), the upper surface of all of which are covered with the silicon oxide film cap 237*bb*, are formed (FIG. 17(*c*)).

Then, ion implantation of arsenic is performed at 70 keV and at approximately $5 \times 10^{15}$ cm$^{-2}$ by using the control gate electrode 213A*b* including the silicon oxide film cap 237*ba*, 237*bb*, and the floating gate electrode 212, the gate electrode 214Y, the gate electrode 214(L), 214(N), the gate electrode 214*ba*, 214*bb* and the oxide film 206 as a mask. After that, heat treatment is performed. Through these processing steps, an N$^+$-type diffusion layer 215 and a ground line 216 are formed.

Next, a silicon oxide film (HTO film) (not shown), having a thickness of approximately 100 nm, and a BPSG film (not shown), having a thickness of approximately 500 nm, are deposited consecutively, and are reflowed by thermal processing. As a result, an interlayer insulating film 218 is formed on the entire surface.

Then, a contact hole 219(L), 219(N) reaching an N$^+$-type diffusion layer 215 of an N-channel transistor forming the peripheral circuit, and a contact hole 219, reaching the semiconductor elements as the N$^+$ type diffusion layer 215 forming the source and drain regions of the select gate transistor and the ground line 216 or the control gate electrode 213L*b*, 213N*b* extended over the connecting region 253, are formed. The depth of the contact hole 219(L), 219(N) and the depth of the contact hole 219 are almost the same.

A titanium film (not shown), a titanium nitride film (not shown) and a tungsten film (not shown) are formed on the entire surface consecutively (sequentially). These laminated conductor films are etched back, thereby to form contact plugs 220 filling the contact holes 219 and 219(L), 219(N), respectively.

An aluminum alloy film is formed on the entire surface, which is applied with patterning, thereby to form a wiring 221 and a bit line 221A, 221Y. Since irregularity of the surface of the interlayer insulating film 218 is also reduced greatly, the patterning of the wiring 221 and the bit line 221A, 221Y is performed easily and without hindrance.

The manufacturing method in the fourth embodiment has the same advantage as that of the third embodiment. Furthermore, the method of forming the control gate electrode in the fourth embodiment has the same advantage as that of forming the diffusion layer such as the sub-bit line, and sub-ground line in the second embodiment. If flash memory development becomes more highly dense in the future, the superiority of the manufacturing method of the fourth embodiment will become even more apparent. Moreover, the method of the fourth embodiment is not limited to the flash memory manufacturing method, as in the case of forming a diffusion layer such as the sub-bit line and sub-ground line.

An N-channel MOS transistor has been shown as a semiconductor element forming a peripheral circuit in the fourth embodiment. However, it is not limited thereto, and the peripheral circuit may be formed by a CMOS transistor. Furthermore, the above-mentioned thicknesses, widths, and intervals are not limited to the above-mentioned numerical values.

Fifth Embodiment

Figure 18:
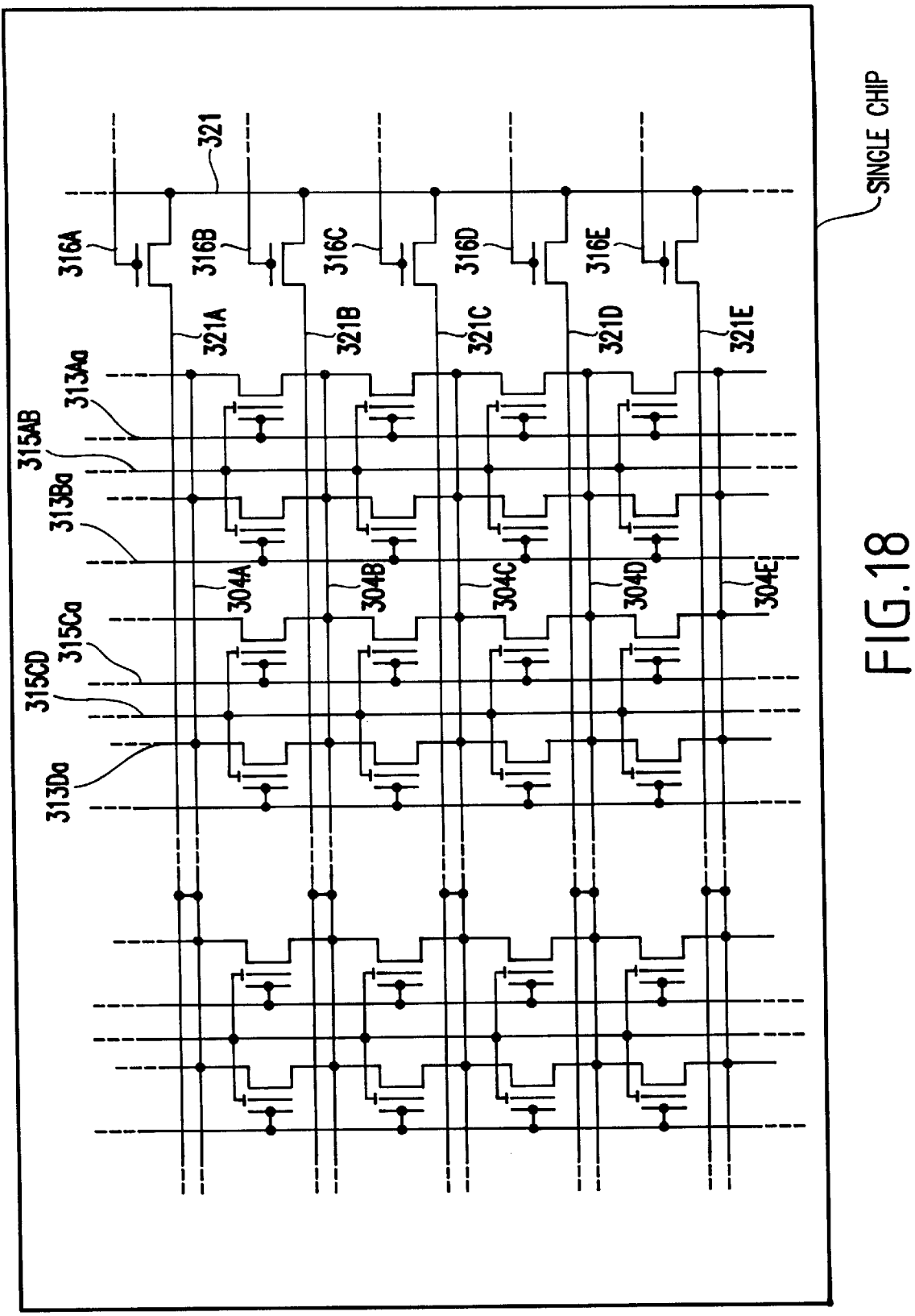
FIG. 18 illustrates a circuit diagram of a virtual ground array (VGA)-type single-chip contact-less flash memory.
Figure 19:
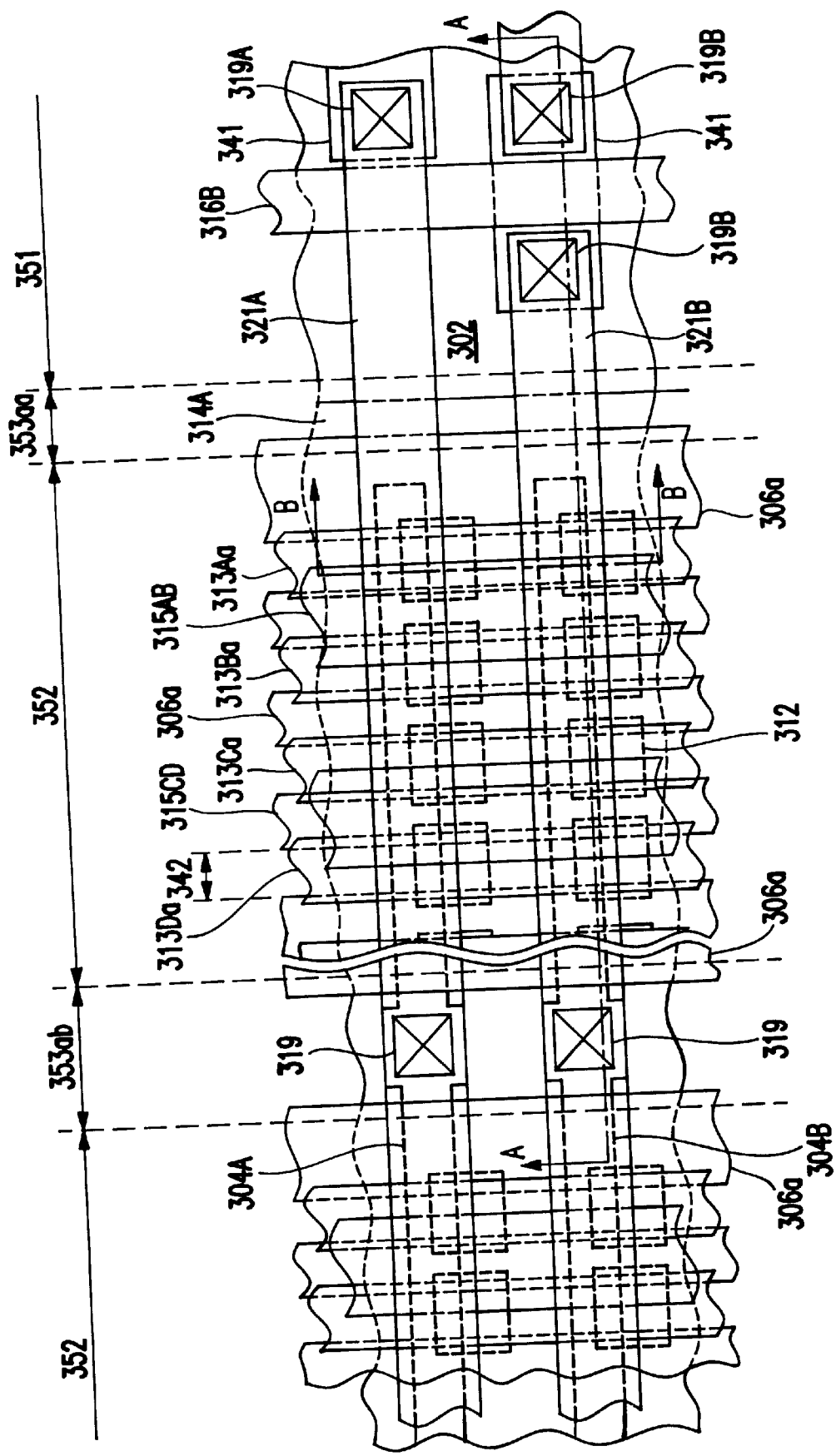
FIG. 19 shows a plan view of the VGA-type flash memory shown in FIG. 18.

Referring now to the drawings, and more particularly to FIGS. 18–20, a single-chip contact-less flash memory device is shown according to a fifth embodiment of the present invention.

Figure 20A:
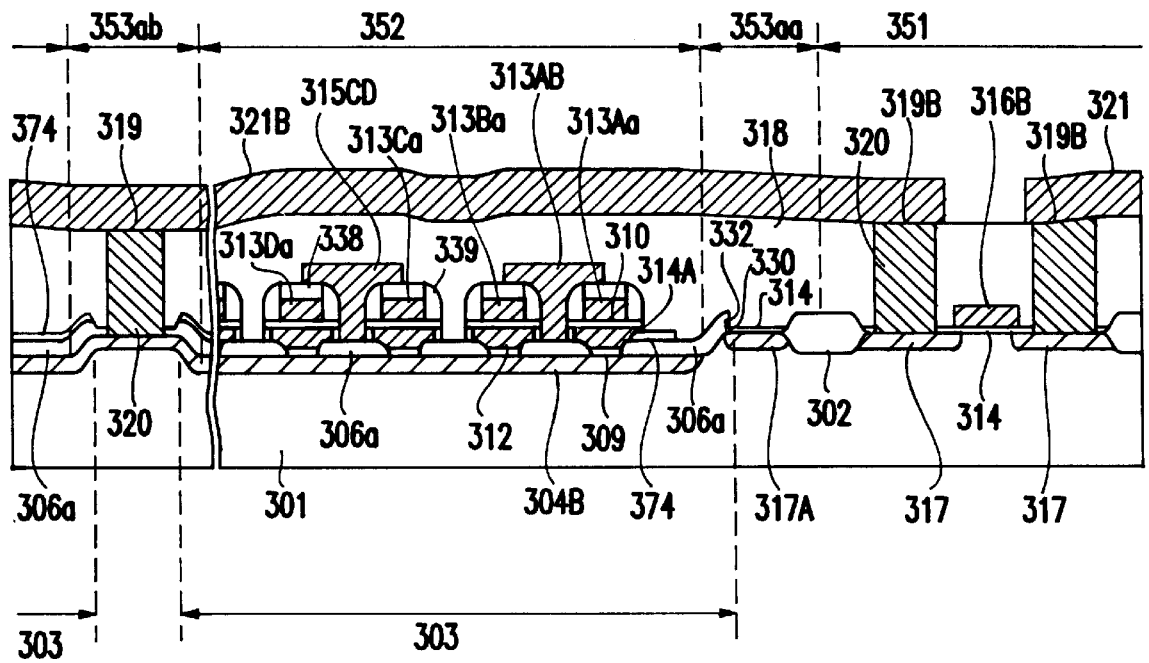
FIGS. 20(a)–(b) respectively show sectional views of the VGA-type flash memory shown in FIG. 19 taken along lines A—A and B—B.
Figure 20B:
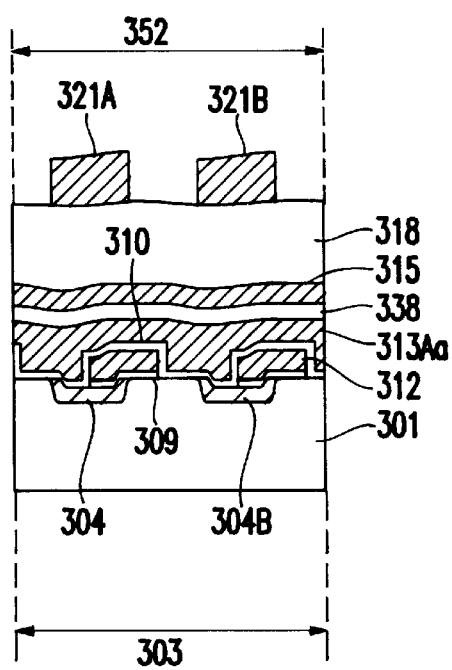
Figure 21A:
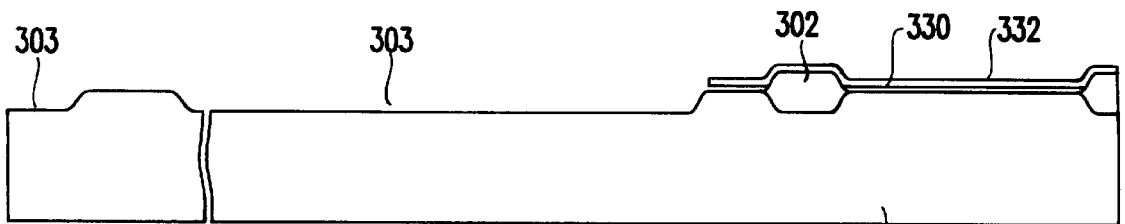
FIGS. 21(a)–(e), 22(a)–(d) and 23(a)–(b) respectively show sectional views of the VGA-type flash memory shown in FIG. 19 taken along line A—A.
Figure 21B:
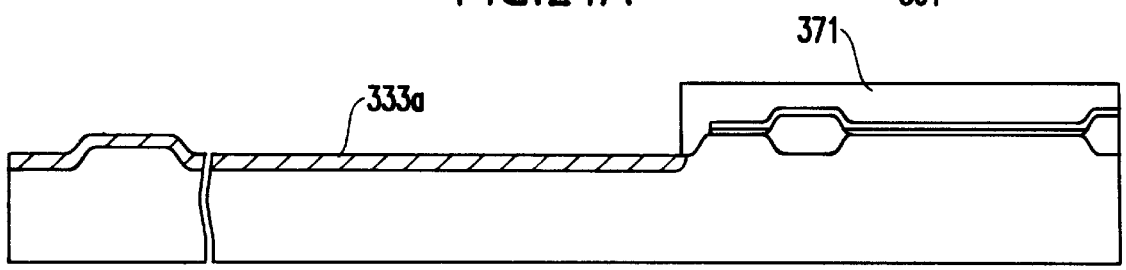
Figure 21C:
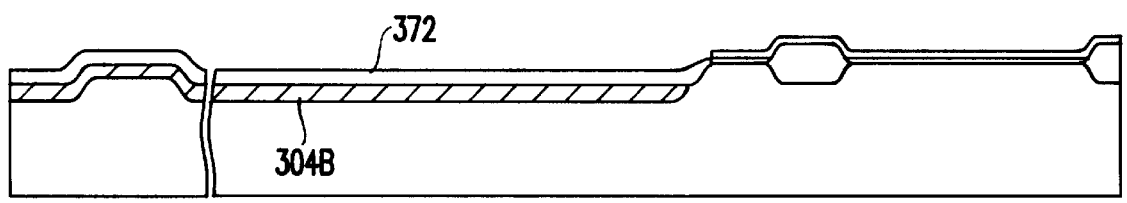
Figure 21D:
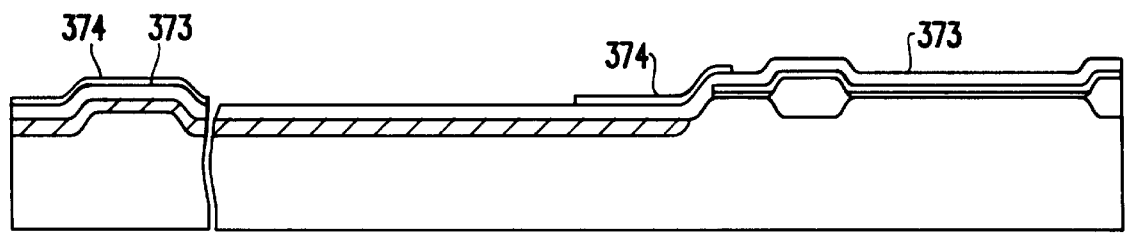
Figure 21E:
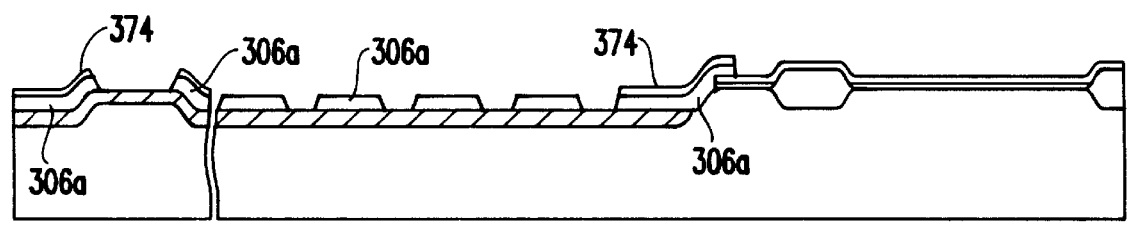

FIG. 18 shows a circuit diagram of a virtual ground array (VGA)-type flash memory, FIG. 19 shows a plan view of the VGA-type flash memory shown in FIG. 18, and FIGS. 20(a)–(b) respectively show sectional views of the VGA-type flash memory shown in FIG. 19 taken along lines A—A and B—B.

A VGA-type cell array region having nonvolatile memory cells of three-layer lamination gate-type, contactless-type and split gate-type are provided on the base of a cavity formed by removing a LOCOS-type field oxide film. Furthermore, each of the nonvolatile memory cells is provided with an erase gate electrode corresponding to a pair of control gate electrodes. In the three-layer gate structure, the difference in height between the top surface of a channel region and that of the erase gate electrode in a nonvolatile memory cell is greater than that in the flash memories in the above-described first to fourth embodiments. Therefore, in the fifth embodiment, in order to relatively reduce the height difference, the depth of a cavity provided on the principal surface of a semiconductor substrate is required to be deeper than that for the above-described first to fourth embodiments.

A flash memory of the fifth embodiment is formed in accordance with a design rule of 0.36 $\mu$m as described hereinunder.

In a region of the principal surface of a P-type silicon substrate 301, a cavity having an almost (e.g., substantially) inverted trapezoidal shape and a flat base is provided. The cavity is formed by removing a LOCOS-type field oxide film having a thickness of approximately 600 nm. The base of the cavity 303 is located at a position lower than the principal surface of the P-type silicon substrate 301 by approximately 300 nm. At the base of the cavity 303, cell array regions 352 are provided respectively.

Between the two cell array regions 352, a belt-shaped second connecting portion region 353ab including the principal surface of the P-type silicon substrate 301, and the inclined face forming the peripheral portions of respective cavities 303, are formed. In a peripheral circuit region 351 provided on the principal surface of the P-type silicon substrate 301, semiconductor elements such as an N-channel MOS transistor forming a peripheral circuit are formed. Between the peripheral circuit region 351 and the cell array region 352, a first connecting portion region 353aa is formed.

The connecting portion region 353aa also includes the inclined face forming the peripheral portion of the cavity 303. Further, the boundary between the connecting portion region 353aa and the peripheral circuit region 351 is formed of a field oxide film 302. Between the above-described inclined face of the connecting portion region 353aa and the field oxide film 302, an element region 341A is provided. However, for the reason described later, the element region 341 is not provided with semiconductor elements.

In the cell array region 352 immediately below a bit line, $N^+$-type buried diffusion layers 304A, 304B, 304C, 304D, and 304E are formed. These $N^+$-type buried diffusion layers 304A are also provided in the connecting region 353ab and reach the adjacent cell array region 352. The $N^+$-type diffusion layers 304A are connected to bit lines, respectively, in the connecting region 353ab, as a ground line, which is a source, or a bit line, which is a drain, for the respective nonvolatile memory cells.

The depth of the junction of the $N^+$-type buried diffusion layer 304A is approximately 0.2 $\mu$m, and the surface of the $N^+$-type buried diffusion layer 304A is located at a position lower than the base of the cavity 303 by approximately 30 nm.

The wiring pitch of the $N^+$-type buried diffusion layer 304A is approximately 1.14 $\mu$m, the width and spacing of the $N^+$-type buried diffusion layer 304A in the cell array region 352 are approximately 0.36 $\mu$m, 0.78 $\mu$m, respectively and the largest width of the $N^+$-type buried diffusion layer 304A in the cell array region 352ab is approximately 0.78 $\mu$m due to a contact hole being provided.

Nonvolatile memory cells are formed in the element region 342 provided in the cell array region 352. The element region 342, which has a "lazy S-shape", is provided in the direction perpendicular to the $N^+$-type buried diffusion layer 304A, and the pitch, width and spacing of the element region 342 are approximately 0.30 $\mu$m, approximately 0.48 $\mu$m and approximately 0.78 $\mu$m, respectively.

The end portion of the element region 342 is provided in a cell array region located at predetermined intervals from the connecting region 353aa belonging to the peripheral circuit region 351 wherein peripheral circuits relating to a control gate electrode and an erase gate electrode are provided. The minimum spacing between the connecting region 353aa belonging to the peripheral circuit region 351 provided with peripheral circuits relating to bit lines, and the element region 342, and the minimum spacing between the connecting region 353ab and the element region 342 are at least approximately 0.4 $\mu$m.

The element region 342 is determined by a field insulating film 306a formed by an HTO film having a thickness of approximately 300 nm. The height of the upper surface of the field insulating film 306a in the cell array region 352 is almost the same as that of the principal surface of the P-type silicon substrate 301. In those portions provided with nonvolatile memory cells, except for a nonvolatile memory cell closest to the connecting regions 355aa and 355ab, the field insulating film 306a has only of a silicon oxide film and has a trapezoidal cross-section and a lazy S-shape (e.g., belt-shape).

In those portions, the width, spacing and pitch of the upper surface of the field insulating film 306a are approximately 0.42 $\mu$m, approximately 0.36 $\mu$m and approximately 0.78 $\mu$m, respectively. Further, those of the base of the field insulating film 306a are approximately 0.30 $\mu$m, approximately 0.48 $\mu$m and approximately 0.78 $\mu$m, respectively.

The field insulating film 306a having such configuration has a unitary structure in the cell array region 352 adjacent to the connecting region 353aa and the connecting region 353ab. Namely, one cell array region 352 is provided with one field insulating film 306a. The field insulating film 306a extends to the connecting regions 353aa, 353ab, respectively. That is, the field insulating film 306a crosses the inclined face forming the peripheral portion of the cavity 303 and, further, reaches the top of the principal surface of the P-type silicon substrate 301 belonging to the connecting regions 353aa, 353ab.

In the connecting region 353aa, in particular, the field insulating film 306a reaches the top of the principal surface of the P-type silicon substrate 301 through a pad oxide film 330 having a thickness of approximately 40 nm and through a second silicon nitride film 332 having a thickness of approximately 50 nm. The spacing between the two field insulating film 306a belonging to adjacent cell array regions 352 in the connecting region 353ab is at least 0.6 µm.

In the element region 342, a split gate-type floating gate electrode 312 is formed through a first gate oxide film 309. The floating gate electrode is formed of an N-type polycrystalline silicon film. The length and spacing of the floating gate electrode 312 along the field insulating film are approximately 0.6 µm and approximately 0.54 µm, respectively. The floating gate electrode 312 overlaps with, for example, the $N^+$ type buried diffusion layer 304B by approximately 0.18 µm in length, extends over the base of the cavity 303 by approximately 0.42 µm and the spacing between the floating gate electrode 312 and the $N^+$-type buried diffusion layer 304A is approximately 0.32 µm.

The film thickness of the gate oxide film 309 provided on the surface of the $N^+$-type buried diffusion layer 304B is approximately 40 nm and the film thickness of the gate oxide film 309 provided on the surface of the base of the cavity 303 is approximately 20 nm. For the nonvolatile memory cell to which belongs the floating gate electrode 312 overlapping with the $N^+$-type buried diffusion layer 304B, this $N^+$-type buried diffusion layer 304B serves as a drain and the $N^+$ type buried diffusion layer 304A serves as a source.

On the upper surface of the floating gate electrode 312, the side surface of the floating gate electrode 312 between two insulating films 306a and the element region 342, which is the $N^+$ type buried diffusion layers 304A and the base of the cavity 303, and which is not covered with the floating gate electrode 312 and the field insulating film, second gate oxide films 310 are provided, respectively.

Film thicknesses of the gate oxide films 310 on the side surface and upper surface of the floating gate electrode, the surface of the $N^+$-type buried diffusion layer 304A and the base of the cavity 303 are approximately 30 nm, approximately 40 nm and approximately 20 nm, respectively. The width and spacing of the floating gate electrode 312 in the direction parallel to the $N^+$-type buried diffusion layer 304A are approximately 0.52 µm and approximately 0.26 µm, respectively.

In this direction, the floating gate electrode 312 covers the upper surface of the field insulating film 306a with an approximately 0.08 µm width. The upper surface of the floating gate electrode 312 is located at a position higher than the upper surface of the field insulating film 306a by approximately 100 nm. The side surface of the floating gate electrode 312 reaching the upper surface of the field oxide film 306a is provided with a third gate oxide film 314A having a film thickness of approximately 40 nm.

On the upper surface of the field insulating film 306a in the portion between the connecting region 353aa associated with the peripheral circuit region 351 provided with peripheral circuits relating to bit lines and the element region 342 closest to the region 351, a portion from the end portion of element region 342 to the vicinity of the end portion of the base of the cavity 303, which is the end portion of the cell array region 352, is covered with a third silicon nitride film 374 having a thickness of approximately 50 nm.

Therefore, the upper surface of the field insulating film 306a in the connecting region 353aa or the connecting region 353ab of the element region 342 is covered with the floating gate electrode 312 through the silicon nitride film 374. A floating gate electrode (not shown) provided closest to the connecting region 353aa associated with the peripheral circuit region 351 relating to the control gate electrode or the erase gate electrode, is a dummy floating gate electrode and end portions of the element region 343 end right under the dummy floating gate electrode. The upper surfaces of the field insulating films 306a in these portions from the vicinity of the terminal ends of the element regions 342 to the end portion of the base of the cavity, which is the end portion of the cell array region 352, are also covered with a silicon nitride film 374. Therefore, at least on the connecting region 353aa side in the above-described floating gate electrode, the upper surface of the field insulating film 306a is covered by the silicon nitride film 374.

The control gate electrodes 313Aa, 313Ba, 313Ca, and 313Da provided along the element region 342 cover the floating gate electrodes, dummy floating gate electrodes, and bases of the $N^+$-type buried diffusion layers 304A through the gate oxide films 310, respectively. These control gate electrodes 313Aa are made of an $N^+$ type polycrystalline silicon film, film thicknesses of the control gate electrodes 313Aa on the floating gate electrodes 312 are approximately 250 nm, and end portions of these control gate electrodes 313Aa end on the field insulating films 306a covered with the silicon nitride film 374.

The width, spacing and pitch of the control gate electrodes 313Aa are approximately 0.42 µm, approximately 0.36 µm and approximately 0.78 µm, respectively, and the overlapping length of the control gate electrodes 313a and the like with the upper surface of the filed oxide film 306a is approximately 0.03 µm. Upper surfaces of these control gate electrodes 313Aa are covered with silicon oxide film caps 338 having a thickness of approximately 200 nm, respectively and side surfaces of these control gate electrodes 313Aa and the silicon oxide film caps 338 are covered with silicon oxide film spacers 339 having a width of approximately 50 nm, respectively.

The side surface of the floating gate electrode 312 at a portion on the upper surface of the field insulating film 306a is provided on the silicon oxide film spacer 339 in a self-aligned manner.

For example, the control gate electrodes 313Aa and 313Ba jointly have an erase gate electrode 315AB, and the control gate electrodes 313Ca and 313Da jointly have an erase gate electrode 315CD. The erase gate electrode 315AB, for example, covers upper and side surfaces of the control gate electrodes 313Aa, 313Ba through the silicon oxide film cap 338 and the silicon oxide film spacer 339, covers the side surface of the floating gate electrode 312 of a portion extending on the upper surface of the field insulating film 306a through the gate oxide film 310, and reaches directly the upper surface of the insulating film 306a in the void portion covering the side surface of the floating gate electrode 312 and between the floating gate electrodes 312.

These erase gate electrodes 315AB are made of, for example, an $N^+$-type polycrystalline silicon film, and the thickness of the erase gate electrode 315AB on the portion covering the upper surface of the control gate electrode 313Aa through the silicon oxide film cap 338 is approximately 300 nm. End portions of these erase gate electrodes 315AB, 315CD end on the field insulating films 306a covered with silicon nitride films 374, as in the case of end portions of the control gate electrodes 313A*a*.

The width, spacing and pitch of the erase gate electrodes 315AB are approximately 0.84 μm; approximately 0.72 μm and approximately 1.56 μm, respectively, and the overlap width of, for example, the erase gate electrode 315AB with the control gate electrode 313A*a* is approximately 0.24 μm.

On the principal surface of the P-type silicon substrate 301 forming the element region 341A in the connecting region 353*aa*, an N⁺-type diffusion layer 317A is provided on the field oxide film 302 and the field insulating film 306*a* in a self-aligned manner.

On the surface of the N⁺-type diffusion layer 317A, a third gate insulating film 314 is provided. The junction depth of the N⁺-type diffusion layer 317A is approximately 0.15 μm. This N⁺-type diffusion layer 317A is naturally formed by the manufacturing method, and does not function as a semiconductor device. As described above, the control gate electrode 313A*a* and the erase gate electrode 315AB have their end portions within the cell array region 352, respectively because the N⁺-type diffusion layer 317A exists.

In the element region 341 in the peripheral circuit region 351, there are provided semiconductor elements such as N-channel MOS transistors. Each of the N-channel MOS transistors includes the gate electrodes 316A, 316B, 316C, 316D, and 316E, the third gate oxide film 314 and a pair of N⁺ type diffusion layers 317. The thickness of the gate oxide film 314 is approximately 30 nm, the depth of junction of the N⁺-type diffusion layer 317 provided in a self-aligned manner to the field oxide film 302 and the gate electrodes 316A is approximately 0.15 μm, and the gate electrodes 316A are formed of N⁺-polycrystalline silicon films having a thickness of, for example, approximately 300 nm, respectively.

The P-type silicon substrate 301 is covered with an interlayer insulating film 318 provided by a lamination of, for example, an HTO film and a BPSG film or TEOS series and a silicon oxide film. The height of the upper surface of the interlayer insulating film 318 from the principal surface of the P-type silicon substrate 301 is at least 0.8 μm. This interlayer insulating film 318 is provided with contact holes 319B reaching the N⁺-type diffusion layers 317 having N channel MOS transistors including, for example, the gate electrode 316B. The diameter of the contact hole 319B is approximately 0.6 μm.

The contact holes 319, 319B are filled with contact plugs 320, respectively, and bit lines 321A, 321B, 321C, 321D, and 321E are provided on the surface of the interlayer insulating film 318. The bit line 321B, for example, is connected to the N-channel MOS transistor forming the peripheral circuit through the contact hole 319B, and is connected to the N⁺-type buried diffusion layer 304B through the contact hole 319.

In the fifth embodiment, as in the first to fourth embodiments, irregularity of the surface of the interlayer insulating film is reduced (or prevented). Therefore, lowering electrical connection characteristics relating to the contact holes and lowering operability of wirings provided on the surface of the interlayer insulating film can be controlled easily and simultaneously.

The circuit operation of the VGA-type flash memory in the fifth embodiment is described below. In this flash memory, injecting charges (e.g., electrons) into a floating gate by channel hot electrons is defined as a writing operation, and drawing charges out of a floating gate electrode to an erase gate electrode by F-N tunneling is defined as an erasing operation.

The writing operation is conducted as follows. The P-type silicon substrate 301 is applied with 0 V and all of the erase gate electrodes 315AB, 315CD and the like are applied with 0 V. The N⁺-type buried diffusion layer 304 and the bit line 321B, for example, selected as a drain is applied with 7 V. The N⁺-type buried diffusion layer 304A and the bit line 321A selected as a source is applied with 0 V and non-selected N⁺-type buried diffusion layers 304C, 304D, 304E and the bit lines 321C, 321D, 321E are opened.

The selected control gate electrode 313A*a*, for example, is applied with 12 V, and other control gate electrodes 313B*a*, 313C*a*, and 313D*a* are applied with 0 V. As a result, in a nonvolatile memory cell in row A and column B, for example, channel hot electrons are injected into the floating gate electrode 312 from the N⁺-type buried diffusion layer 304A, which is a source. At this time, the threshold voltage $V_{TM}$ of this nonvolatile memory cell is approximately 7 V.

An erasing operation is conducted as follows. The P-type silicon substrate 301, all of the N⁺-type buried diffusion layers 304A, 304B, 304C, 304D, and 304E, the bit lines 321A, 321B, 321C, 321D, and 321E and all of the control gate electrodes 313A*a*, 313B*a*, 313C*a*, and 313D*a* are applied with 0 V. All of the erase gate electrodes 315AB, 315CD are applied with 15 V. As a result, charges (e.g., electrons) are drawn out of the all of the erase gate electrodes 312 to the floating gate electrode 315AB, the erase gate electrode 315CD by F-N tunneling. At this time, the threshold voltage $V_{TM}$ of the nonvolatile memory cell is approximately 1 V.

Referring now to the drawings, and more particularly to FIGS. 21–25, a method of manufacturing a single-chip contact-less flash memory device is shown according to the fifth embodiment of the present invention.

Figure 22A:
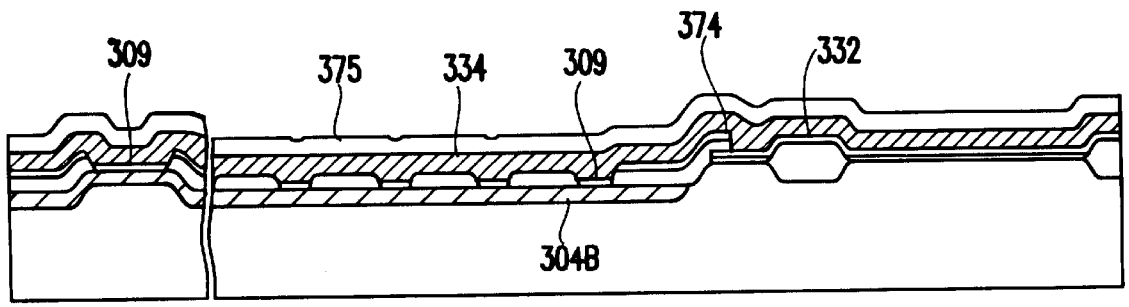
Figure 22B:
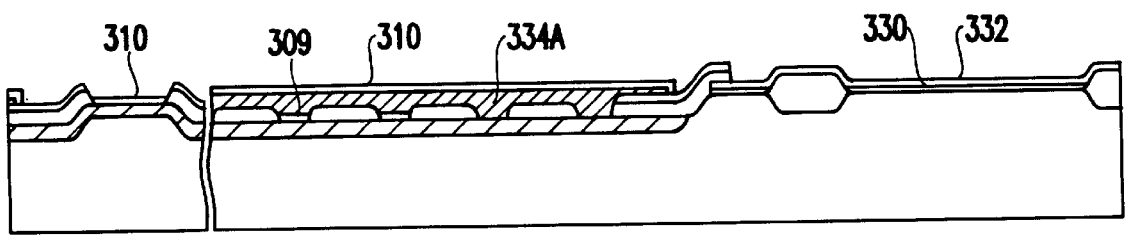
Figure 22C:
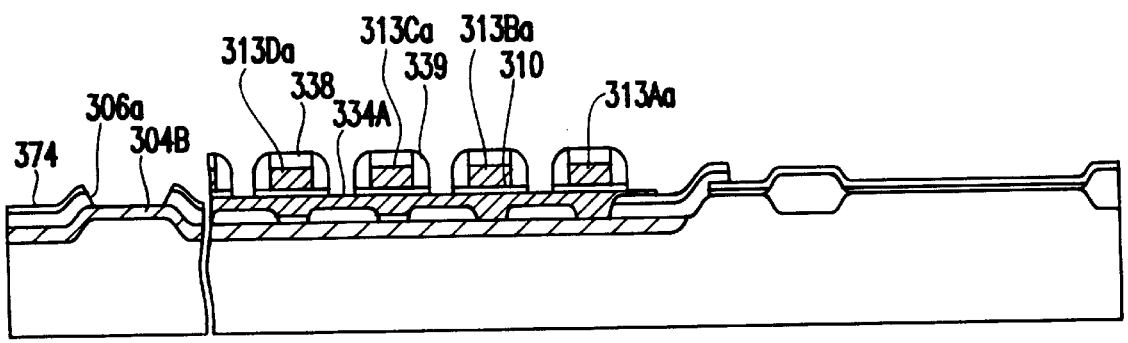
Figure 22D:
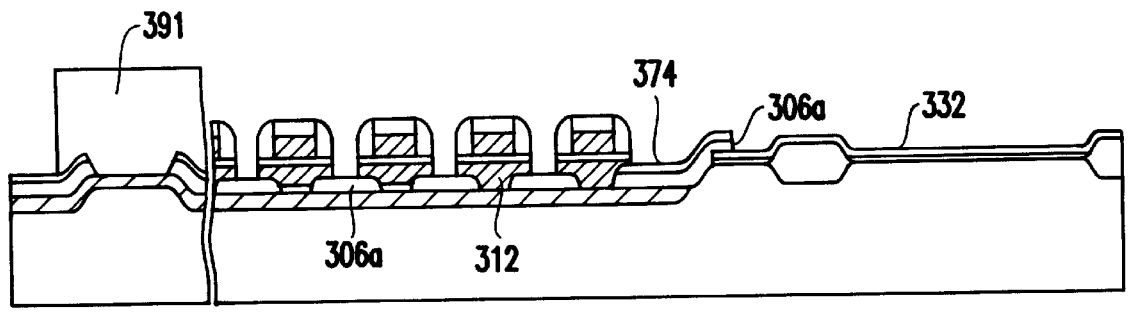
Figure 23A:
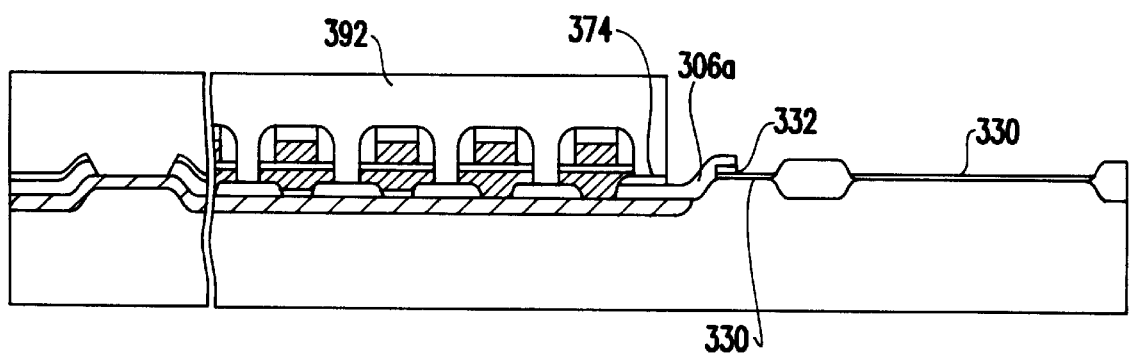
Figure 23B:
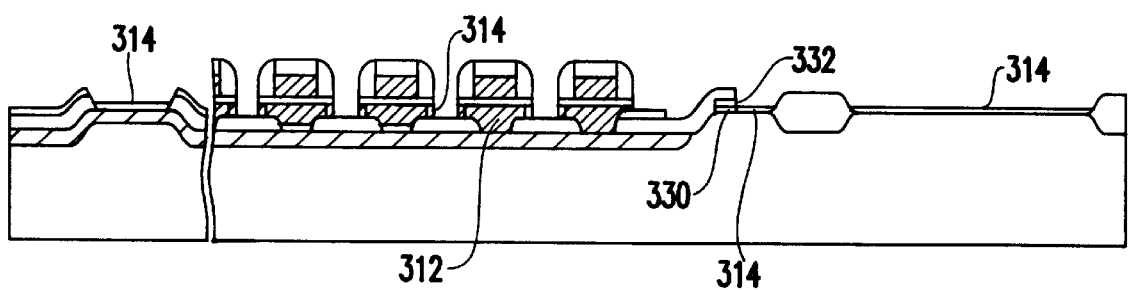
Figure 24A:
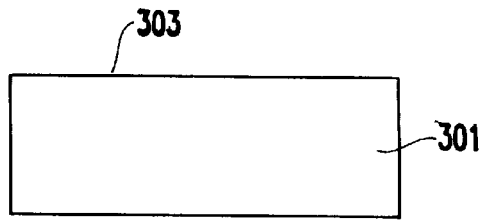
FIGS. 24(a)–(i)–25(a)–(b) respectively show sectional views of the VGA-type flash memory shown in FIG. 19 taken along line B—B.
Figure 24B:
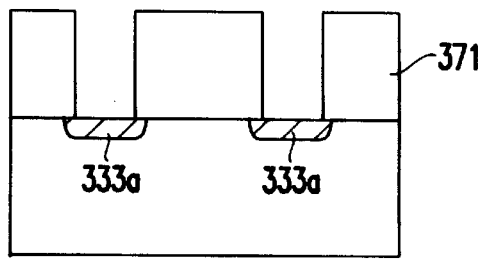
Figure 24C:
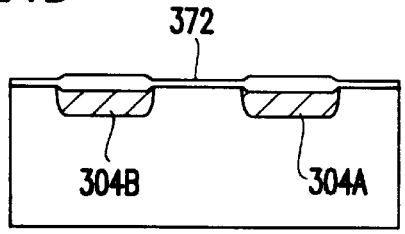
Figure 24D:
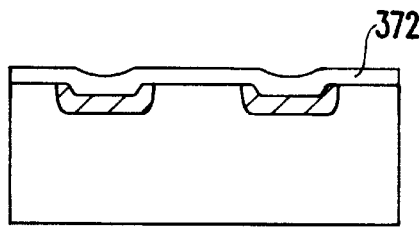
Figure 24E:
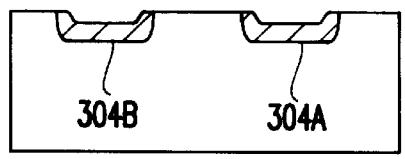
Figure 24F:
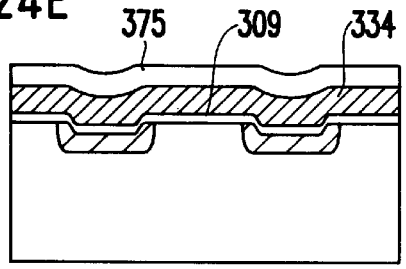
Figure 24G:
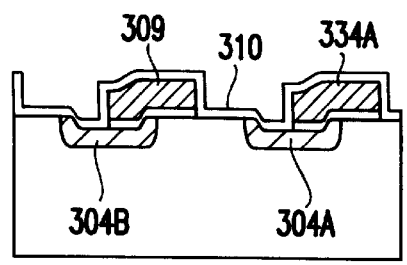
Figure 24H:
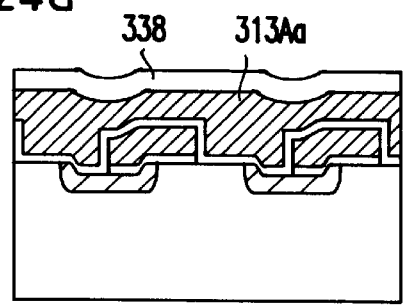
Figure 24I:
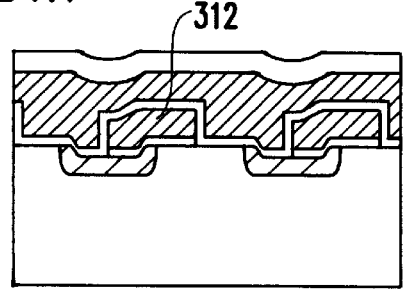
Figure 25A:
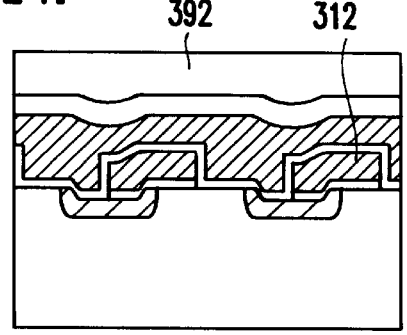
Figure 25B:
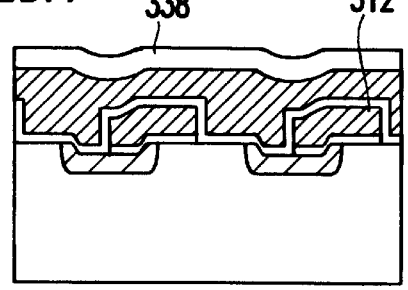

FIGS. 21–23 respectively show sectional views of the VGA-type flash memory shown in FIG. 19 taken along line A—A, and FIGS. 24–25 respectively show sectional views of the VGA-type flash memory shown in FIG. 19 taken along line B—B.

First, a pad oxide film 330 having a thickness of approximately 40 nm and a first silicon nitride (not shown) are formed on the principal surface of a P-type silicon substrate. The first silicon nitride film is applied with patterning, a LOCOS-type field oxide film 302 having a thickness of approximately 600 nm is formed in an element isolation region in a peripheral circuit region including a boundary between a cell array region and a first connecting region. As a result, a peripheral circuit region 351 having an element region 341 is formed.

After the first silicon nitride film is removed, a second silicon nitride film 332 with a thickness of approximately 50 nm having an opening in the cell array region and a second connecting portion region and covering the peripheral circuit region 351 is formed. As a result, the first connecting region is formed. By using this silicon nitride film 332 as a mask, the field oxide film 302 and the pad oxide film 330 are etched away.

Then, a cavity 303 having an inverted trapezoidal shape, a cell array region 352 composed of the flat base of the cavity 303, a first connecting portion region 353*aa* having an element region 341A, and a second connecting portion region 353*ab* are determined. This silicon nitride film 332 covers the element regions 341, 341A. The base of the cavity 303 is located at a position lower than the principal circuit 303 of the P-type silicon substrate 301 by approximately 300 nm (FIG. 21(*a*) and FIG. 24(*a*)).

Next, by using the same method as the method of forming an diffusion layer in the second embodiment, a first oxide silicon film (not show) is formed on the entire surface. The upper surface of the first silicon oxide film is flattened by CMP, and, patterning is applied to provide an opening in an N+-type buried diffusion layer region, and a silicon oxide film 371 is formed. The patterning is conducted by using etching gas made by diluting trifluoromethan ($CHF_3$) of approximately 20 sccm and carbon monoxide (CO) of approximately 5 sccm with argon (Ar) of approximately 400 sccm.

The patterning is preferably anisotropic etching at a substrate temperature of approximately 90° C., at a pressure of approximately 40 Pa and at an RF power of approximately 500 W, and the side surface of the patterned silicon oxide film 371 is almost straight. Then, by using the silicon oxide film 371 as a mask, ion implantation of arsenic (As) is performed at 50 keV and at approximately $5 \times 10^{15}$ $cm^{-2}$. As a result, an N-type ion implanted layer 333a is formed in the region of the N+ type buried diffusion layer (FIG. 21(b), FIG. 24(b)).

After the above-described silicon oxide film 371 is removed, sacrificial oxidation is conducted by using a silicon nitride film 333a as a mask. Thus, the N-type ion-implanted layer 333a is activated and N+-type buried diffusion layers 304A, 304B, 304C, 304D, 304E are formed. Further, a second silicon oxide film 372 is formed.

The depth of the final junction of the N+-type buried diffusion layer is approximately 0.2 μm. The film thickness of this silicon oxide film 372 on the surface of the N+-buried diffusion layers 304A is approximately 800 nm, and that on parts which are not provided with these N+-type buried diffusion layers 304A, such as the base of the cavity 303, is approximately 200 nm (FIG. 21(c), FIG. 24(c)).

Next, the silicon oxide film 372 is removed. At this time, the N+-buried diffusion layer 304A is located at a position lower than the base of the cavity 303 by approximately 30 nm. The stepped surface is used in mask alignment by a subsequent photo-lithography step.

Then, a third silicon oxide 373 having a film composed of an HTO film having a thickness of approximately 300 nm is formed on the entire surface. Further, a third silicon nitride (not shown) having a thickness of approximately 50 nm is formed on the entire surface, and a required pattern is applied to the third silicon nitride. As a result, a silicon nitride film 374 is formed. If sulfur hexafluoride ($SF_6$) is used as an etching gas for this patterning, selective anisotropic etching is conducted easily on the silicon nitride film with respect to the silicon oxide film (FIG. 21(d), FIG. 24(d)).

Next, by using a first photo-resist film pattern (not shown) having a predetermined opening as a mask, three stages of anisotropic etching are conducted. Then, a field insulating film 306a is formed, and the element region 342 parallel to the direction perpendicular to the N+-buried diffusion layers 304A is determined. The sectional shape of the field insulating film 306a at a portion between the two element regions 342 is almost (substantially) trapezoidal.

The purpose for making the field insulating film 306a having such a sectional shape is to prevent local polycrystalline silicon films generated on the side surface of the field insulating film 306a from remaining, when a first polycrystalline silicon film is patterned for forming a floating gate electrode in a later step.

Each of the field insulating films 306a extends to the connecting portion regions 353aa, 353ab. On the upper surface of field insulating film 306a in a portion extending from the element region 342 close to the connecting portion region 353aa or connecting portion region 353ab to the connecting portion region 353aa or connecting portion region 353ab, the silicon nitride film 374 is left. In addition, on the upper surface of the field insulating film 306a in a portion extending from the end portion of corresponding element region 342 to the connecting portion region 353aa, the silicon nitride film 374 is left (FIG. 21(e), FIG. 24(e)).

The first stage of etching of the three-stage anisotropic etching is selective etching of the silicon nitride film 374 by using $SF_6$. The second-stage etching is taper etching of the silicon oxide film 373. By such etching, the silicon oxide film 373 is etched to within 20 nm to 50 nm from the base. This etching is conducted using etching gas composed of $CHF_3$ of 50 sccm being diluted with Ar of approximately 150 sccm, at a substrate temperature of about 60°, at a pressure of approximately 100 Pa, at an RF power of 200 W.

The second stage etching is conducted by using etching gas composed of $CHF_3$ of approximately 20 sccm and CO of approximately 10 sccm being diluted with Ar of approximately 300 sccm, at a substrate temperature of around 120° C., at a pressure of approximately 90 Pa, at an RF power of approximately 400 W. In the three-stage etching, since the silicon oxide film is selectively etched with respect to the silicon nitride film, the silicon nitride film 332 protects the field oxide film 302 during the etching.

Next, by using the field insulating film 306a and the silicon nitride film 332 as a mask, a first gate oxide film 309 is formed in the cell array region 352 and the connecting region 353ab by thermal oxidation. Then, an N-type first polycrystalline silicon film 334 having a thickness on the upper surface of the field insulating film 306a of approximately 300 nm is formed on the entire surface by a low pressure chemical vapor deposition (LPCVD).

Since the film thickness of the field insulating film 306a and the film thickness of the polycrystalline silicon film 334 with respect to the spacing of the field insulating film 306a in the element region 342 are sufficiently large, the polycrystalline silicon film 334 sufficiently fills the void portion of the field insulating film 306a in the element region 342 and the upper surface of the polycrystalline silicon film 334 in the cell array region 352 is almost flat (e.g., even).

The thermal oxidation is applied to the polycrystalline silicon film 334 until the film thickness of the polycrystalline silicon film 334 on the upper surface of the field insulating film 306 becomes approximately 10 nm. As a result, a silicon oxide film 375 is formed. The interface between the silicon oxide film 375 and the polycrystalline silicon film 334 in the cell array region 352 is further flattened (FIG. 22(a), FIG. 24(f)).

Next, patterning is applied to the polycrystalline silicon films 334. The polycrystalline silicon films 334 overlap parallel with the N+-type buried diffusion layer 304A by a width of approximately 0.18 μm, respectively and polycrystalline silicon films 334A each having a width of approximately 0.6 μm, and a spacing of approximately 0.54 μm are formed. During the patterning, the first gate oxide films 309 are removed in a self-aligned manner to these polycrystalline silicon patterns.

Then, a second gate oxide film 310 is formed by thermal oxidation in the cell array region 352 formed by the base of the cavity 303 and surfaces of the N+-type buried diffusion layers 304A and the connecting region 352ab, which are not covered with the upper and side surfaces of the polycrystalline silicon film patterns 334A (FIG. 22(b), FIG. 24(g)).

Next, an N+-type second polycrystalline silicon film (not shown) having a thickness of approximately 250 nm is formed on the entire surface by LPCVD. Further, a fourth silicon oxide (not shown) having a thickness of approximately 200 nm is formed on the entire surface. The fourth silicon oxide film is patterned by anisotropic etching. As a result, a silicon oxide film cap 338 is formed. This anisotropic etching is conducted by using etching gas composed of CHF$_3$ of approximately 20 sccm and CO of approximately 5 sccm being diluted with Ar of approximately 400 sccm, at a substrate temperature of approximately 90° C., at a pressure of approximately 40 Pa, at an RF power of approximately 500 W.

Then, the second polycrystalline silicon film is patterned by anisotropic etching to have substantially the same shape as the oxide silicon film cap, and control gate electrodes 313A*a*, 313B*a*, 313C*a*, and 313D*a* are formed. The anisotropic etching of the second polycrystalline silicon film is conducted by using a gas mixture of boron trichloride (BCl$_3$) and chlorine (Cl$_2$) as etching gas. In this anisotropic etching, the polycrystalline silicon film is selectively etched with respect to the silicon oxide film and the silicon nitride film.

Furthermore, a silicon pentoxide film (not shown) composed of, for example, an HTO film having a thickness of approximately 50 nm is formed, the silicon pentoxide film and the gate oxide film 310 are etched back by anisotropic etching, which is the same as that used in the formation of the silicon oxide film cap 338, and a silicon oxide film spacer 339 is formed (FIG. 22(*c*), FIG. 24(*h*)).

Next, a second photo-resist film pattern 391 covering the connecting portion region 353*ab* is formed. The photo-resist film pattern 391 is provided for protecting the N$^+$-type buried diffusion layer 304A exposed to the field oxide film in a self-aligned manner and the principal surface of the P-type silicon substrate 301. By using this photo-resist film pattern 391, the silicon oxide film cap 338 and the silicon oxide film spacer 339 as a mask, the polycrystalline silicon film pattern 334A is patterned by anisotropic etching using gas mixture of BCl$_3$ and Cl$_2$, and a floating gate electrode 312 and a dummy floating gate electrode are formed (FIG. 22(*d*), FIG. 24(*i*)).

Next, a third photo-resist film pattern 392 covering the second connecting portion region 353*ab* and the cell array region 352 is formed. By using this photoresist film pattern 392 as a mask, the silicon nitride 374 covering the connecting region 353*aa* is removed. At the same time, the silicon nitride film covering the connecting region 353*aa* and the peripheral circuit region 351 are removed in a self-aligned manner with the field insulating film 306*a* (FIG. 23(*a*), FIG. 25(*a*)).

Almost simultaneously with the removal of the photo-resist film pattern 392, the pad oxide film 330 is removed. Thereafter, third gate oxide films 314, 314A are formed by thermal oxidation. The film thickness of the gate oxide film is approximately 30 nm, and the gate oxide films 314 are formed in the element regions 341, 341A and the second connecting region 353*ab*, respectively. The film thickness of the gate oxide film 314A is approximately 40 nm and formed on the side surface of the floating gate electrode 312 on the upper surface of the field insulating film 306*a* (FIG. 23(*b*), FIG. 25(*b*)).

Next, an N$^+$-type third polycrystalline silicon film having a thickness of approximately 300 nm is formed on the entire surface by LPCVD. The third polycrystalline silicon film fills a void portion between, for example, the control gate electrode 313A*a* and the control gate electrode 313B*a* sufficiently. Patterning is applied to this third polycrystalline silicon film. As a result, an erase gate electrode 315AB, 315CD and a gate electrode 316A, 316B, 316C, 316D, and 316E are formed.

The gate electrode 316A and erase gate electrode 315AB can be easily formed without using a mask. Therefore, although the gate electrode 316A is quite narrow, the erase gate electrode 315AB is not so narrow, so that an ordinary lithography technique can be used without focal depth becoming a disadvantage.

By using a fourth photo-resist film pattern (not shown) covering the second connecting region 353*ab* as a mask, an ion implantation is performed at 70 keV at 3×10$^{15}$ cm$^{-2}$. As a result, an N$^+$-type diffusion layer 317 is formed in a self-aligned manner to the gate electrode 316A and the field oxide film 302 in the element region 341 in the peripheral circuit region 351. Further, an N$^+$-type diffusion layer 317A is formed in a self-aligned manner to the field oxide film 302 and the field insulating film 306*a* in the element region 341A in the first connecting region 353*aa*. The junction depth of the N$^+$-type diffusion layers 317, 317A is approximately 0.15 μm.

Next, an interlayer insulating film 318 is formed. The height of the upper surface of the interlayer insulating film 318 from the principal surface of the P-type silicon substrate 301 is at least approximately 0.8 μm.

It is necessary to take into consideration requirements of operability of wirings and bit lines in later steps when this interlayer insulating film 318 is formed. For example, an HTO film and a BPSG film may be use to form the interlayer insulating film 318 by reflow. Alternatively, it is possible to form the interlayer insulating film 318 by CMP of, for example, a TEOS oxide film or a laminated film of an HTO film and a TEOS oxide film.

In the interlayer insulating film 318, a contact hole 319 reaching the N$^+$-type buried diffusion layer 304B and a contact hole 319B reaching the N$^+$-type diffusion layer 317 are formed. These contact holes 319, 319B are filled with the contact plug 320. On the upper surface of the interlayer insulating film 318, a wiring 321 and a bit line 321A, 321B, 321C, 321D, 321E are formed.

According to the fifth embodiment, the same advantages as the first to fourth embodiments are obtained.

While only an N-channel MOS transistor is shown as a semiconductor element forming a peripheral circuit in the fifth embodiment, it is not limited thereto, and the peripheral circuit also can be formed by a CMOS transistor. Furthermore, in the fifth embodiment, the above-mentioned of film thicknesses, widths, and intervals are not limited to the above-mentioned numerical values.

Sixth Embodiment

Referring now to the drawings, and more particularly to FIGS. 26–31, a single-chip contact-less flash memory device is shown according to a sixth embodiment of the present invention.

Figure 26:
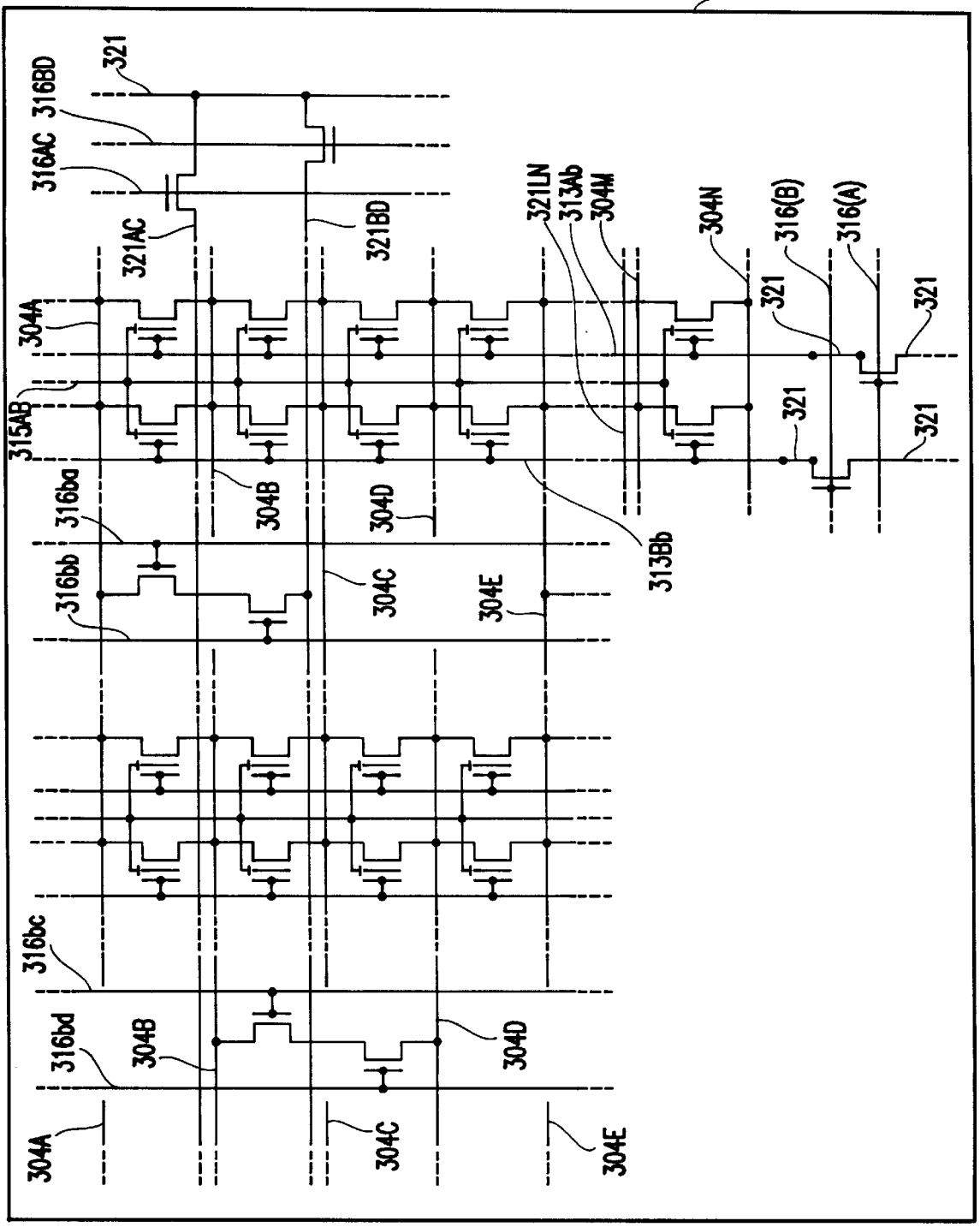
FIG. 26 illustrates a circuit diagram of a VGA-type single-chip contact-less flash memory.
Figure 27:
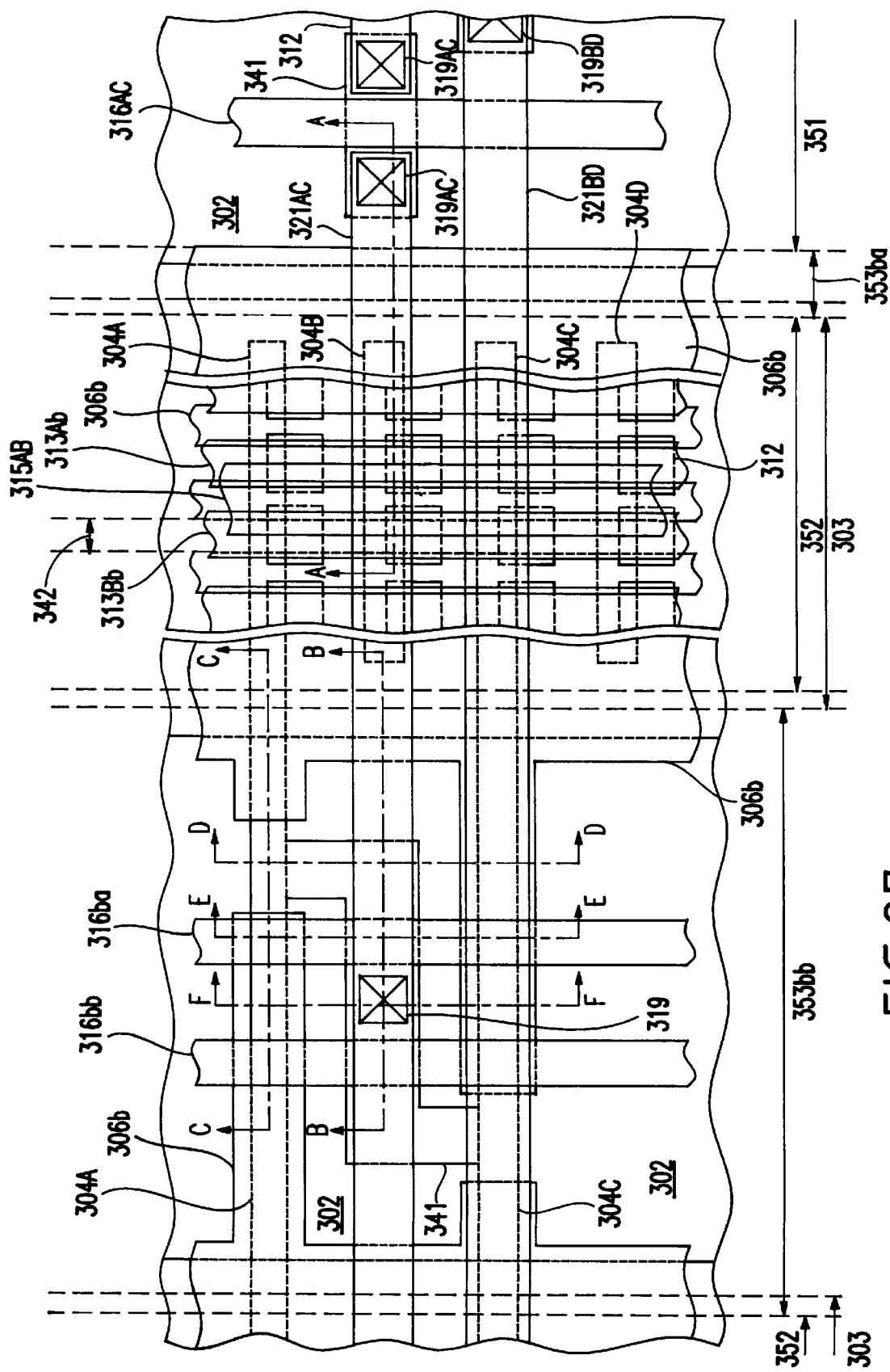
FIGS. 27–28 show a plan view of the VGA-type flash memory shown in FIG. 26.
Figure 28:
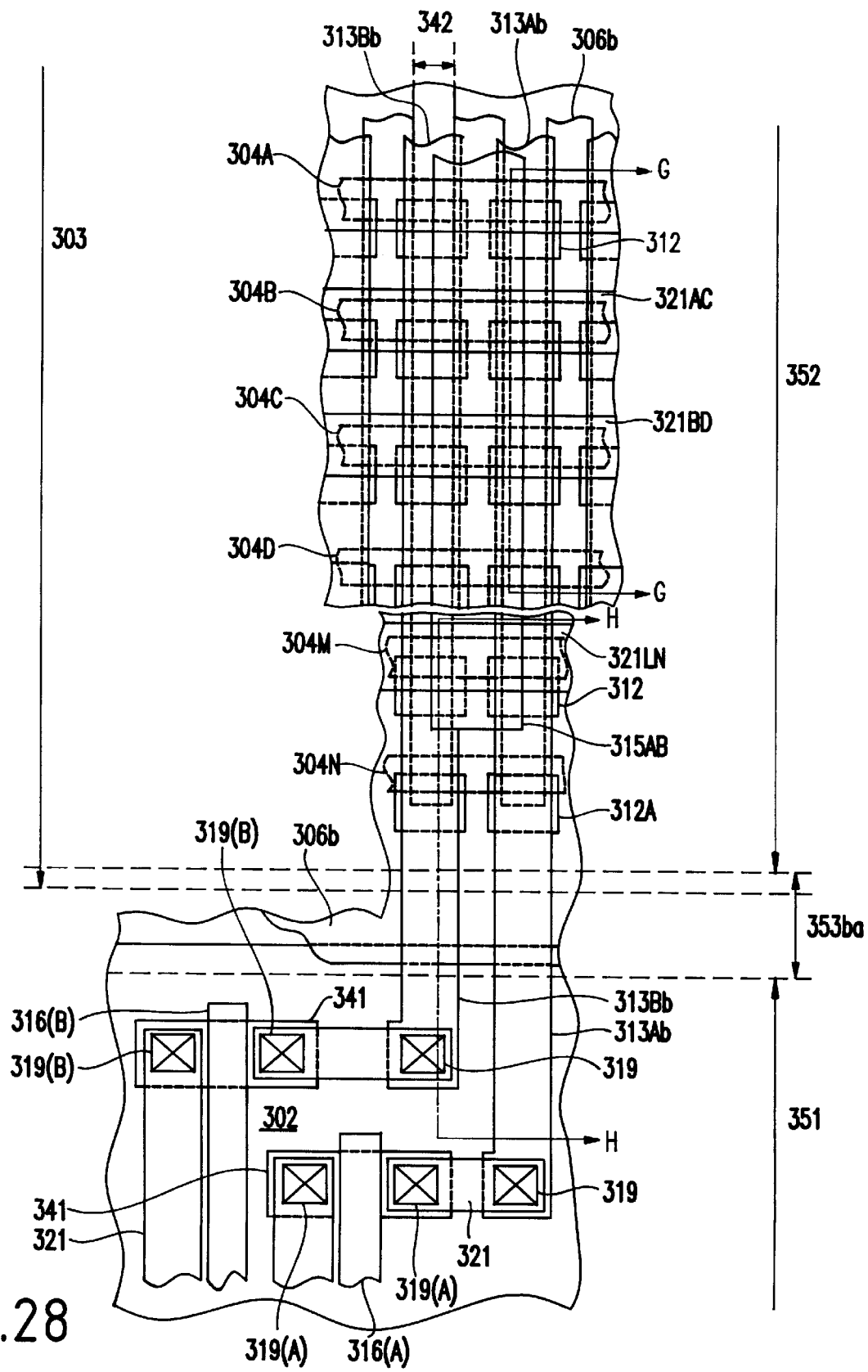
Figure 29A:
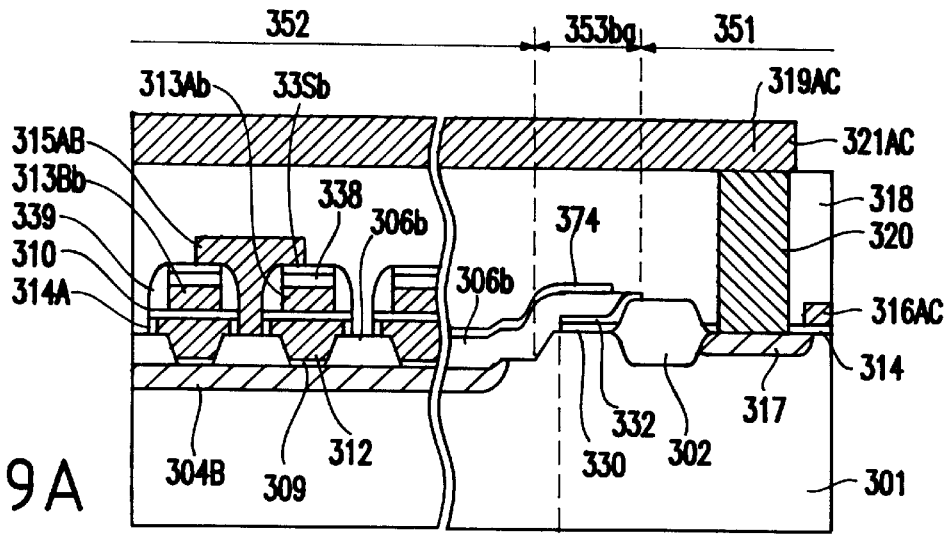
FIGS. 29(a)–(c) respectively show sectional views of the VGA-type flash memory shown in FIG. 27 taken along lines A—A, B—B and C—C.
Figure 29B:
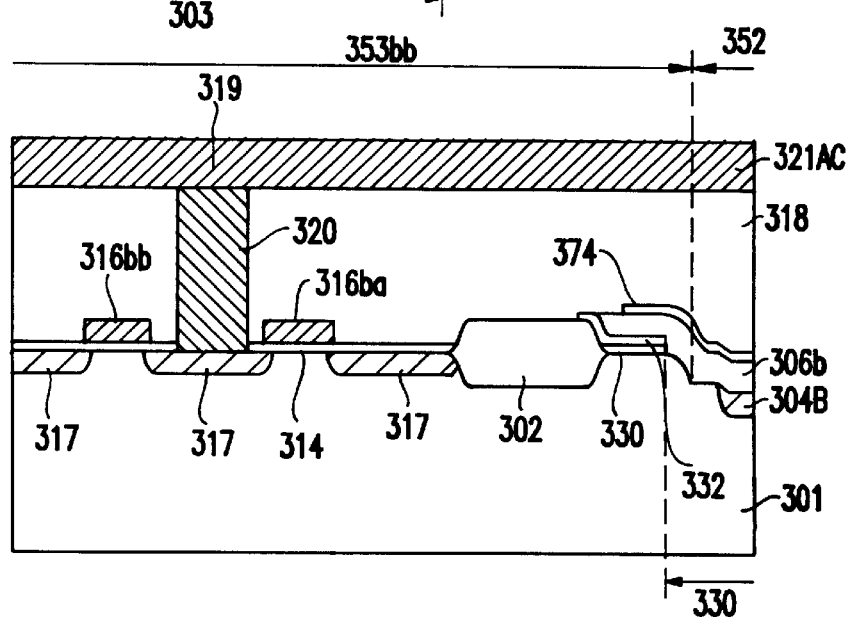
Figure 29C:
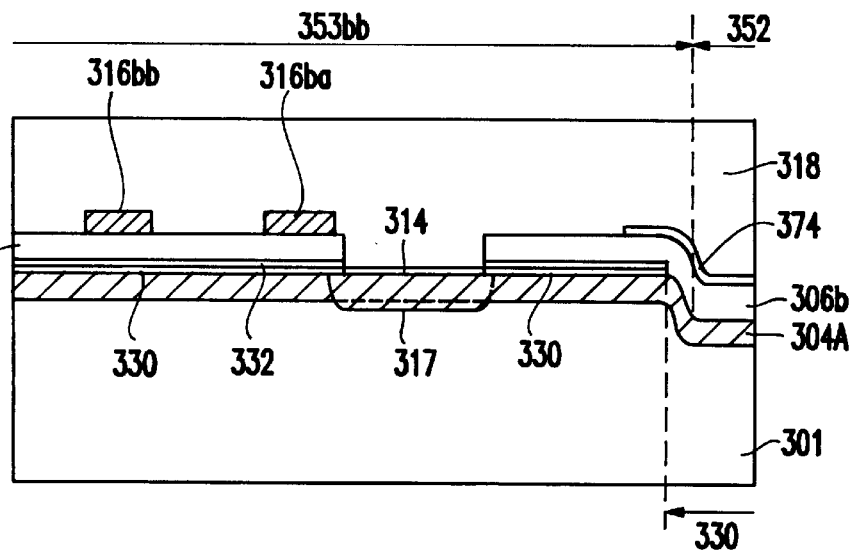
Figure 30A:
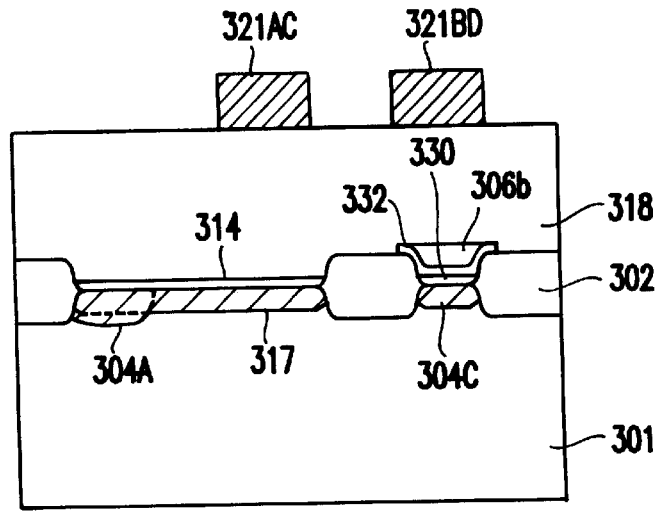
FIGS. 30(a)–(c) respectively show sectional views of the VGA-type flash memory shown in FIG. 27 taken along lines D—D, E—E and F—F.
Figure 30B:
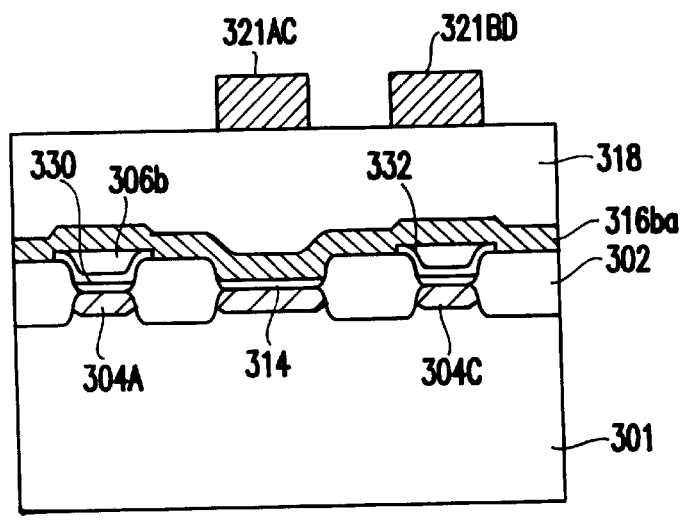
Figure 30C:
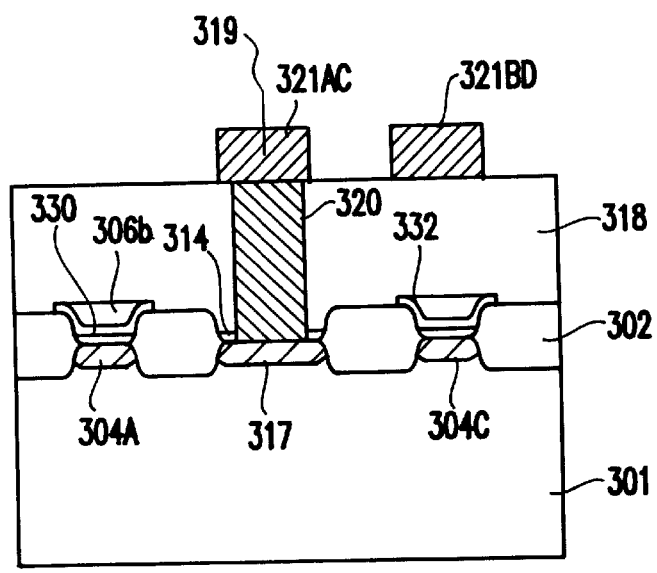
Figure 31A:
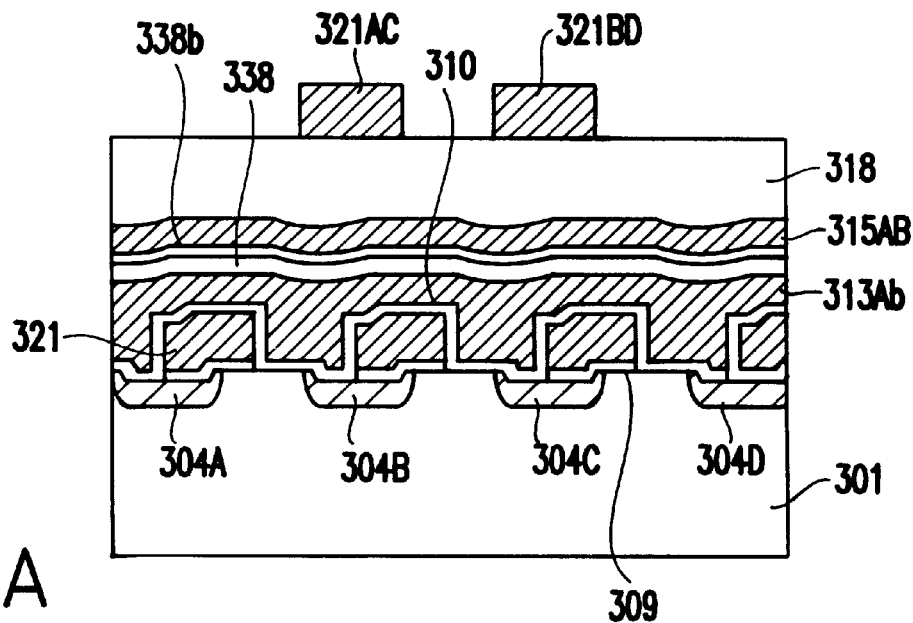
FIGS. 31(a)–(b) respectively show sectional views of the VGA-type flash memory shown in FIG. 28 taken along lines G—G and H—H.
Figure 31B:
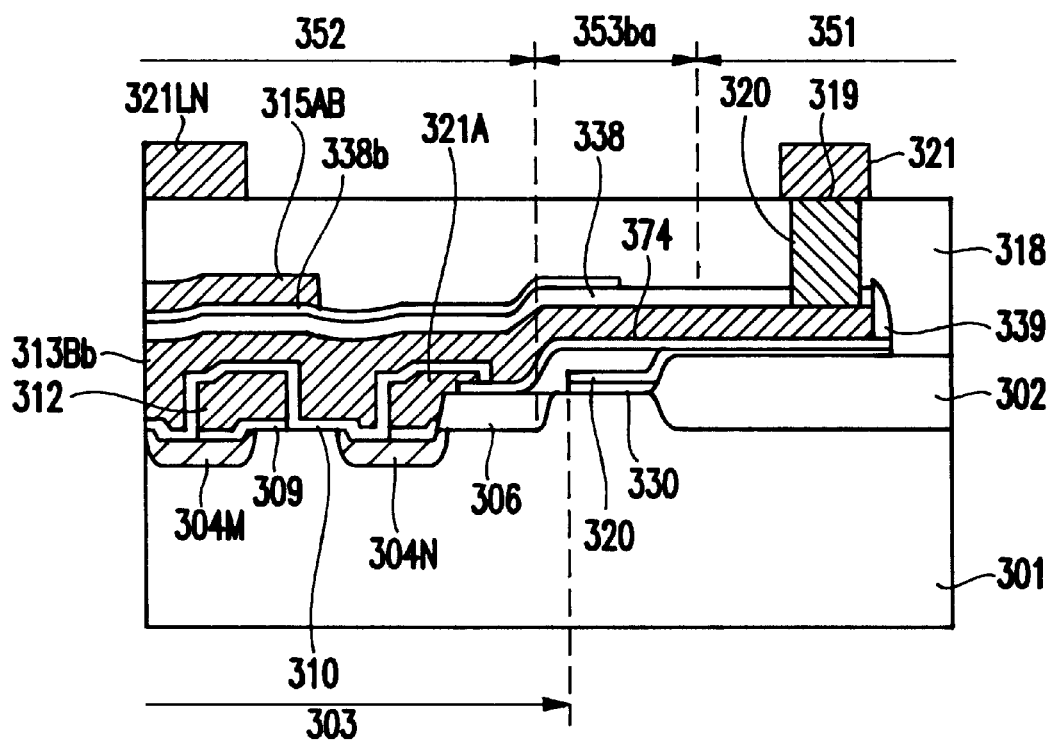
Figure 32A:
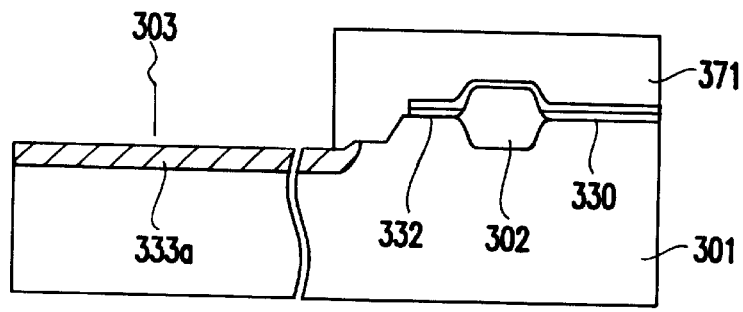
FIGS. 32(a)–(e)–33(a)–(c) show sectional views of the VGA-type flash memory shown in FIG. 27 taken along line A—A.
Figure 32B:
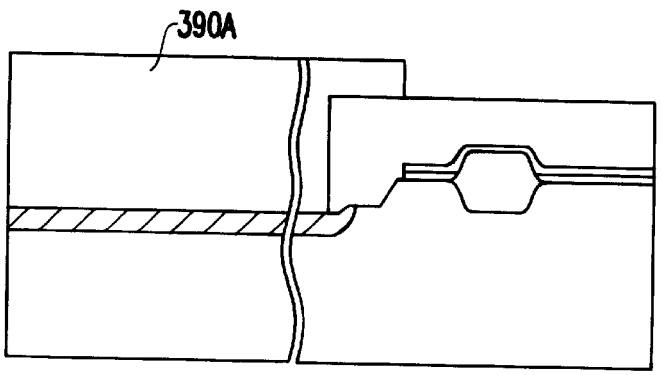
Figure 32C:
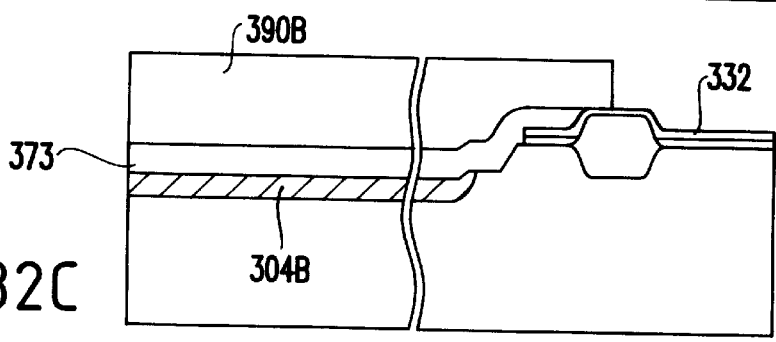
Figure 32D:
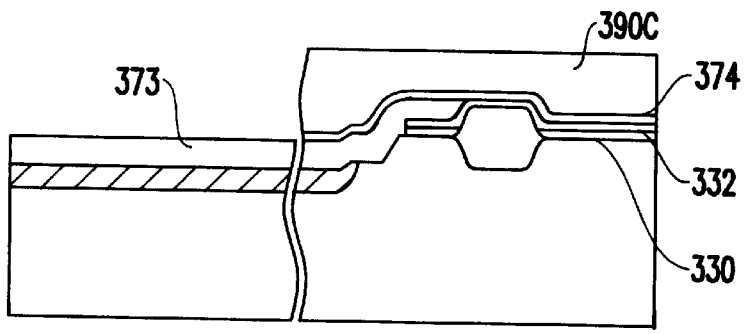
Figure 32E:
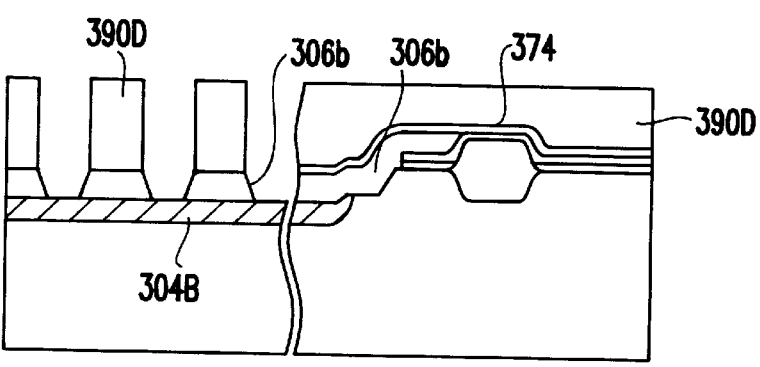
Figure 33A:
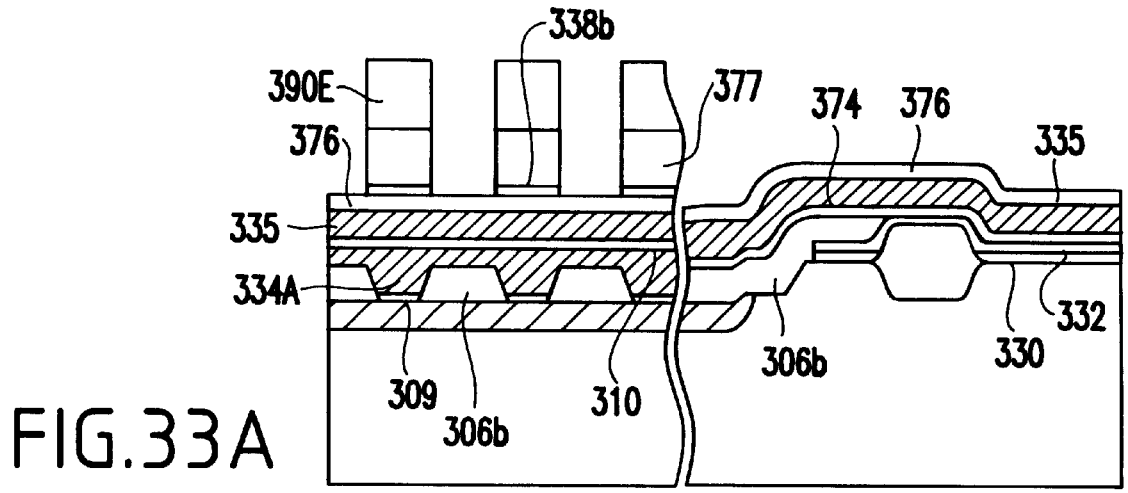
Figure 33B:
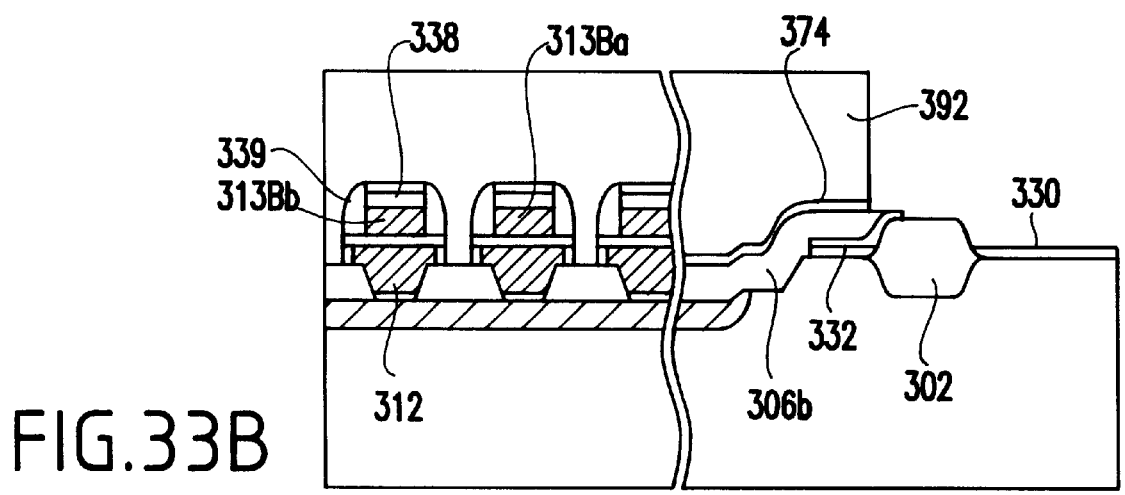
Figure 33C:
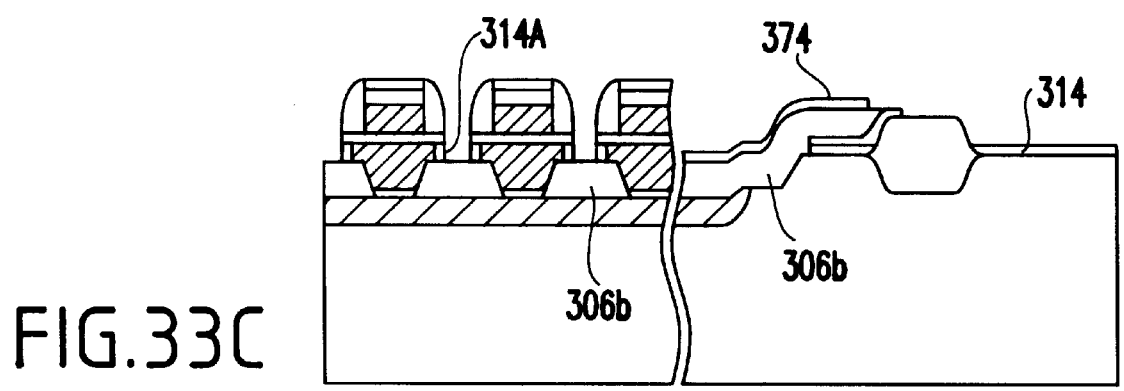
Figure 34A:
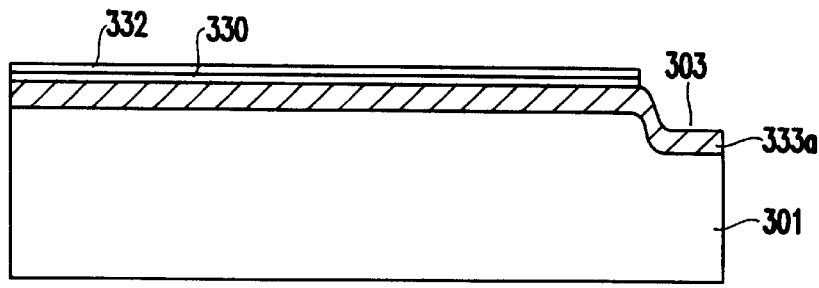
FIGS. 34(a)–(e)–35(a)–(c) respectively show sectional views of the VGA-type flash memory shown in FIG. 27 taken along line C—C.
Figure 34B:
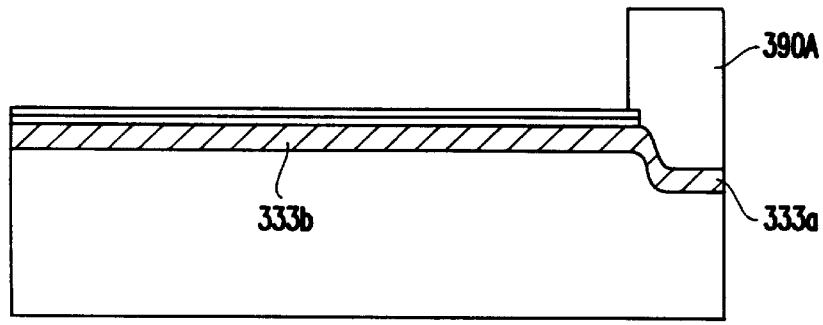
Figure 34C:
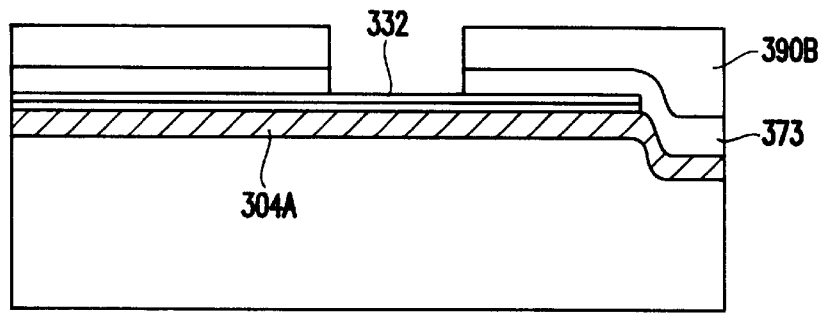
Figure 34D:
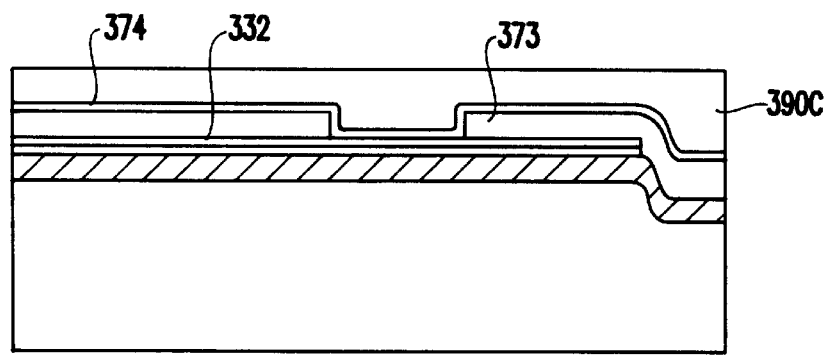
Figure 34E:
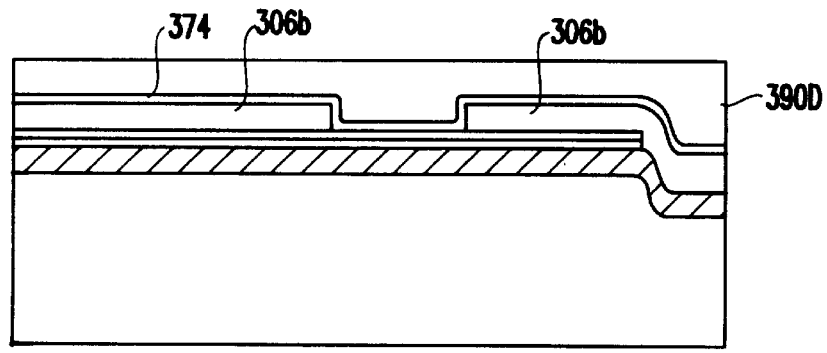
Figure 35A:
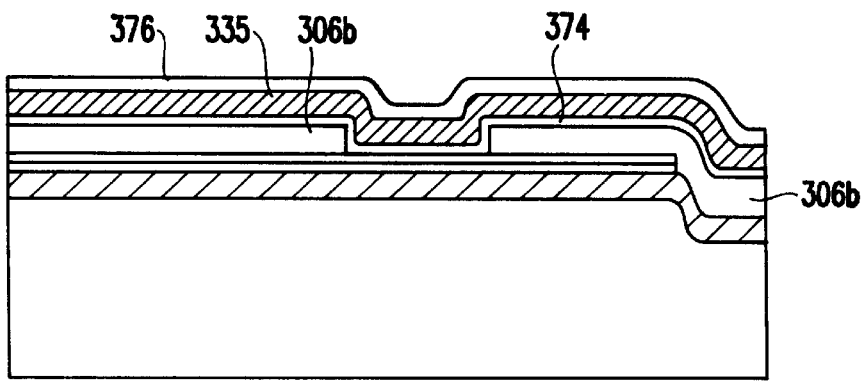
Figure 35B:
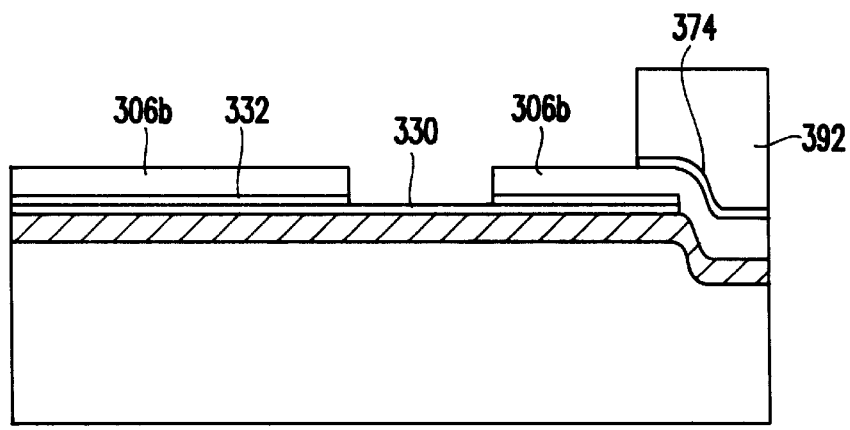
Figure 35C:
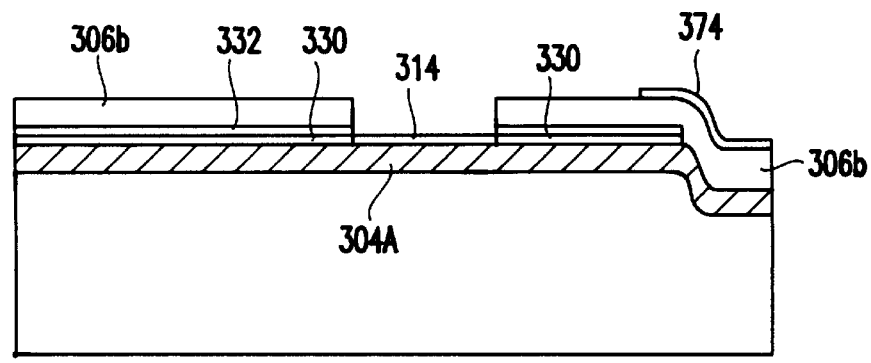
Figure 36A:
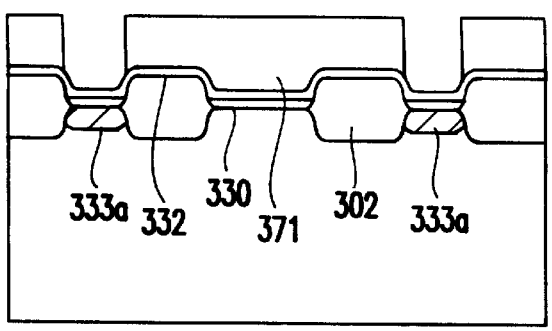
FIGS. 36(a)–(h) respectively show sectional views of the VGA-type flash memory shown in FIG. 27 taken along line E—E.
Figure 36E:
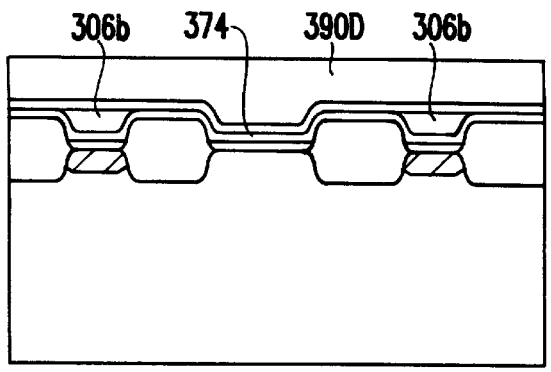
Figure 36B:
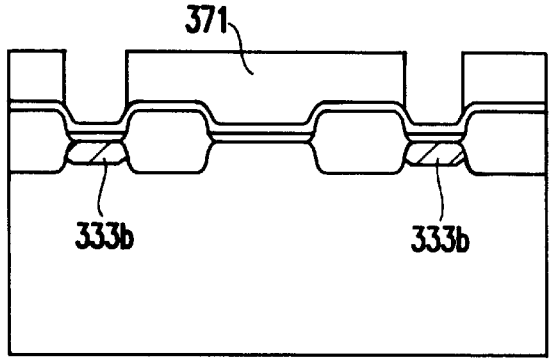
Figure 36F:
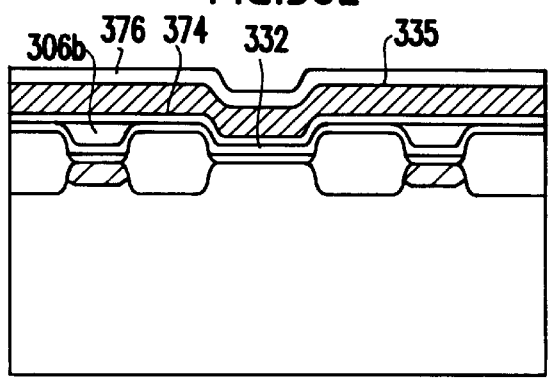
Figure 36C:
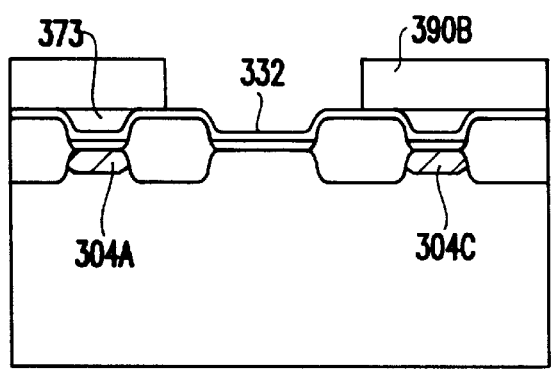
Figure 36G:
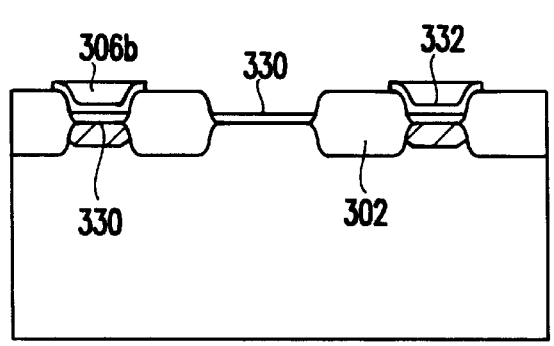
Figure 36D:
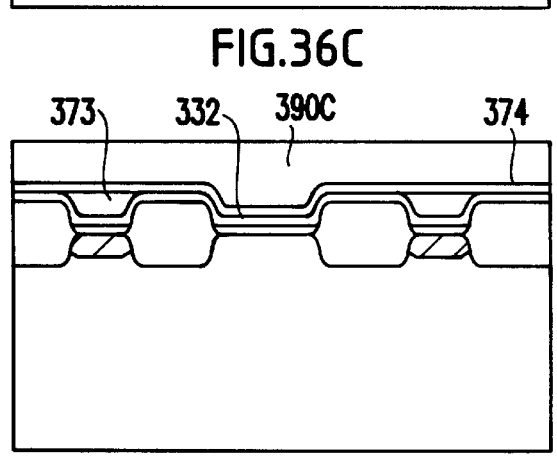
Figure 36H:
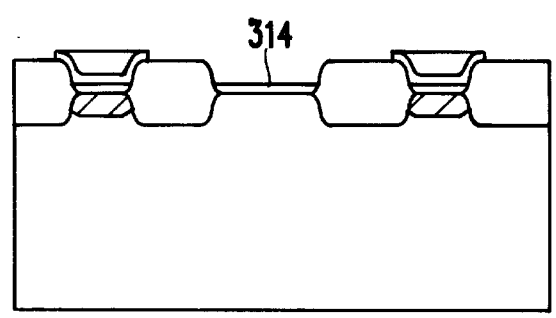
Figure 37A:
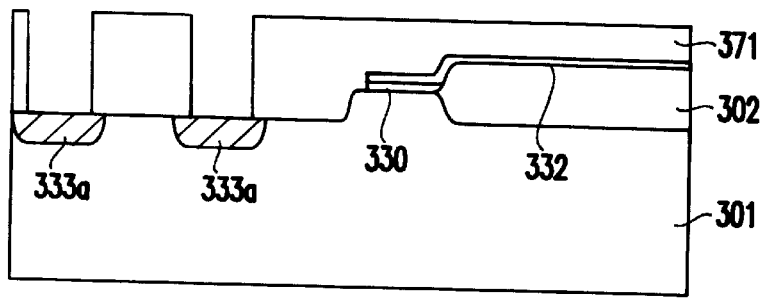
FIGS. 37(a)–(e)–38(a–c) respectively show sectional views of the VGA-type flash memory shown in FIG. 28 taken along line H—H.
Figure 37B:
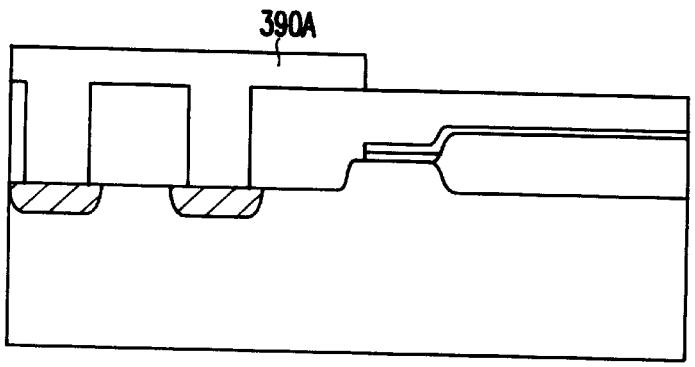
Figure 37C:
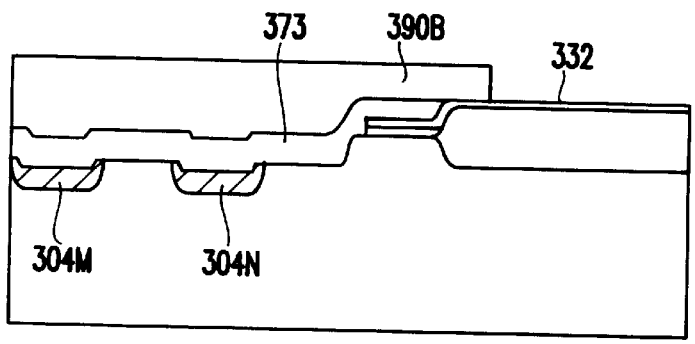
Figure 37D:
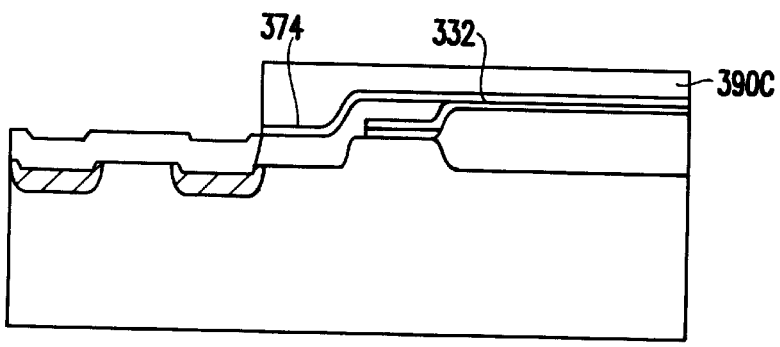
Figure 37E:
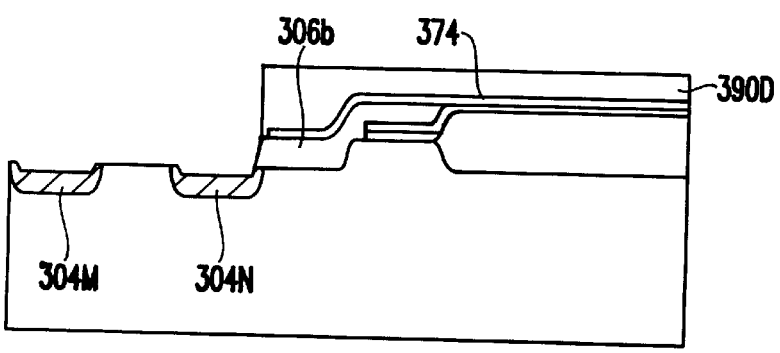
Figure 38A:
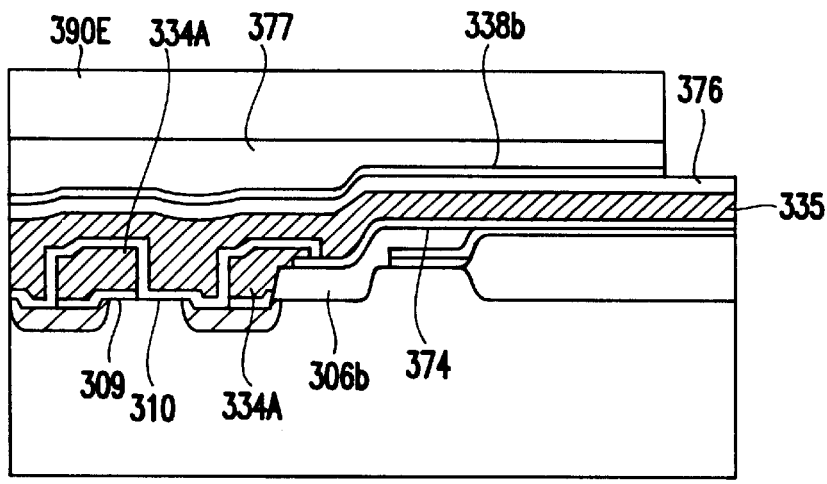
Figure 38B:
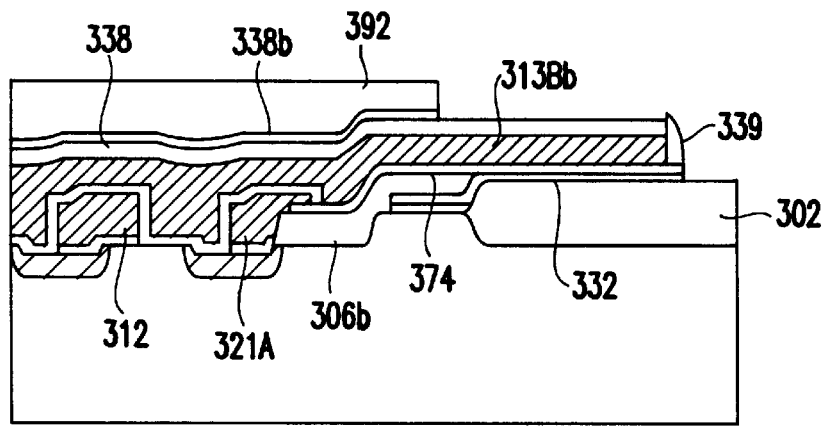
Figure 38C:
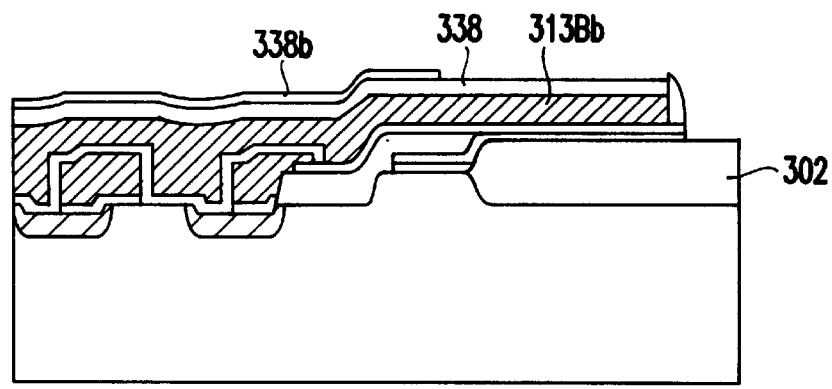

FIG. 26 shows a circuit diagram of an VGA-type flash memory, FIGS. 27–28 show a plan view of the VGA-type flash memory shown in FIG. 26, FIGS. 29(*a*)–(*c*) respectively show sectional views of the VGA-type flash memory shown in FIG. 27 taken along lines A—A, B—B and C—C, FIGS. 30(*a*)–(*c*) respectively show sectional views of the VGA-type flash memory shown in FIG. 27 taken along lines D—D, E—E and F—F, and FIGS. 31(*a*)–(*b*) respectively show sectional views of the VGA-type flash memory shown in FIG. 28 taken along lines G—G and H—H.

The main difference between the sixth embodiment and the embodiments previously described is the structure of the first connecting region.

In the sixth embodiment, a control gate electrode (313A*b*, 313B*b*) and an erase gate electrode (315AB) are extended to the first connecting portion region 353*ba*. The flash memory according to the sixth embodiment is formed in accordance with a design rule of 0.36 μm.

It is noted that, although the connecting portion region provided between the cell array region 352 and the peripheral circuit region 351 related to bit lines is originally the second connecting region 353bb, for easy explanation, a typical plan view shown in FIG. 27 illustrates the first connecting portion region 353ba.

In a required region of the principal surface of a P-type silicon substrate 301, a cavity 303, having a substantially inverted trapezoidal shape and a flat base, is provided. The cavity 303 is formed by removing a LOCOS-type field oxide film 302 having a thickness of approximately 600 nm. The base of the cavity 303 is located at a position lower than the principal surface of the P-type silicon substrate 301 by approximately 300 nm.

On the base of the cavity 303, an array region 352 is provided. Between the two array regions 352, a second connecting portion region 353bb, having a lazy S-shape including the principal surface of the P-type silicon substrate 301 and an inclined face which is the peripheral portion of the cavity 303, is formed. In the element region 341B provided in the connecting region 353bb and surrounded by a field oxide film 302, a pair of select gate transistors related to a bit line is provided. In an element region 341 provided on the principal surface of the P-type silicon substrate 301 and surrounded by the field oxide film 302 in a peripheral circuit region 351, semiconductor elements, such as an N-channel MOS transistor for a peripheral circuit, are formed.

A first connecting portion region 353ba is provided between the peripheral circuit region 351 and the cell array region 352. The connection portion region 353ba includes the inclined face forming the peripheral portion of the cavity and the boundary between the connecting region 353ba and the peripheral circuit region 351 includes a field oxide film 302.

The inclined face in the connecting portion region 353ba is covered directly with the field insulating film 306b, which is described in detail hereinunder. The principal surface of the P-type silicon substrate 301 between the inclined face and the field oxide film 302 is covered with the field insulating film 306b through a pad oxide film 330 having a thickness of approximately 40 nm and a second silicon nitride film 332 having a thickness of approximately 50 nm.

The "beak portion" of the field oxide film 302 is covered with the field insulating film 306b through the silicon nitride film 332. The upper surface of the field insulating film 304b, at a portion extending to the connecting portion regions 353ba and 353bb, is located at a position higher than the upper surface of the field oxide film 302 by approximately 50 nm, and is flattened.

In each of the cell array regions 352, there are provided $N^+$-type buried diffusion layers 304A, 304B, 304C, 304D, 304D, 304M, and 304N in a direction perpendicular to the longitudinal direction of the connecting region 353bb and parallel to the bit lines. For example, these $N^+$-type buried diffusion layers 304A, 304C, and 304E, which are $N^+$-type buried diffusion layers in odd-numbered columns and are provided in the first cell array region 352, are provided in a self-aligned manner to the field oxide film 302 in the connecting region 353bb provided between, for example, the first and second cell array regions 352, and reach the adjacent second cell array region 352.

In one element region 351B provided in this connecting region 353bb, the $N^+$-type buried diffusion layer 304A and the $N^+$-type buried diffusion layer 304C are connected together, for example. In the connecting portion region 353bb, the $N^+$-type buried diffusion layers 304A, 304C except for portions connected to the element region 341B are covered with the field insulating film 306b through the pad oxide film 330 and the silicon nitride film 332.

In the connecting portion region 353bb, the "beak portion" of the field oxide film 302 is covered with the field insulating film 306b through a second silicon nitride film. The portion of the connecting portion region 353bb, which is adjacent to the cell array region 352, has the same structure as that of the connecting portion region 353ba. The $N^+$-type buried diffusion layers 304B, 304D, which are $N^+$-type buried diffusion layers in even numbered columns, do not cross the connecting portion region 353bb provided between the first and second cell array regions but the connecting portion region 353bb provided between the second and third cell array region 351, for example.

$N^+$-type buried diffusion layers 304A and 304C, for example, are connected to a bit line 321AC, respectively through a pair of select gate transistors provided in an element region 341B in one connecting portion region 353bb. $N^+$-type buried diffusion layers 304B and 304D are connected to a bit line 321BD, respectively through a pair of select gate transistors provided in an element region 341B in a different connecting portion region 353bb.

These $N^+$-type buried diffusion layers work as a ground line, which is a source, or as a bit line, which is a drain, for a nonvolatile memory cell, respectively.

The junction depth of the $N^+$-type buried diffusion layer 304A is approximately 0.2 $\mu$m, and the surface of the $N^+$-type buried diffusion layer 304A is located at a position lower than the base of the cavity 303 by approximately 300 nm. The wiring pitch of the $N^+$-type buried diffusion layer 304A is approximately 1.14 $\mu$m, and the width and spacing of the $N^+$-type buried diffusion layer 304A in the cell array region 352 are approximately 0.36 $\mu$m and 0.78 $\mu$m, respectively.

A nonvolatile memory cell is formed in the element region 342 provided with the cell array region 352. The element region 342 is provided to have a "lazy S-shape" configuration in parallel to the direction perpendicular to the $N^+$-buried diffusion layer 304A, and the width, spacing and pitch of the element region 342 is approximately 0.30 $\mu$m, approximately 0.48 $\mu$m and approximately 0.78 $\mu$m, respectively.

The end portion of the element region 342 is provided in a cell array region at required intervals from the connecting portion region 353ba associated with the peripheral circuit region 351 provided with peripheral circuits respectively related to a control gate electrode and an erase gate electrode. The minimum spacing between the connecting portion region 353ba, connecting portion region 353bb and the element region 342 is at least approximately 0.4 $\mu$m.

The element region 342 is determined by the field insulating film 306b composed of an HTO film having a thickness of approximately 300 nm. The height of the upper surface of the field insulating film 306b in the cell array region 352 is almost the same as the height of the principal surface of the P-type silicon substrate 301. In a portion provided with nonvolatile memory cells, except for a nonvolatile memory cell closest to the connecting portion regions 353ba and 353bb, the field insulating film 306b has only a silicon oxide film, has a trapezoidal section and has a "lazy S-shaped" configuration.

The width, spacing and pitch of the upper surface of the field insulating film 306b at this portion are approximately 0.42 $\mu$m, approximately 0.36 $\mu$m and approximately 0.78 $\mu$m, respectively. The width, spacing and pitch of the base of the field insulating film 306b at this portion are approximately 0.30 $\mu$m, approximately 0.48 $\mu$m and approximately 0.78 $\mu$m, respectively.

The field insulating films 306b having such configuration are made into a unitary structure in the cell array region 352 adjacent to the connecting portion region 353ba and the connecting portion region 353bb. Thus, one field insulating film 306b is provided in one cell array region 352. As described above, the field insulating films extend to the connecting portion regions 353ba and 353bb, respectively.

In the element region 342, a split gate-type floating gate electrode 312 is provided through a first gate oxide film 309. The floating gate electrode 312 includes an N-type polycrystalline silicon film. The length and spacing of the floating gate electrode 312 along the field insulating film 306b are approximately 0.6 µm and approximately 0.54 µm, respectively. The floating gate electrode 312 overlaps with, for example, the N$^+$-type buried diffusion layer 304B by a length of approximately 0.18 µm, extends to the base of the cavity 303 by approximately 0.42 µm and has a spacing with the N$^+$-type buried diffusion layer 304A of approximately 0.32 µm.

The film thickness of the gate oxide film 309 provided on the surface of the N$^+$-type buried diffusion layer 304B is approximately 40 nm, and the film thickness of the gate oxide film 309 provided on the (surface of the) base of the cavity 303 is approximately 20 nm.

Second gate oxide films 310 are provided on the upper surface of the floating gate electrode 312 and the element region 342, such as the N$^+$ type buried diffusion layers 304A and the base of the cavity 303, at a portion not covered with the side surface of the floating gate electrode 312 between the two field insulating films 306b and not covered with the floating gate electrode 312, respectively.

Film thicknesses of the gate oxide films 310 on the side and upper surfaces of the floating gate electrode, the surface of the N$^+$-type buried diffusion layers 306A and the base of the cavity 303 are approximately 30 nm, approximately 40 nm and approximately 20 nm, respectively. The width and spacing of the floating gate electrode 312 in the direction parallel to the N$^+$-type buried diffusion layers 304A are approximately 0.52 µm and approximately 0.26 µm, respectively.

In this direction, the floating gate electrode 312 covers the upper surface of the field insulating film 306b by approximately 0.08 µm. The upper surface of the floating gate electrode 312 is located at a position higher than the upper surface of the filed insulating film 306b by approximately 100 nm. The side surface of the floating gate electrode 312 reaching the upper surface of the field oxide film 306b is provided with a third gate oxide film 314A having a thickness of approximately 40 nm.

On the upper surface of such a portion of field insulating film 306b as to extend to the connecting regions 353ba and 353bb, the portion from the terminal end portion of the element region 342 or the end side of the element region on the outermost periphery to at least the portion in the vicinity of the end portion of the cavity 303 or the end portion of the cell array region 352, is covered with the third silicon nitride film 374 having a thickness of approximately 50 nm.

The silicon nitride film 372 can extend to the portion where the field insulating film 306b is located close to the field oxide film 302. Therefore, the upper surface of the field insulating film 306b in the connecting portion region 353ba or the connecting portion region 353bb in the element region 342 is covered with the floating gate electrode 312 through the silicon nitride film 374.

The floating gate electrode 312A provided closest to the connecting portion region 353ba associated with the peripheral circuit region 351 related to a control gate electrode or an erase gate electrode, is a dummy floating gate electrode and the end portion of the corresponding element region ends right below the dummy floating gate electrode. The floating gate electrode 312A at least at the connecting region 353ba side covers the upper surface of the field insulating film 306a through the silicon nitride film 374.

The control gate electrodes 313Ab, 313Bb, provided along the element region 342, cover the floating gate electrode 312 and the floating gate electrode 312A, the N$^+$-type buried diffusion layers 304A and the base of the cavity 303, respectively. Each of the control gate electrodes 313Ab has an N$^+$-type polycrystalline silicon film, the thickness thereof on the floating gate electrode 312 is approximately 250 nm and the end portion thereof crosses the element region 353ba and extends to peripheral circuit region 351.

The width, spacing and pitch of the control gate electrode 313Ab are approximately 0.42 µm, approximately 0.36 µm and approximately 0.78 µm, respectively. The overlapping length thereof with the upper surface of the field insulating film 306b is approximately 0.03 µm. The upper surface of the control gate electrode 313Ab is covered with an insulating film cap formed by laminating a silicon oxide film cap 338 having a thickness of approximately 200 nm and a silicon nitride film cap 338b having a fourth silicon nitride film having a thickness of approximately 50 nm in at least the cell array region 352. Moreover, a side surface of the control gate electrode 313Ab, the silicon oxide film cap 338 and the silicon nitride film cap 338b are covered with a silicon oxide film spacer 339 having a width of approximately 50 nm.

On the upper surface of the control gate electrode 313Ab in at least the peripheral circuit region 351, the silicon nitride cap 338b is removed. The side surface of the floating gate electrode 312 at an upper surface portion of the field insulating film 306b is self-aligned with the silicon oxide film spacer 339.

The control gate electrodes 313Ab and 313Bb, for example, jointly have an erase gate electrode 315AB. For example, the erase gate electrode 315AB covers the upper and side surfaces of the control gate electrode 313Ab, 313Bb through the silicon nitride film cap 338b, the silicon oxide film cap 338 and the silicon oxide film spacer 339, and covers the side surface of the floating gate electrode at a portion extending to the upper surface of the field insulating film 306b through the gate oxide film 310 and reaches directly the upper surface of the field insulating film 306b in the void portion between the floating gate electrodes 312.

Each of these erase gate electrodes 315AB includes, for example, an N$^+$-type polycrystalline silicon film. The film thickness thereof at a portion covering the upper surface of the control gate electrode 313Ab through the silicon oxide film cap 338 is approximately 300 nm. The end portion of the erase gate electrode 315AB, 315CD, as in the case of the end portion of the control gate electrode 313Ab, crosses the connecting portion region 353ba and extends to the peripheral circuit region 351.

The width, spacing and pitch of the erase gate electrode 315AB are approximately 0.84 µm, approximately 0.72 µm and approximately 1.56 µm, respectively. Moreover, the overlapping width of, for example, the erase gate electrode 315AB with the control gate electrode 313Ab is approximately 0.24 µm.

In the element regions 341 and 341B, an N-channel MOS transistor is provided as a select gate transistor related to semiconductor elements and bit lines of the N-channel MOS transistor forming a peripheral circuit. The N-channel MOS transistor forming the peripheral circuit includes a gate electrode 316(A), 316(B), 316AC, and 316BD, a third gate oxide film 314 and a pair of N$^+$-type diffusion layer 317. The gate electrode of the N-channel MOS transistor is formed as a select gate transistor and includes a gate electrode 316ba, 316bb, 316bc or 316bd.

A pair of select gate electrodes, provided in the element region 341B in the connecting portion region 353bb crossed by, for example, the N⁺-type buried diffusion layers 304A and 304C, include the gate electrodes 316ba, 316bb, the gate oxide film 314, one N⁺-type diffusion layer 317 self-aligned to the gate electrode 316ba, the gate electrode 316bb, the field oxide film 302 and a pair of N⁺-type diffusion layers 317 self-aligned to either the field oxide film 302 or the gate electrode 316ba , bb and connected to the N⁺ type buried diffusion layer 304A, 304C.

The film thickness of the gate oxide film 314 is approximately 30 nm, the depth of junction of the N⁺-type diffusion layer is approximately 0.15 μm, and the gate electrode 316(A) is formed of an N⁺-type polycrystalline silicon film having a thickness of, for example, 300 nm.

The P-type silicon substrate 301 is covered with an interlayer insulating film 318 formed by laminating an HTO film, a BPSG film or a TEOS series film, and a silicon oxide film. The height of the upper surface of the interlayer insulating film 318 from the principal surface of the P-type silicon substrate 301 is at least approximately 0.8 μm. This interlayer insulating film 318 is provided with a contact hole 319 reaching the N⁺-type diffusion layer 317 constituting a select gate transistor or the control gate transistor 313Ab, the contact hole 319AC, 319BD reaching the N⁺ diffusion layer 317 constituting an N-channel MOS transistor having, for example, the gate electrodes 316AC, 316BD and the contact hole 319(A), 319(B) reaching the N⁺-type diffusion layer constituting an N-channel MOS transistor having, for example, the gate electrodes 316(A), 316(B).

The diameter of the contact hole 319 is approximately 0.6 μm. Each of the contact holes 319, 319AC, 319(C) is filled with a contact plug 320 and bit lines 321AC, 321BD, 321LM and wiring 321 are provided on the surface of the interlayer insulating film 318. For example, the bit line 321AC is connected to the N-channel MOS transistor forming the peripheral circuit through the contact hole 319AC and connected to the N⁺-type buried diffusion layers 304A, 304C through the contact hole 319 and through select gate transistor having the gate electrode 316ba, 316bb.

The sixth embodiment has the same advantages as the fifth embodiment. Further, due to the difference in the structure of the first connecting region, the sixth embodiment easily reduce the area of a cell array region compared to the fifth embodiment.

The circuit operation of the VGA-type flash memory in the sixth embodiment is substantially the same as that of the flash memory in the fifth embodiment.

For example, a writing operation is conducted as follows. The P-type silicon substrate 301 is applied with 0 V, and all of the erase gates 315AB are applied with 0 V. The gate electrode 316BD is applied with a high potential, the bit line 321BD is applied with a high potential such as approximately 8 V, the gate electrode 316bc is applied with a high potential and the N⁺-type buried diffusion layer 304B, for example, selected as a drain, is applied with 7 V.

The gate electrode 316AC is applied with 0 V, the bit line 321BD is applied with approximately 0 V, the gate electrode 316ba is applied with a high potential and the N⁺-type buried diffusion layer 304A selected as a source is applied with 0 V. Furthermore, the gate electrode 316bb is opened and the N⁺-type buried diffusion layer 304 is opened.

The remaining non-selected N⁺-type buried diffusion layers 304E, 304M, 304N are also opened. The gate electrode 316(A) is applied with a high potential and the selected control gate electrode, for example, 313Ab is applied with 12 V. Other gate electrodes 316(B) are applied with 0 V and other control gate electrodes 313Bb are applied with 0 V. Therefore, in a nonvolatile memory cell in row A and column B, channel hot electrons are injected into the floating gate electrode 312 from the N⁺-type buried diffusion layer 304A, which serves as a source. At this time, the threshold voltage $V_{TM}$ of this nonvolatile memory cell is approximately 7 V.

An erasing operation is conducted as follows. The P-type silicon substrate 301, all N⁺-type buried diffusion layers 304A, 304B, 304C, 304D, 304E and all control gate electrodes 313Ab, 313Bb are applied with 0 V. All erase gate electrodes 315AB are applied with 15 V. Therefore, charges (e.g., electrons) are taken from all of the floating gate electrodes 312 by the erase gate electrodes 315AB and by F-N tunneling. At this time, the threshold voltage $V_{TM}$ of the nonvolatile memory cell is approximately 1 V.

Referring now to the drawings, and more particularly to FIGS. 32–38, a method for fabricating the single-chip contact-less flash memory device according to the sixth embodiment of the present invention will be described.

FIGS. 32–33 show sectional views of the VGA-type flash memory shown in FIG. 27 taken along line A—A, FIGS. 34–35 respectively show sectional views of the VGA-type flash memory shown in FIG. 27 taken along line C—C, FIGS. 36(a)–(h) respectively show sectional views of the VGA-type flash memory shown in FIG. 27 taken along line E—E, and FIGS. 37–38 respectively show sectional views of the VGA-type flash memory shown in FIG. 28 taken along line H—H.

First, a pad oxide film 330 and a first silicon nitride film (not shown) are formed to a thickness of approximately 40 nm on the principal surface of a P-type silicon substrate. Then, the first silicon nitride film is patterned. As a result, a LOCOS-type field oxide film 302 having a thickness of approximately 600 nm, is formed in an element isolation region in a peripheral circuit region including the boundary between a cell array region and a first connecting region and in a second connecting portion region except for the element region of the N⁺-type buried diffusion layer. Moreover, a peripheral circuit region having an element region 341 is formed.

After the first silicon nitride film is removed, a second silicon nitride film 332 having an opening, covering the peripheral circuit region 351 and first, second connecting portion regions, and having a thickness of approximately 50 nm, is formed. By using this silicon nitride film as a mask, the field oxide film 302 and the pad oxide film 330 are etched away.

Therefore, a cavity 303 having a substantially inverted trapezoidal shape, and a cell array region 352 formed by the flat base of the cavity 303, are formed. Simultaneously, a first connecting portion region 353ba and a second connecting portion region 353bb including an element region 341B are determined. The silicon nitride film 332 covers the element regions 341, 341B and an N⁺ type buried diffusion layer region in the connecting portion region 353bb. The base of the cavity 303 is located at a position lower than the principal surface of the P-type silicon substrate 301 by approximately 300 nm.

Next, by using the same method as that of forming a diffusion layer in the fifth embodiment, a first silicon oxide film (not shown) is formed on the entire surface. Then, the upper surface of the first silicon oxide film is flattened by CMP. Thereafter, patterning is applied to provide an opening in the N+-type buried diffusion layer region. As a result, a silicon oxide film 371 is formed. By using the silicon oxide film 371 as a mask, arsenic (As) ion implantation is performed at 50 keV and at $5 \times 10^{15}$ cm$^{-2}$. As a result, a first N-type ion implanted layer 333a is formed in N+-type buried diffusion layer regions in the cell array region 352 and the connecting portion region 353bb, respectively.

Since the N-type ion-implanted layer 333a formed on the principal surface of the P-type silicon substrate 301 in the connecting portion region 353bb is ion-implanted through the pad oxide film 330 and the silicon nitride film 332, an As concentration thereof is lower than that of the N-type ion-implanted layer 333a formed in the cell array region 352 (FIG. 32(a), FIG. 34(a), FIG. 36(a), FIG. 37(a)).

Next, a first photo-resist film pattern 390A covering the cavity 303 is formed. By using this photo-resist film pattern 390A and the silicon oxide film 371 as a mask, arsenic (As) ion implantation is performed at 250 keV at $5 \times 10^{15}$ cm$^{-2}$. As a result, the N-type ion-implanted layer 333a, formed on the principal surface of the P-type silicon substrate 301 in the connecting portion region 353bb, is converted into an N-type ion-implanted layer 333b having high As concentration (FIG. 32(b), FIG. 34(b), FIG. 36(b), FIG. 37(b)).

After the photo-resist film pattern 390A and the silicon oxide film 371 are removed, sacrificial oxidation is conducted by using the silicon nitride film 332 as a mask. Therefore, the N-type ion-implanted layers 333a and 333b are activated. As a result, N+-type buried diffusion layers 304A, 304B, 304C, 304D, 304E, 304M, and 304N and a second silicon oxide film (not shown) are formed.

The depth of the junction of the silicon oxide film 372 on the surface of the N+-type buried diffusion layer 304A is approximately 800 nm, and that on portions which are not provided with the N+-type buried diffusion layer 304A, such as the base of the cavity 303, is approximately 200 nm.

After the above-described second silicon oxide film is removed, a third silicon oxide film having an HTO film having a thickness of approximately 300 nm is formed on the entire surface. CMP of this silicon oxide film 373 is performed until the silicon nitride film 332, covering the upper surface of the flat portion of the field oxide film 302, is exposed.

Then, a second photo-resist film pattern 390B is formed to cover the cell array region 352 and the connecting portion region 353ba, and have openings in at least the element region 341 and the element region 341B. Such a portion of the N+-type buried diffusion layer 304A for connection to the element region 341B in the connecting portion region 353bb and a region extended from this portion in the longitudinal direction of the N+-type buried diffusion layer 304A by approximately 0.3 μm, which is the width of the "beak portion" of the field oxide film 302, are not covered with the photo-resist film pattern 390B.

By using this photo-resist film pattern as a mask, the silicon oxide film 373 is etched away. Although this etching can be a two-stage etching having a taper etching by using as etching gas CHF$_3$ of 50 sccm diluted with Ar of approximately 150 sccm, and silicon oxide selective etching by using as etching gas CHF$_3$ of 20 sccm and CO of approximately 10 sccm diluted with Ar of approximately 300 sccm, the etching must be stopped when the silicon oxide film selective etching is completed.

After the photo-resist film pattern 390B is removed, a third silicon nitride film 374 having a thickness of approximately 50 nm is formed on the entire surface. This silicon nitride film 374 is patterned by anisotropic etching using the third photo-resist film pattern 390C as a mask and using SF$_6$ as etching gas.

The peripheral circuit region 351 and the connecting portion regions 353ba, 353bb are covered with this photo-resist film pattern 390C. A position where the side surface of the floating gate electrode and the dummy floating gate electrode provided closest to the connecting portion regions 353ba, 353bb at the connecting region 353ba, 353bb side, and the cell array region 352 formed between the connecting portion regions 353ba and 353bb, are covered with at least the photo-resist film pattern 390C.

The cell array region 352, in an inside region including at least a position where the side surface of the floating gate electrode and the dummy floating gate electrode provided closest to the connecting regions 353ba, 353bb at a side opposite to the connecting portion regions 353ba, 353bb, provides an opening of the photo-resist film pattern 390C. As a result, two layers of the silicon nitride films 374, 332 are left in the element region 341 and the element region 341 including a portion connecting with the N+-type buried diffused layer 304A and its vicinity (FIG. 32(d), FIG. 34(d), FIG. 36(d), FIG. 37(d)).

After the photo-resist film pattern 390C is removed, a fourth photo-resist film pattern 390D is formed. By using the photo-resist film pattern 390D as a mask, a three-stage anisotropic etching is conducted. It is noted that the etching target position of the first-stage etching in the three-stage etching is not shown. As a result, a field insulating film 306b is formed, and an element region 342 parallel to the direction perpendicular to the N+-type buried diffusion layer 304A is determined.

The difference between the field insulating film 306b from the field insulating film 306a in the fifth embodiment is that the field insulating film 306b extends from the principal surface of the P-type silicon substrate 301 in the cell array region 352 to the connecting portion region 353ba, 353bb, which are adjacent to the cell array region 352, to the "beak portion" of the field oxide film 302. Further, the top of the N+-type buried diffusion layer 304A provided in the connecting portion region 353bb extends close to the portion connected to the element region 341B (FIG. 32(e), FIG. 34(e), FIG. 36(e), FIG. 37(e)).

Next, thermal oxidation is conducted using the field insulating film 306b and the silicon nitride film 332 as a mask. As a result, a first gate oxide film 309 in the cell array region 352 is formed. Then, by using LPCVD, an N-type first polycrystalline silicon film 334 having a thickness of approximately 300 nm is formed on the entire surface or on the upper surface of the field insulating film 306b.

Thermal oxidation is continued until the film thickness of the first polycrystalline silicon film becomes approximately 100 nm on the upper surface of the field insulating film 306b. As a result, a silicon oxide film (not shown) is formed on the surface of the first polycrystalline silicon film. After this silicon oxide film is removed, patterning is applied to the first polycrystalline silicon film 334 and the gate oxide film 309 sequentially. As a result, a polycrystalline silicon film pattern 334A parallel to and overlapping with the N+-type buried diffusion layer 304A by approximately 0.18 μm and having a width of approximately 0.6 μm and a spacing of approximately 0.54 μm is formed. Simultaneously, the gate oxide film 309 is removed in a self-aligned manner to the polycrystalline silicon film pattern 334A.

Then, a second gate oxide film 310 is formed by thermal oxidation on the upper and side surfaces of the polycrystalline silicon film pattern 334A, in the cell array region 352 not covered with the polycrystalline silicon film pattern 334A, including the base of the cavity 303 and the surface of the N+-type buried diffusion layer 304A, and in the connecting region 353bb, respectively.

Next, an N⁺-type second polycrystalline silicon film 335 having a thickness of approximately 250 nm is formed on the entire surface by LPCVD. Further, a fourth silicon oxide film 376 having a thickness of approximately 200 nm, a fourth silicon nitride film (not shown) having a thickness of approximately 50 nm and a fifth silicon oxide film 377 are sequentially formed.

The upper surface of the silicon oxide film 377 is flattened by CMP. Then, by using a photo-resist film pattern 390E as a mask, the silicon oxide film 377 and the fourth silicon nitride film are sequentially patterned by anisotropic etching. As a result, a silicon nitride film cap 338b is formed. At this stage, the silicon oxide film 377 is left only on the upper surface of the silicon nitride film cap 338b (FIG. 33(a), FIG. 35(a), FIG. 36(f), FIG. 38(a)).

After the photo-resist film pattern 390E is removed, by using as etching gas CHF₃ of approximately 20 sccm and CO of approximately 10 sccm diluted with Ar of approximately 300 sccm, selective etching of the silicon oxide film 377 and the silicon oxide film 376 is conducted at a substrate temperature of approximately 90°, at a pressure of approximately 40 Pa and at an RF power of approximately 50 W. As a result, the silicon oxide film 377 covering the upper surface of the silicon nitride film cap 338b is etched, and a silicon oxide film cap 338 is formed. In this anisotropic etching, the silicon nitride film cap 338b functions as an etching mask at a later stage.

Then, by using the silicon nitride film cap 338b and the silicon oxide film cap 338 as a mask, and by using a gas mixture of BCl₃ and Cl₂ as etching gas, the polycrystalline silicon film 335 is anisotropically etched. As a result, the control gate electrodes 313Ab, 313Bb are formed. These control gate electrodes 313Ab, 313Bb cross the connecting portion region 353ba, and extend to the peripheral circuit region 351 unlike the structure of the fifth embodiment.

Specifically, the reason this is possible is that the connecting portion region 353ba is covered with the field oxide film 302 and the field insulating film 306b. As a result, no N⁺-type diffusion layer is formed in the connecting portion region 353ba. The formation of the control gate electrodes 313Ab, 313Bb is based on the same technical concept as that in the fourth embodiment. Furthermore, a sixth silicon oxide film (not shown) having a thickness of approximately 50 nm and having, for example, an HTO film, is formed on the entire surface. Then, the sixth silicon oxide film and the gate oxide film 310 are etched back by anisotropic etching. As a result, a silicon oxide film spacer 339 is formed.

Next, unlike in the above-described fifth embodiment, by using the silicon nitride film cap 338b, the silicon oxide film cap 338 and the silicon oxide film spacer 339 as a mask, the polycrystalline silicon film pattern 334A is patterned by anisotropic etching by using gas mixture of BCl₂ and Cl₂. As a result, a floating gate electrode 312 and a dummy floating gate electrode 312A are formed (FIGS. 26–31).

Next, a fifth photo-resist film pattern 392 covering over at least the floating gate electrodes 312, 312A formed in the cell array region 352 is formed. By using this photo-resist film pattern 392 as a mask, the silicon nitride film cap 338b and the silicon nitride film 374 are removed. Further, the silicon nitride film 332 is removed in a self-aligned manner to the field insulating film 306b (FIG. 33(b), FIG. 35(b), FIG. 36(g), FIG. 38(b)).

Almost simultaneously with the removal of the photo-resist film pattern 392, the pad oxide film 330 is removed. Thereafter, third gate oxide films 314, 314A are formed by thermal oxidation. The gate oxide film 314 is formed on the N⁺-type buried diffusion layers 304A in the element regions 341, 341B and the second connecting portion region 353bb. The film thickness of the gate oxide film 314 in the element region 341 and 341B is approximately 40 nm. The film thickness of the gate oxide film 314A is approximately 40 nm and the gate oxide film 314A is formed on the side surface of the floating gate 312, 313A on the upper surface of the field insulating film 306b (FIGS. 27 to 31, FIG. 33(c), FIG. 35(c), FIG. 36(h), FIG. 38(c)).

Next, an N⁺-type third polycrystalline silicon film having a thickness of approximately 300 nm is formed on the entire surface by LPCVD. The third polycrystalline silicon film sufficiently fills the void portion between the two control gate electrodes, such as the control gate electrode 313Ab and the control gate electrode 313Bb. Patterning is applied to this third polycrystalline silicon film. As a result, erase gate electrodes 315AB and gate electrodes 316(A), 316(B), 316AC, 316BD, 316ba, 313bb, 313bc, 313be are formed.

Next, As ion implantation is performed at 70 keV at 3×10¹⁵ cm⁻² and an N⁺-type diffusion layer 317 is formed. The depth of junction of the N⁺-type diffusion layer 317, except for the portion overlapping with the N⁺-type buried diffusion layer 304A, is approximately 0.15 μm.

Next, an interlayer insulating film 318 is formed. The height of the upper surface of the interlayer insulating film 318 from the principal surface of the P-type silicon substrate 301 is at least approximately 0.8 μm. On the interlayer insulating film 318, contact holes 319 reaching the control gate electrodes 313Ab, and contact holes 319(A), 319(B), 319AC, 319BD, and 319 reaching the N⁺-type diffusion layer 317 are formed.

These contact holes 319, 319(A), 319(B), 319AC, and 319BD are filled with the same contact plug 320 as that in the first to fourth embodiments. A wiring 321, bit lines 321AC, 321BD, and 321LN are formed on the upper surface of the interlayer insulating film 318 (FIGS. 26 to 31).

The manufacturing method according to the sixth embodiment has the same advantage as that according to the fifth embodiment. Further, since a field insulating film having a structure different from that in the fifth embodiment is formed, the control gate electrodes can be easily formed as compared with the fifth embodiment.

In the sixth embodiment, an N-channel MOS transistor is shown as a semiconductor element forming a peripheral circuit. However, it is not limited thereto, and the peripheral circuit may be formed by a CMOS transistor. Furthermore, in the above-mentioned sixth embodiment according to the present invention, the above-mentioned film thicknesses, widths, and intervals are not limited to the above-mentioned numerical values. Additionally, the structural material is not limited to the above-mentioned material.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A memory device, comprising:
   a semiconductor chip having a first surface and a second surface located at a level lower than that of said first surface;
   a memory cell array formed on said second surface;
   a peripheral circuit, for operating said memory cell array, formed on said first surface; and
   a connecting portion, for electrically connecting said memory cell array to said peripheral circuit, formed on said first surface,
   wherein said memory cell array includes a plurality of memory cells including control gate electrodes, and wherein said second surface is connected with the first surface by a non-vertical sloped portion, such that said control gate electrodes are connected to the first surface through the non-vertical sloped portion.

2. The device as recited in claim 1, wherein said memory cell array comprises a plurality of first transistors having a first height for forming a contact-less structure, and wherein said peripheral circuit and said connecting portion comprise a plurality of second transistors having a second height less than that of said first height.

3. The device as recited in claim 2, further comprising an insulator film formed on said semiconductor chip for covering said memory cell array, said peripheral circuit and said connecting portion, wherein a surface of said insulator film is substantially planar.

4. The device as recited in claim 1, wherein said memory cell array comprises a plurality of first transistors, and said peripheral circuit and said connecting portion comprise a plurality of second transistors, wherein tops of said first transistors and tops of said second transistors are substantially planar with one another.

5. The device as recited in claim 4, wherein said first transistors comprise laminated gate electrode-type transistors, and said second transistors comprise metal oxide semiconductor (MOS) transistors.

6. The device as recited in claim 5, wherein said laminated gate electrode-type transistors comprise nonvolatile transistors.

7. The device as recited in claim 6, wherein said nonvolatile transistors comprise transistors for electrically erasable and programmable read-only memory (EEPROM) cells.

8. The device as recited in claim 7, wherein said memory device is formed on a single semiconductor chip.

9. The device as recited in claim 5, wherein said laminated gate electrode type transistors comprise transistors for virtual ground array (VGA)-type memory cells.

10. The device as recited in claim 8, wherein said memory device is formed on a single semiconductor chip.

11. The device according to claim 1, further comprising an upper layer wiring connected to said memory cell array formed on the first surface.

12. The device according to claim 11, further comprising a plurality of contact holes for connecting the upper layer wiring with the memory cell array, wherein said contact holes are selectively formed on said first surface, such that said contact holes are formed to have substantially a same depth.

13. The device according to claim 1, further comprising a diffusion layer connecting said memory cell array with said connecting portion.

14. The device according to claim 13, wherein said diffusion layer is formed from surfaces of the first surface, the second surface, and the sloped portion.

15. A flash memory device, comprising:

a semiconductor chip having a first surface and a second surface located at a level lower than that of said first surface;

first and second contact-less memory cell arrays formed on said second surface;

a peripheral circuit, for operating said first and second contact-less memory cell arrays formed on said first surface;

a first connecting portion, for electrically connecting said first contact-less memory cell array to said peripheral circuit, formed on said first surface;

a second connecting portion, for electrically connecting said second contact-less memory cell array to said peripheral circuit, formed on said first surface; and a third connecting portion, for electrically connecting said first contact-less memory cell array to said second contact-less memory cell array, formed on said first surface, wherein at least one of said memory cell arrays includes a plurality of memory cells including control gate electrodes, and wherein said second surface is connected with the first surface by a non-vertical sloped portion, such that said control gate electrodes are connected to the first surface through the sloped portion.

16. The flash memory device as recited in claim 15, wherein said first and second contact-less memory cell arrays comprise a plurality of first transistors having a first height, and wherein said peripheral circuit and said first, second and third connecting portions comprise a plurality of second transistors having a second height less than that of said first height.

17. The flash memory device as recited in claim 15, wherein said first and second contact-less memory cell arrays comprise a plurality of first transistors, and said peripheral circuit and said first, second and third connecting portions comprise a plurality of second transistors, wherein tops of said first transistors and tops of said second transistors are substantially planar with one another.

18. The flash memory device as recited in claim 17, wherein said first transistors comprise laminated gate electrode-type transistors and said second transistors comprise metal oxide semiconductor (MOS) transistors.

19. The flash memory device as recited in claim 18, wherein said memory device is formed on a single semiconductor chip.

* * * * *